US012715171B2

(12) United States Patent
Sevier et al.

(10) Patent No.: US 12,715,171 B2
(45) Date of Patent: Aug. 25, 2026

(54) MANAGING MULTI-OBJECTIVE ALIGNMENTS FOR IMPRINTING

(71) Applicant: Magic Leap, Inc., Plantation, FL (US)

(72) Inventors: Jeremy Lee Sevier, Austin, TX (US); Satish Sadam, Round Rock, TX (US); Joseph Michael Imhof, Austin, TX (US); Kang Luo, Austin, TX (US); Kangkang Wang, Austin, TX (US); Roy Matthew Patterson, Hutto, TX (US); Qizhen Xue, Austin, TX (US); Brett William Best, Round Rock, TX (US); Charles Scott Carden, Austin, TX (US); Matthew S. Shafran, Fletcher, NC (US); Michael Nevin Miller, Austin, TX (US)

(73) Assignee: Magic Leap, Inc., Plantation, FL (US)

( * ) Notice: Subject to any disclaimer, the term of this patent is extended or adjusted under 35 U.S.C. 154(b) by 0 days.

(21) Appl. No.: 18/975,299

(22) Filed: Dec. 10, 2024

(65) Prior Publication Data

US 2025/0102928 A1 Mar. 27, 2025

Related U.S. Application Data

(62) Division of application No. 18/014,327, filed as application No. PCT/US2021/045118 on Aug. 6, 2021, now Pat. No. 12,204,258.

(Continued)

(51) Int. Cl.

| | |
|---|---|
| ***B29C 59/04*** | (2006.01) |
| ***G03F 7/00*** | (2006.01) |
| ***G03F 9/00*** | (2006.01) |

(52) U.S. Cl.

CPC ............ *B29C 59/04* (2013.01); *G03F 7/0002* (2013.01); *G03F 9/7042* (2013.01); *G03F 9/7046* (2013.01)

(58) Field of Classification Search

CPC ..... B29C 59/04; G03F 7/0002; G03F 9/7042; G03F 9/7046

See application file for complete search history.

(56) References Cited

U.S. PATENT DOCUMENTS

| | | | |
|---|---|---|---|
| 9,671,566 | B2 | 6/2017 | Abovitz et al. |
| 9,791,700 | B2 | 10/2017 | Schowengerdt |

(Continued)

FOREIGN PATENT DOCUMENTS

| | | | |
|---|---|---|---|
| CN | 104303104 | A | 1/2015 |
| JP | 2007-264184 | A | 10/2007 |

(Continued)

OTHER PUBLICATIONS

Extended European Search Report in European Appln. No. 21852139.1, mailed on Feb. 13, 2024, 6 pages.

(Continued)

*Primary Examiner* — Jerzi H Moreno Hernandez
(74) *Attorney, Agent, or Firm* — Fish & Richardson P.C.

(57) ABSTRACT

Systems and methods for managing multi-objective alignments in imprinting (e.g., single-sided or double-sided) are provided. An example system includes rollers for moving a template roll, a stage for holding a substrate, a dispenser for dispensing resist on the substrate, a light source for curing the resist to form an imprint on the substrate when a template of the template roll is pressed into the resist on the substrate, a first inspection system for registering a fiducial mark of the template to determine a template offset, a second inspection system for registering the imprint on the substrate to determine a wafer registration offset between a target location and (Continued)

an actual location of the imprint, and a controller for controlling to move the substrate with the resist below the template based on the template offset, and determine an overlay bias of the imprint on the substrate based on the wafer registration offset.

20 Claims, 21 Drawing Sheets

Related U.S. Application Data

(60) Provisional application No. 63/062,527, filed on Aug. 7, 2020.

(56) References Cited

U.S. PATENT DOCUMENTS 10,175,478 B2 1/2019 Tekolste et al.
10,262,462 B2 4/2019 Miller et al.
10,459,231 B2 10/2019 Miller et al.
2007/0170617 A1 7/2007 Choi et al.
2013/0214452 A1 8/2013 Choi et al.
2014/0061969 A1 3/2014 Okamoto et al.
2018/0113390 A1 4/2018 Patterson et al.
2018/0339437 A1 11/2018 Patterson et al.
2019/0033709 A1 1/2019 Cherala et al.
2019/0329575 A1 10/2019 Ter Meulen et al.

FOREIGN PATENT DOCUMENTS

JP 2011-148180 A 8/2011
JP 2017-030160 A 2/2017
KR 2014-0141137 A 12/2014

OTHER PUBLICATIONS

International Search Report and Written Opinion in International Appln. No. PCT/US2021/045118, mailed on Nov. 17, 2021, 9 pages.
Liu et al., "Roller-reversal imprint process for preparation of large-area microstructures," J. Vac. Sci. Technol. B, Jan. 2010, 28(1):104-109.
Notice of Allowance in Chinese Appln. No. 202180056658.2, mailed on Jul. 11, 2024, 4 pages (with English translation).
Office Action in Chinese Appln. No. 202180056658.2, mailed on Jan. 23, 2024, 6 pages (with English translation).
Office Action in Japanese Appln. No. 2023-507625, mailed on Sep. 9, 2024, 7 pages (with English translation).

(VI)

(V)

MANAGING MULTI-OBJECTIVE ALIGNMENTS FOR IMPRINTING

CROSS-REFERENCE TO RELATED APPLICATIONS

This application is a divisional of U.S. patent application Ser. No. 18/014,327 entitled "MANAGING MULTI-OBJECTIVE ALIGNMENTS FOR IMPRINTING" and filed on Jan. 3, 2023, which is a National Stage Application of International Application No. PCT/US2021/045118, filed Aug. 6, 2021, which claims the benefit of U.S. Patent Application No. 63/062,527 entitled "MANAGING MULTI-OBJECTIVE ALIGNMENTS FOR IMPRINTING" and filed on Aug. 7, 2020. The entire contents of these applications are herein incorporated by reference in their entirety.

TECHNICAL FIELD

This disclosure relates generally to imprinting technology, particularly to imprinting with multi-objective alignments.

BACKGROUND

When developing a process, a tool, or both for creating single-sided imprints or double-sided imprints on a substrate from templates (or patterns) on webs, there are a lot of challenges to overcome. The challenges can include: aligning the substrate with the templates, aligning imprints with resist on the substrate, and aligning imprints on opposite sides of the substrate.

SUMMARY

The present disclosure describes methods, devices, and systems for managing multi-objective alignments for imprinting (e.g., single-sided imprinting or double-sided imprinting), which can address the challenges mentioned above.

One aspect of the present disclosure features an imprinting method including: drawing a template roll along rollers, the template roll including a template field having a template and a template fiducial mark of the template; measuring the template fiducial mark of the template to determine a template offset; moving a substrate with resist on a stage to be below the template of the template roll based on an imprinting alignment offset, the imprinting alignment offset being at least partially determined based on the template offset, the resist being on a first side of the substrate; pressing the template of the template roll into the resist on the substrate; curing the resist to form an imprint on the substrate, the imprint having an imprinted feature corresponding to the template and an imprint fiducial mark corresponding to the template fiducial mark of the template; measuring the imprint fiducial mark of the imprint to determine a wafer registration offset between a target fiducial location and an actual fiducial location associated with the imprint fiducial mark; and determining an overlay bias of the imprint on the first side of the substrate at least partially based on the wafer registration offset.

The imprinting alignment offset can at least partially determined based on a loading offset. The loading offset can be determined at least partially based on a previous imprinting process on another substrate. The imprinting alignment offset can be at least partially determined based on an imprint nominal correction. In some examples, the imprinting alignment offset is a sum of the template offset, the loading offset, and the imprint nominal correction.

In some examples, determining an overlay bias of the imprint on the substrate includes: determining the overlay bias at least partially based on the loading offset. The overlay bias can be determined to be the wafer registration offset minus the loading offset.

In some implementations, the imprinting method further includes: moving the substrate on the stage to be below a resist dispenser according to a dispensing alignment offset that is at least partially determined based on the loading offset. The dispensing alignment offset can be at least partially determined based on a dispense offset that provides a correction for imprint to resist centering from a nominal dispense location. The dispensing alignment offset can be at least partially determined based on a dispense nominal correction. In some examples, the dispensing alignment offset is a sum of the loading offset, the dispense offset, and the dispense nominal correction. The dispense offset can be obtained by machine learning using an inspection system.

In some implementations, the imprinting method further includes: measuring the image of the substrate with the imprint to determine at least one of an imprint to substrate image offset or an imprint to resist image offset. The imprinting method can further include: updating the dispensing alignment offset based on the at least one of the imprint to substrate image offset or the imprint to resist image offset. The imprinting method can further include: iteratively imprinting a second substrate with the template of the template roll using the updated dispensing alignment offset.

In some examples, the imprinting method includes: updating the loading offset based on the imprint to substrate image offset, and the dispensing alignment offset is updated based on the updated loading offset. The updated loading offset can be identical to a sum of a result of multiplying the imprint to substrate image offset by a constant and the loading offset. The constant can be determined by at least one of an application, machine learning, or empirical data.

In some examples, the imprinting method further includes: updating the dispense offset based on the imprint to resist image offset, and the dispensing alignment offset is updated based on the updated dispense offset. The updated dispense offset can be identical to a sum of a result of multiplying the imprint to resist image offset by a second constant and the dispense offset. The second constant can be determined by at least one of an application, machine learning, or empirical data.

In some examples, measuring the image of the substrate with the imprint to determine at least one of an imprint to substrate image offset or an imprint to resist image offset includes: measuring the image of the substrate with the imprint by using an inspection system.

In some implementations, the imprinting method further includes: dispensing resist droplets on the first side of the substrate according to a specified pattern.

The substrate can be held on the stage via a chuck. The chuck can include a measurement area that has a better image contrast than other areas of the chuck, and the substrate can be held on the chuck with the imprint fiducial mark of the imprint on the substrate within the measurement area. The measurement area of the chuck can be inserted with silicon material.

In some implementations, measuring the template fiducial mark of the template to determine a template offset includes: measuring the template fiducial mark of the template using an upward looking inspection system. The upward looking inspection system can be positioned on the stage. The template field can include a plurality of fiducial marks for one or more templates. The upward looking inspection system can include a plurality of cameras, each of the plurality of cameras being configured to capture an image including a different corresponding fiducial mark of the plurality of fiducial marks for the one or more templates.

In some implementations, measuring the imprint fiducial mark of the imprint to determine a wafer registration offset includes: measuring the imprint fiducial mark of the imprint using a downward looking inspection system. The downward looking inspection system can be registered in a coordinate system based on the stage, and measuring the imprint fiducial mark of the imprint can include registering the imprint fiducial mark of the imprint in the coordinate system. The stage can be configured to hold one or more substrates with one or more imprints. The downward looking inspection system can include a plurality of cameras, each of the plurality of cameras being configured to capture an image including a different corresponding fiducial mark of the one or more imprints on the one or more substrates.

In some implementations, measuring the template fiducial mark of the template to determine a template offset can include: registering the template fiducial mark of the template in a coordinate system. Measuring the imprint fiducial mark of the imprint to determine a wafer registration offset can include: registering the imprint fiducial mark in the coordinate system. The coordinate system can be based on the stage. The coordinate system can be an XYT coordinate system that has an X direction, a Y direction, and a theta direction. One or more chucks can be arranged on the stage, each chuck providing a different independent XYT coordinate system.

In some implementations, moving a substrate with resist on a stage to be below the template of the template roll based on an imprinting alignment offset includes: controlling a moving speed of the stage holding the substrate relative to a drawing speed of the template roll such that the template of the template roll is aligned with the substrate based on the imprinting alignment offset.

In some implementations, the imprinting method further includes: before imprinting the template field on the resist on the substrate, performing at least one simulated imprinting sequence with the template field on the template roll being moved without contact with the resist on the substrate. The at least one simulated imprinting sequence can be performed to reduce the overlay bias.

In some implementations, the imprinting method further includes: flipping the substrate with the imprint and loading the flipped substrate on the stage with the first side facing towards the stage and a second side facing away from the stage, the second side being opposite to the first side; measuring a flipped imprint fiducial mark of the flipped imprint to determine a second wafer registration offset between a second target fiducial location and a second actual fiducial location associated with the flipped imprint fiducial mark; measuring a second template fiducial mark of a second template in the template field of the template roll to determine a second template offset; moving the flipped substrate with second resist on the second side to be below the second template in the template field of the template roll based on a second imprinting alignment offset, the second imprinting alignment offset being determined based on the second template offset, the second wafer registration offset, and the overlay bias; pressing the second template of the template roll into the second resist on the flipped substrate; curing the second resist to form a second imprint on the second side, the second imprint having a second imprinted feature corresponding to the second template and a second imprint fiducial mark corresponding to the second template fiducial mark of the second template; measuring the flipped imprint fiducial mark of the flipped imprint on the first side and the second imprint fiducial mark of the second imprint on the second side to determine a double-sided overlay error between a target fiducial offset and an actual fiducial offset associated with the flipped imprint fiducial mark and the second imprint fiducial mark; and determining a double-sided overlay bias between the flipped imprint on the first side and the second imprint on the second side based on the double-sided overlay error.

The imprinting method can further include: updating the overlay bias to be the double-sided overlay bias; and iteratively imprinting a second substrate using the second template of the template roll based on the updated overlay bias. The double-sided overlay bias can be identical to a sum of a result of multiplying the double-sided overlay error by a constant and a previous double-sided overlay bias. The constant can be determined by at least one of an application, machine learning, or empirical data.

The second imprinting alignment offset can be at least partially determined based on a second imprint nominal correction. The second imprinting alignment offset can be a sum of the second template offset, the second wafer registration offset, the overlay bias, and the second imprint nominal correction.

In some implementations, the imprinting method further includes: moving the flipped substrate on the stage to be below a resist dispenser according to a second dispensing alignment offset that is determined at least partially based on the overlay bias and the second wafer registration offset. The second dispensing alignment offset can be at least partially determined based on a second dispense offset that can provide a correction for imprint to resist centering from a second nominal dispense location. The second dispensing alignment offset can be at least partially determined based on a second dispense nominal correction. In some examples, the second dispensing alignment offset is a sum of the overlay bias, the second wafer registration offset, the second dispense offset, and the second dispense nominal correction.

In some implementations, the imprinting method further includes: measuring an image of the flipped substrate with the flipped imprint and the second imprint to determine a second imprint to resist image offset. The imprinting method can further include: updating the second dispensing alignment offset based on the second imprint to resist image offset. The imprinting method can further include: updating the second dispense offset based on the second imprint to resist image offset, where the second dispensing alignment offset is updated based on the updated second dispense offset. In some examples, the updated second dispense offset is identical to a sum of a result of multiplying the second imprint to resist image offset by a constant and the second dispense offset. The constant can be determined by at least one of an application, machine learning, or empirical data. The imprinting method can further include: iteratively imprinting a second substrate using the second template of the template roll based on the updated second dispensing alignment offset.

In some implementations, the flipped substrate is held on the stage via a chuck, the chuck including a measurement area that has a better image contrast than other areas of the chuck, and the flipped substrate is held on the chuck with the flipped imprint fiducial mark of the flipped imprint and the second imprint fiducial mark of the second imprint within the measurement area.

In some implementations, the stage holds a first substrate via a first chuck and a second substrate via a second chuck, the substrate being the first substrate. The template field of the template roll can include a first template and the second template, the template being the first template, the imprint being a first imprint. The imprinting method can include: aligning the first substrate with the first template and the second substrate with the second template based on the imprinting alignment offset; and forming the first imprint on the first side of the first substrate and the second imprint on a first side of the second substrate. In some examples, the imprinting method includes: flipping the first substrate and loading the flipped first substrate on the second chuck; flipping the second substrate and loading the flipped second substrate on the first chuck; aligning the flipped second substrate with the first template and the flipped first substrate with the second template based on the second imprinting alignment offset; and forming the first imprint on a second side of the second substrate and the second imprint on the second side of the first substrate. In some examples, the substrate is transparent.

Another aspect of the present disclosure features an imprinting method including: drawing a template roll along rollers, the template roll including a template field having a template and a template fiducial mark of the template; measuring the template fiducial mark of the template to determine a template offset; moving the substrate on a stage to be below a resist dispenser according to a dispensing alignment offset that is at least partially determined based on a loading offset; dispensing resist on a first side of the substrate using the resist dispenser; moving the substrate with the resist on the stage to be below the template of the template roll based on an imprinting alignment offset, the imprinting alignment offset being at least partially determined based on the template offset and the loading offset; pressing the template of the template roll into the resist on the substrate; and curing the resist to form an imprint on the substrate, the imprint having an imprinted feature corresponding to the template and an imprint fiducial mark corresponding to the template fiducial mark of the template. \

The imprinting alignment offset can be at least partially determined based on an imprint nominal correction. The imprinting alignment offset can be a sum of the template offset, the loading offset, and the imprint nominal correction.

The dispensing alignment offset can be at least partially determined based on a dispense offset that provides a correction for imprint to resist centering from a nominal dispense location. The dispensing alignment offset can be at least partially determined based on a dispense nominal correction. In some examples, the dispensing alignment offset is a sum of the loading offset, the dispense offset, and the dispense nominal correction.

In some implementations, the imprinting method can further include: measuring an image of the substrate with the imprint to determine at least one of an imprint to substrate image offset or an imprint to resist image offset. The imprinting method can further include: updating the dispensing alignment offset based on the at least one of the imprint to substrate image offset or the imprint to resist image offset; and iteratively imprinting a second substrate with the template of the template roll using the updated dispensing alignment offset. The imprinting method can further include at least one of: updating the loading offset based on the imprint to substrate image offset, where the dispensing alignment offset is updated based on the updated loading offset, or updating the dispense offset based on the imprint to resist image offset, where the dispensing alignment offset is updated based on the updated dispense offset.

In some examples, the updated loading offset is identical to a sum of a result of multiplying the imprint to substrate image offset by a first constant and the load offset. The updated dispense offset can be identical to a sum of a result of multiplying the imprint to resist image offset by a second constant and the dispense offset. Each of the first constant and the second constant can be determined by at least one of an application, machine learning, or empirical data.

In some implementations, the imprinting method further includes: measuring the imprint fiducial mark of the imprint to determine a wafer registration offset between a target fiducial location and an actual fiducial location associated with the imprint fiducial mark; and determining an overlay bias of the imprint on the first side of the substrate at least partially based on the wafer registration offset. Determining an overlay bias of the imprint on the substrate can include: determining the overlay bias to be the wafer registration offset minus the loading offset. The imprinting method can further include: before imprinting the template field on the resist on the substrate, performing at least one simulated imprinting sequence with the template field on the template roll being moved without contact with the resist on the substrate.

In some implementations, the imprinting method further includes: flipping the substrate with the imprint and loading the flipped substrate on the stage with the first side facing towards the stage and a second side facing away from the stage, the second side being opposite to the first side; measuring a flipped imprint fiducial mark of the flipped imprint to determine a second wafer registration offset between a second target fiducial location and a second actual fiducial location associated with the flipped imprint fiducial mark; measuring a second template fiducial mark of a second template in the template field of the template roll to determine a second template offset; moving the flipped substrate with second resist on the second side to be below the second template in the template field of the template roll based on a second imprinting alignment offset, the second imprinting alignment offset being determined based on the second template offset, the second wafer registration offset, and the overlay bias; pressing the second template of the template roll into the second resist on the flipped substrate; and curing the second resist to form a second imprint on the second side, the second imprint having a second imprinted feature corresponding to the second template and a second imprint fiducial mark corresponding to the second template fiducial mark of the second template.

The imprinting method can further include: measuring the flipped imprint fiducial mark of the flipped imprint on the first side and the second imprint fiducial mark of the second imprint on the second side to determine a double-sided overlay error between a target fiducial offset and an actual fiducial offset associated with the flipped imprint fiducial mark and the second imprint fiducial mark; and determining a double-sided overlay bias between the flipped imprint on the first side and the second imprint on the second side based on the double-sided overlay error. In some examples, the imprinting method can further include: updating the overlay bias to be the double-sided overlay bias; and iteratively imprinting a second substrate using the second template of the template roll based on the updated overlay bias. The double-sided overlay bias can be identical to a sum of a result of multiplying the double-sided overlay error by a constant and a previous double-sided overlay bias. The constant can be determined by at least one of an application, machine learning, or empirical data.

The second imprinting alignment offset can be at least partially determined based on a second imprint nominal correction. The second imprinting alignment offset can be a sum of the second template offset, the second wafer registration offset, the overlay bias, and the second imprint nominal correction.

In some implementations, the imprinting method further includes: moving the flipped substrate on the stage to be below a resist dispenser according to a second dispensing alignment offset that is determined at least partially based on the overlay bias and the second wafer registration offset. The second dispensing alignment offset can be at least partially determined based on a second dispense offset that provides a correction for imprint to resist centering from a second nominal dispense location. The second dispensing alignment offset can be at least partially determined based on a second dispense nominal correction. In some examples, the second dispensing alignment offset is a sum of the overlay bias, the second wafer registration offset, the second dispense offset, and the second dispense nominal correction.

The imprinting method can further include: measuring an image of the flipped substrate with the flipped imprint and the second imprint to determine a second imprint to resist image offset. The imprinting method can further include: updating the second dispense offset based on the second imprint to resist image offset; updating the second dispensing alignment offset based on the updated second dispense offset; and iteratively imprinting a second substrate using the second template of the template roll based on the updated second dispensing alignment offset. In some examples, the updated second dispense offset is identical to a sum of a result of multiplying the second imprint to resist image offset by a constant and the second dispense offset. The constant can be determined by at least one of an application, machine learning, or empirical data. The substrate can be transparent.

A third aspect of the present disclosure features an imprinting method including: drawing a template roll along rollers, the template roll including a template field having a template and a template fiducial mark of the template; moving the substrate on a stage to be below a resist dispenser according to a dispensing alignment offset that is at least partially determined based on a loading offset; dispensing resist on a first side of the substrate using the resist dispenser; moving the substrate with the resist on the stage to be below the template of the template roll based on an imprinting alignment offset, the imprinting alignment offset being at least partially determined based on the loading offset; pressing the template of the template roll into the resist on the substrate; curing the resist to form an imprint on the substrate, the imprint having an imprinted feature corresponding to the template and an imprint fiducial mark corresponding to the template fiducial mark of the template; measuring the imprint fiducial mark of the imprint to determine a wafer registration offset between a target fiducial location and an actual fiducial location associated with the imprint fiducial mark; and determining an overlay bias of the imprint on the first side of the substrate based on the wafer registration offset and the loading offset.

The imprinting method can further include: measuring the template fiducial mark of the template to determine a template offset, where the imprinting alignment offset is at least partially determined based on the template offset. The imprinting alignment offset can be at least partially determined based on an imprint nominal correction. In some examples, the imprinting alignment offset is a sum of the template offset, the loading offset, and the imprint nominal correction.

The overlay bias can be determined to be the wafer registration offset minus the loading offset. The dispensing alignment offset can be at least partially determined based on a dispense offset that provides a correction for imprint to resist centering from a nominal dispense location. The dispensing alignment offset can be at least partially determined based on a dispense nominal correction. In some examples, the dispensing alignment offset is a sum of the loading bias, the dispense offset, and the dispense nominal correction.

The imprinting method can further include: measuring an image of the substrate with the imprint to determine at least one of an imprint to substrate image offset or an imprint to resist image offset. The imprinting method can further include: updating the dispensing alignment offset based on the at least one of the imprint to substrate image offset or the imprint to resist image offset; and iteratively imprinting a second substrate with the template of the template roll using the updated dispensing alignment offset. In some examples, the imprinting method further include at least one of: updating the loading offset based on the imprint to substrate image offset, where the dispensing alignment offset is updated based on the updated loading offset, or updating the dispense offset based on the imprint to resist image offset, where the dispensing alignment offset is updated based on the updated dispense offset. The updated loading offset can be identical to a sum of a result of multiplying the imprint to substrate image offset by a first constant and the loading offset. The updated dispense offset can be identical to a sum of a result of multiplying the imprint to resist image offset by a second constant and the dispense offset. Each of the first constant and the second constant can be determined by at least one of an application, machine learning, or empirical data.

In some implementations, the imprinting method further includes: before imprinting the template field on the resist on the substrate, performing at least one simulated imprinting sequence with the template field on the template roll being moved without contact with the resist on the substrate.

In some implementations, the imprinting method further includes: flipping the substrate with the imprint and loading the flipped substrate on the stage with the first side facing towards the stage and a second side facing away from the stage, the second side being opposite to the first side; measuring a flipped imprint fiducial mark of the flipped imprint to determine a second wafer registration offset between a second target fiducial location and a second actual fiducial location associated with the flipped imprint fiducial mark; moving the flipped substrate with second resist on the second side to be below a second template in the template field of the template roll based on a second imprinting alignment offset, the second imprinting alignment offset being determined based on the second wafer registration offset and the overlay bias; pressing the second template of the template roll into the second resist on the flipped substrate; curing the second resist to form a second imprint on the second side, the second imprint having a second imprinted feature corresponding to the second template and a second imprint fiducial mark corresponding to a second template fiducial mark of the second template; measuring the flipped imprint fiducial mark of the flipped imprint on the first side and the second imprint fiducial mark of the second imprint on the second side to determine a double-sided overlay error between a target fiducial offset and an actual fiducial offset associated with the flipped imprint fiducial mark and the second imprint fiducial mark; and determining a double-sided overlay bias between the flipped imprint on the first side and the second imprint on the second side based on the double-sided overlay error.

The imprinting method can further include: measuring the second template fiducial mark of the second template in the template field of the template roll to determine a second template offset, where the second imprinting alignment offset is determined at least partially based on the second template offset. The second imprinting alignment offset can be at least partially determined based on a second imprint nominal correction. In some examples, the second imprinting alignment offset is a sum of the second template offset, the second wafer registration offset, the overlay bias, and the second imprint nominal correction.

In some implementations, the imprinting method further includes: moving the flipped substrate on the stage to be below the resist dispenser according to a second dispensing alignment offset that is determined at least partially based on the overlay bias and the second wafer registration offset. The second dispensing alignment offset can be at least partially determined based on a second dispense offset that provides a correction for imprint to resist centering from a second nominal dispense location. The second dispensing alignment offset can be at least partially determined based on a second dispense nominal correction. In some examples, the second dispensing alignment offset is a sum of the overlay bias, the second wafer registration offset, the second dispense offset, and the second dispense nominal correction.

The imprinting method can further include: measuring an image of the flipped substrate with the flipped imprint and the second imprint to determine a second imprint to resist image offset. The imprinting method can further include: updating the second dispense offset based on the second imprint to resist image offset; updating the second dispensing alignment offset based on the updated second dispense offset; and iteratively imprinting a second substrate using the second template of the template roll based on the updated second dispensing alignment offset. The updated second dispense offset can be identical to a sum of a result of multiplying the second imprint to resist image offset by a constant, and the second dispense offset. The constant can be determined by at least one of an application, machine learning, or empirical data.

In some implementations, the imprinting method further includes: updating the overlay bias to be the double-sided overlay bias using the double-sided overlay error; and iteratively imprinting a second substrate using the second template of the template roll based on the updated overlay bias. In some examples, the double-sided overlay bias is identical to a sum of a result of multiplying the double-sided overlay error by a constant and a previous double-sided overlay bias. The constant can be determined by at least one of an application, machine learning, or empirical data. The substrate can be transparent.

A fourth aspect of the present disclosure features a double-sided imprinting method including: drawing a template roll along rollers, the template roll including a template field having a first template with at least one first template fiducial mark and a second template with at least one second template fiducial mark; loading a substrate on a stage, the substrate having a first side and a second side opposite to the first side; registering the first template fiducial mark of the first template in a coordinate system based on the stage to determine a first template offset in the coordinate system; moving the substrate with first resist on the first side to be below the first template of the template roll based on a first imprinting alignment offset, the first imprinting alignment offset being determined based on the first template offset and a loading offset; pressing the first template of the template roll into the first resist on the first side of the substrate; curing the first resist to form a first imprint on the first side of the substrate, the first imprint having a first imprinted feature corresponding to the first template and a first imprint fiducial mark corresponding to the first template fiducial mark of the first template; registering the first imprint on the substrate in the coordinate system to determine a first wafer registration offset between a target fiducial location and an actual fiducial location associated with the first imprint fiducial mark; determining an overlay bias of the first imprint on the first side of the substrate based on the first wafer registration offset and the loading offset; flipping the substrate with the first imprint and loading the flipped substrate on the stage with the first side facing towards the stage and the second side facing away from the stage; registering the flipped substrate with the flipped first imprint in the coordinate system to determine a second wafer registration offset between a second target fiducial location and a second actual fiducial location associated with a flipped first imprint fiducial mark; registering the second template fiducial mark of the second template in the template field of the template roll in the coordinate system to determine a second template offset; moving the flipped substrate with second resist on the second side to be below the second template in the template field of the template roll based on a second imprinting alignment offset, the second imprinting alignment offset being determined based on the second template offset, the second wafer registration offset, and the overlay bias; pressing the second template of the template roll into the second resist on the second side; curing the second resist to form a second imprint on the second side, the second imprint having a second imprinted feature corresponding to the second template and a second imprint fiducial mark corresponding to the second template fiducial mark of the second template; registering the flipped substrate with the flipped first imprint on the first side and the second imprint on the second side to determine a double-sided overlay error between a target fiducial offset and an actual fiducial offset associated with the flipped first imprint fiducial mark and the second imprint fiducial mark; and determining a double-sided overlay bias between the flipped first imprint on the first side and the second imprint on the second side based on the double-sided overlay error.

The double-sided imprinting method can further include: updating the overlay bias to be the double-sided overlay bias; and iteratively imprinting a second substrate using the second template of the template roll based on the updated overlay bias. The overlay bias can be determined to be the first wafer registration offset minus the loading offset, and the double-sided overlay bias can be updated by adding the result of multiplying the double-sided wafer registration offset by a constant.

The first imprinting alignment offset can be at least partially determined based on a first imprint nominal correction. In some examples, the first imprinting alignment offset is a sum of the first template offset, the loading offset, and the first imprint nominal correction. The second imprinting alignment offset can be at least partially determined based on a second imprint nominal correction. In some examples, the second imprinting alignment offset is a sum of the second template offset, the second wafer registration offset, the overlay bias, and the second imprint nominal correction.

In some implementations, the double-sided imprinting method further includes: moving the substrate on the stage to be below a resist dispenser according to a first dispensing alignment offset that is at least partially determined based on the loading offset; and dispensing the first resist on the first side of the substrate using the resist dispenser. The first dispensing alignment offset can be at least partially determined based on a first dispense offset that provides a correction for imprint to resist centering from a first nominal dispense location. The first dispensing alignment offset can be at least partially determined based on a first dispense nominal correction. The first dispensing alignment offset can be a sum of the loading offset, the first dispense offset, and the first dispense nominal correction.

The double-sided imprinting method can further include: measuring an image of the substrate with the imprint to determine at least one of an imprint to substrate image offset or an imprint to resist image offset. The double-sided imprinting method can further include: updating the first dispensing alignment offset based on the at least one of the imprint to substrate image offset or the imprint to resist image offset; and iteratively imprinting a second substrate with the first template of the template roll using the updated first dispensing alignment offset. The double-sided imprinting method can further include: updating the loading offset based on the imprint to substrate image offset, where the first dispensing alignment offset is updated based on the updated loading offset, and where the updated loading offset is identical to a sum of a result of multiplying the imprint to substrate image offset by a first constant and the loading offset; and updating the first dispense offset based on the imprint to resist image offset, where the first dispensing alignment offset is updated based on the updated first dispense offset, and where the updated first dispense offset is identical to a sum of a result of multiplying the imprint to resist image offset by a second constant and the dispense offset.

In some implementations, the double-sided imprinting method can further include: moving the flipped substrate on the stage to be below a resist dispenser according to a second dispensing alignment offset that is determined at least partially based on the overlay bias and the second wafer registration offset; and dispensing the second resist on the second side of the substrate using the resist dispenser. The second dispensing alignment offset can be at least partially determined based on a second dispense offset that provides a correction for imprint to resist centering from a second nominal dispense location. The second dispensing alignment offset can be at least partially determined based on a second dispense nominal correction. In some examples, the second dispensing alignment offset is a sum of the overlay bias, the second wafer registration offset, the second dispense offset, and the second dispense nominal correction.

The double-sided imprinting method can further include: measuring an image of the flipped substrate with the flipped first imprint and the second imprint to determine a second imprint to resist image offset. The double-sided imprinting method can further include: updating the second dispense offset based on the second imprint to resist image offset, where the updated second dispense offset is identical to a sum of a result of multiplying the second imprint to resist image offset by a constant and the second dispense offset; updating the second dispensing alignment offset based on the updated second dispense offset; and iteratively imprinting a second substrate using the second template of the template roll based on the updated second dispensing alignment offset.

The substrate can be held on the stage via a chuck with the first imprint fiducial mark of the first imprint on the substrate within a measurement area of the chuck that has a better image contrast than other areas of the chuck. The flipped substrate can be held on the stage via the chuck with the flipped first imprint fiducial mark and the second imprint fiducial mark within the measurement area.

The stage can hold a first substrate via a first chuck and a second substrate via a second chuck. The double-sided imprinting method can include: aligning the first substrate with the first template and the second substrate with the second template based on the first imprinting alignment offset; and forming the first imprint on the first side of the first substrate and the second imprint on a first side of the second substrate. The double-sided imprinting method can further include: flipping the first substrate and loading the flipped first substrate on the second chuck; flipping the second substrate and loading the flipped second substrate on the first chuck; aligning the flipped second substrate with the first template and the flipped first substrate with the second template based on the second imprinting alignment offset; and forming the first imprint on a second side of the second substrate and the second imprint on the second side of the first substrate. The substrate can be transparent.

A fifth aspect of the present disclosure features an imprinting system including: rollers for moving a template roll, where the template roll includes a template field having a template with a template fiducial mark; a movable stage for holding a substrate; a moving system for moving the stage together with the substrate; a resist dispenser for dispensing resist on a side of the substrate; a light source for curing the resist, where the light source is configured to cure the resist to form an imprint on the side of the substrate when the template of the template roll is pressed into the resist on the side of the substrate, the imprint having an imprinted feature corresponding to the template and an imprint fiducial mark corresponding to the template fiducial mark of the template; a first inspection system for registering the template fiducial mark of the template in a coordinate system to determine a template offset; a second inspection system for registering the imprint on the substrate in the coordinate system to determine a wafer registration offset between a target fiducial location and an actual fiducial location associated with the imprint fiducial mark; and a controller configured to: control the moving system to move the substrate with the resist to be below the template of the template roll based on an imprinting alignment offset, the imprinting alignment offset being at least partially determined based on the template offset, and determine an overlay bias of the imprint on the side of the substrate to be at least partially based on the wafer registration offset.

The imprinting system can further include: a loading system for loading the substrate on the stage. The imprinting system can further include: a third inspection system for measuring an image of the substrate with the imprint to update a loading offset by machine learning. The imprinting alignment offset for the substrate can be at least partially determined according to the loading offset updated based on one or more substrates processed prior to the substrate. The imprinting alignment offset can be at least partially determined based on an imprint nominal correction. In some examples, the imprinting alignment offset is a sum of the template offset, the loading offset, and the imprint nominal correction.

In some examples, the controller is configured to determine the overlay bias to be the wafer registration offset minus the loading offset. In some examples, the controller is configured to control the moving system to move the substrate on the stage to be below the resist dispenser according to a dispensing alignment offset that is at least partially determined based on the loading offset. In some examples, the controller is configured to determine the dispensing alignment offset to be at least partially determined based on a dispense offset that provides a correction for imprint to resist centering from a nominal dispense location. In some examples, the controller is configured to determine the dispensing alignment offset to be a sum of the loading offset, the dispense offset, and the dispense nominal correction.

In some implementations, the third inspection system is configured to measure an image of the substrate with the imprint to determine at least one of an imprint to substrate image offset or an imprint to resist image offset. The controller can be configured to update the dispensing alignment offset based on the at least one of the imprint to substrate image offset or the imprint to resist image offset, the updated dispensing alignment offset being for iteratively imprinting a second substrate with the template of the template roll. The controller can be configured to: update the loading offset to be identical to a sum of a result of multiplying the imprint to substrate image offset by a first constant and the loading offset, updated the dispense offset to be identical to a sum of a result of multiplying the imprint to resist image offset by a second constant and the dispense offset, and update the dispensing alignment offset based on the updated loading offset and the updated dispense offset.

The substrate can be held on the stage via a chuck. The chuck can include a measurement area that has a better image contrast than other areas of the chuck, and the substrate can be loaded on the chuck with the substrate fiducial mark of the substrate within the measurement area.

The first looking inspection system can be positioned on the stage. The template field can include a plurality of fiducial marks for one or more templates. The first inspection system can include a plurality of cameras, each of the plurality of cameras being configured to capture an image including a different corresponding fiducial mark of the plurality of fiducial marks for the one or more templates.

The second inspection system can be registered in the coordinate system with predetermined locations. The stage can be configured to hold one or more substrates with one or more imprints each having one more fiducial marks. The second inspection system can include a plurality of cameras, each of the plurality of cameras being configured to capture an image including a different corresponding fiducial mark of the one or more fiducial marks of the one or more imprints on the one or more substrates.

The controller can be configured to: control a moving speed of the stage holding the substrate relative to a drawing speed of the template roll such that the template of the template roll is aligned with the substrate based on the imprinting alignment offset.

The controller can be configured to: before imprinting the template field on the resist on the substrate, perform at least one simulated imprinting sequence with the template field on the template roll being moved without contact with the resist on the substrate.

The imprinting system can further include: an unloading system for unloading the substrate from the stage. The imprinting system can further include: a flipping system for flipping the substrate with the imprint, and a loading system for loading the flipped substrate on the stage with a first side facing towards the stage and a second side facing away from the stage, the second side being opposite to the first side, the imprint being on the first side. The first inspection system can be configured to register a second template fiducial mark of a second template in the template field of the template roll in the coordinate system to determine a second template offset. The second inspection system can be configured to register the flipped substrate with the flipped imprint in the coordinate system to determine a second wafer registration offset between a second target fiducial location and a second actual fiducial location associated with a flipped imprint fiducial mark of the flipped imprint. The controller can be configured to control the moving system to move the flipped substrate with second resist on the second side to be below the second template in the template field of the template roll based on a second imprinting alignment offset, the second imprinting alignment offset being determined based on the second template offset, the second wafer registration offset, and the overlay bias.

The light source can be configured to cure the second resist, when the second template of the template roll is pressed into the second resist on the second side of the substrate, to form a second imprint on the second side, the second imprint having a second imprinted feature corresponding to the second template and a second imprint fiducial mark corresponding to the second template fiducial mark of the second template. The second inspection system can be configured to register the substrate with the flipped imprint on the first side and the second imprint on the second side in the coordinate system to determine a double-sided wafer registration offset between a target fiducial offset and an actual fiducial offset associated with the flipped imprint fiducial mark and the second imprint fiducial mark. The controller can be configured to determine a double-sided overlay bias between the flipped imprint on the first side and the second imprint on the second side based on the double-sided wafer registration offset. The controller can be configured to: update the overlay bias to be the double-sided overlay bias for iteratively imprinting a second substrate using the second template of the template roll.

The controller can be configured to determine the second imprinting alignment offset to be a sum of the second template offset, the second wafer registration offset, the overlay bias, and a second imprint nominal correction.

The controller can be configured to control the moving system to move the flipped substrate on the stage to be below the resist dispenser according to a second dispensing alignment offset that is determined at least partially based on the overlay bias and the second wafer registration offset. The controller can be configured to determine the second dispensing alignment offset to be a sum of the overlay bias, the second wafer registration offset, a second dispense offset, and a second dispense nominal correction, where the second dispense offset provides a correction for imprint to resist centering from a second nominal dispense location.

In some implementations, the third inspection system is configured to measure an image of the flipped substrate with the flipped imprint and the second imprint to determine a second imprint to resist image offset. The controller can be configured to: update the second dispense offset based on the second imprint to resist image offset; and update the second dispensing alignment offset based on the updated second dispense offset for iteratively imprinting a second substrate using the second template of the template roll.

In some implementations, the stage holds a first substrate via a first chuck and a second substrate via a second chuck, the substrate being the first substrate, and where the template field of the template roll includes a first template and the second template, the template being the first template, the imprint being a first imprint. The imprinting system can be configured to: align the first substrate with the first template and the second substrate with the second template based on the imprinting alignment offset; form the first imprint on the first side of the first substrate and the second imprint on a first side of the second substrate; flip the first substrate and load the flipped first substrate on the second chuck; flip the second substrate and load the flipped second substrate on the first chuck; align the flipped second substrate with the first template and the flipped first substrate with the second template based on the second imprinting alignment offset; and form the first imprint on a second side of the second substrate and the second imprint on the second side of the first substrate.

A sixth aspect of the present disclosure features an imprinting system including: rollers for moving a template roll, where the template roll includes a template field having a template with a template fiducial mark; a movable stage for holding a substrate; a loading system for loading the substrate on the stage; a moving system for moving the stage together with the substrate; a resist dispenser for dispensing resist on a side of the substrate; a light source for curing the resist, where the light source is configured to cure the resist to form an imprint on the side of the substrate when the template of the template roll is pressed into the resist on the side of the substrate, the imprint having an imprinted feature corresponding to the template and an imprint fiducial mark corresponding to the template fiducial mark of the template; a first inspection system for registering the template fiducial mark of the template in a coordinate system to determine a template offset; a second inspection system for measuring an image of the substrate with the imprint to update a loading offset; and a controller configured to: control the moving system to move the substrate with the resist to be below the template of the template roll based on an imprinting alignment offset, the imprinting alignment offset being at least partially determined based on the template offset and the loading offset.

The imprinting system can further include: a third inspection system for registering the imprint on the substrate in the coordinate system to determine a wafer registration offset between a target fiducial location and an actual fiducial location associated with the imprint fiducial mark. The controller can be configured to determine an overlay bias of the imprint on the side of the substrate to be the wafer registration offset minus the loading offset.

The imprinting system can further include: a flipping system for flipping the substrate with the imprint. The loading system can be configured to load the flipped substrate on the stage with a first side facing towards the stage and a second side facing away from the stage, the second side being opposite to the first side, the imprint being on the first side.

The first inspection system can be configured to register a second template fiducial mark of a second template in the template field of the template roll in the coordinate system to determine a second template offset. The third inspection system can be configured to register the flipped substrate with the flipped imprint in the coordinate system to determine a second wafer registration offset between a second target fiducial location and a second actual fiducial location associated with a flipped imprint fiducial mark of the flipped imprint. The controller can be configured to control the moving system to move the flipped substrate with second resist on the second side to be below the second template in the template field of the template roll based on a second imprinting alignment offset, the second imprinting alignment offset being determined based on the second template offset, the second wafer registration offset, and the overlay bias.

The light source can be configured to cure the second resist, when the second template of the template roll is pressed into the second resist on the second side of the substrate, to form a second imprint on the second side, the second imprint having a second imprinted feature corresponding to the second template and a second imprint fiducial mark corresponding to the second template fiducial mark of the second template. The third inspection system can be configured to register the substrate with the flipped imprint on the first side and the second imprint on the second side in the coordinate system to determine a double-sided wafer registration offset between a target fiducial offset and an actual fiducial offset associated with the flipped imprint fiducial mark and the second imprint fiducial mark. The controller can be configured to determine a double-sided overlay bias between the flipped imprint on the first side and the second imprint on the second side based on the double-sided wafer registration offset.

A seventh aspect of the present disclosure features an imprinting system including: rollers for moving a template roll, where the template roll includes a template field having a template with a template fiducial mark; a movable stage for holding a substrate; a loading system for loading the substrate on the stage; a moving system for moving the stage together with the substrate; a resist dispenser for dispensing resist on a side of the substrate; a light source for curing the resist, where the light source is configured to cure the resist to form an imprint on the side of the substrate when the template of the template roll is pressed into the resist on the side of the substrate, the imprint having an imprinted feature corresponding to the template and an imprint fiducial mark corresponding to the template fiducial mark of the template; a first inspection system for measuring an image of the substrate with the imprint to update a loading offset; and a second inspection system for registering the imprint on the substrate in the coordinate system to determine an wafer registration offset between a target fiducial location and an actual fiducial location associated with the imprint fiducial mark, where an overlay bias of the imprint on the side of the substrate is associated with the wafer registration offset; and a controller configured to: control the moving system to move the substrate with the resist to be below the template of the template roll based on an imprinting alignment offset, the imprinting alignment offset being at least partially determined based on the loading offset, and determine an overlay bias of the imprint on the side of the substrate to be based on the wafer registration offset and the loading offset.

The imprinting system can further include: a third inspection system for registering the template fiducial mark of the template in the coordinate system to determine a template offset. The controller can be configured to determine the imprinting alignment offset based on the template offset and the loading offset.

The imprinting system can further include: a flipping system for flipping the substrate with the imprint. The loading system can be configured to load the flipped substrate on the stage with a first side facing towards the stage and a second side facing away from the stage, the second side being opposite to the first side, the imprint being on the first side.

The third inspection system can be configured to register a second template fiducial mark of a second template in the template field of the template roll in the coordinate system to determine a second template offset. The second inspection system can be configured to register the flipped substrate with the flipped imprint in the coordinate system to determine a second wafer registration offset between a second target fiducial location and a second actual fiducial location associated with a flipped imprint fiducial mark of the flipped imprint. The controller can be configured to control the moving system to move the flipped substrate with second resist on the second side to be below the second template in the template field of the template roll based on a second imprinting alignment offset, the second imprinting alignment offset being determined based on the second template offset, the second wafer registration offset, and the overlay bias.

The light source can be configured to cure the second resist, when the second template of the template roll is pressed into the second resist on the second side of the substrate, to form a second imprint on the second side, the second imprint having a second imprinted feature corresponding to the second template and a second imprint fiducial mark corresponding to the second template fiducial mark of the second template. The second inspection system can be configured to register the substrate with the flipped imprint on the first side and the second imprint on the second side in the coordinate system to determine a double-sided overlay error between a target fiducial offset and an actual fiducial offset associated with the flipped imprint fiducial mark and the second imprint fiducial mark. The controller can be configured to determine a double-sided overlay bias between the flipped imprint on the first side and the second imprint on the second side based on the double-sided overlay error.

The details of one or more disclosed implementations are set forth in the accompanying drawings and the description below. Other features, aspects, and advantages will become apparent from the description, the drawings and the claims.

BRIEF DESCRIPTION OF THE DRAWINGS

Like reference numbers and designations in the various drawings indicate like elements.

DETAILED DESCRIPTION

Figure 1:
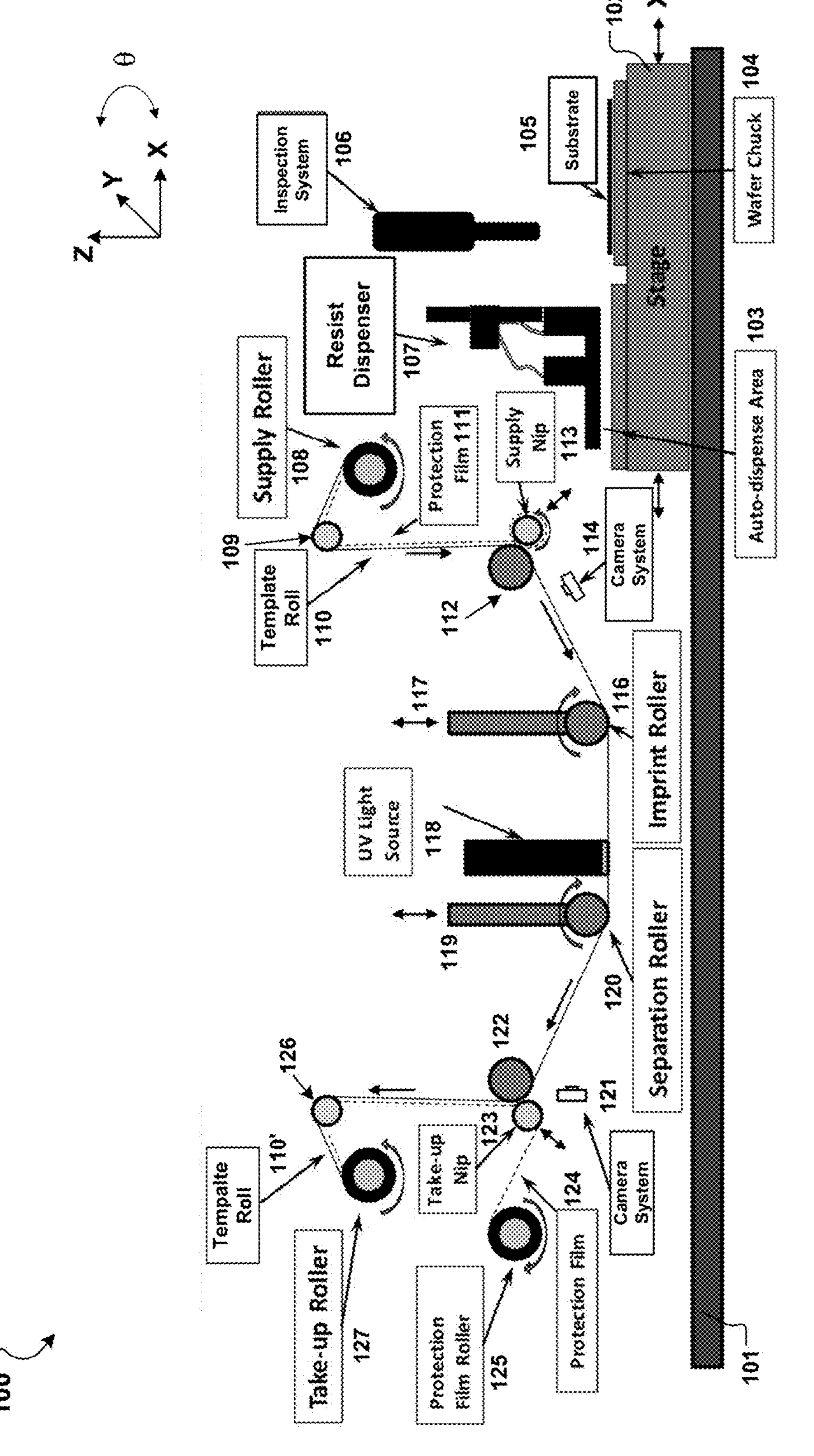
FIG. 1 is a schematic diagram of an example imprinting tool, according to one or more implementations of the present disclosure.

The present disclosure describes methods, devices, systems and techniques for managing multi-objective alignments for imprinting, e.g., single-sided imprinting, double-sided imprinting, or both. The multi-objective alignments can include imprint(s) (or imprinted patterns) to substrate (or wafer) alignment, imprint(s) to resist (or resist drop) alignment, and first side to second side imprint(s) alignment. The techniques can adopt a process of iteratively implementing multi-objective optimization of aligning multiple components for imprinting lithography. In some examples, the techniques can consistently achieve at least one of: sub-100 μm/0.5 arc-minute overlay accuracy, sub-200 μm imprint to wafer centering accuracy, or sub-100 μm imprint to resist alignment accuracy.

In some implementations, the techniques can address non-repeatability for web-based imprinting tools, for example, by running the tools one or more times through a simulated imprinting sequence, e.g., without contact of a substrate to thereby settle the web to mitigate web motion non-repeatability errors. The web can be settled to reduce the web's theta (T) variation from imprint to imprint, thereby improving the web's repeatability when placing the templates at an imprinting location. The techniques can also provide an upward looking inspection system (e.g., a camera system) for registering templates (e.g., coated resist templates—CRTs) on the web, which can be used to locate fiducial marks (fiducials, alignment marks, or reference marks) and compute a template offset (e.g., a rigid body correction) in an XYT stage coordinate system. This registration combined with the web settling can provide a stable map from a template field including the templates to the XYT stage/wafer chuck(s). The blank (e.g., no fiducial) wafer (or substrate) can be moved to a resist dispenser using the XYT stage adjusted based on a dispensing alignment offset associated with multiple corrections, including a dispense nominal correction, a loading offset and a dispense offset. The loading offset and the dispense offset can be measured and learned in a later step using a wafer inspection system (WIS) which is configured to capture the entire wafer and pattern in a single image. After the resist is dispensed on the wafer, the wafer can be moved beneath the template field using an imprinting alignment offset (or an un-flipped offset) that can be based on an imprint nominal correction, the loading offset, and the template registration offset.

After the templates in the template field are imprinted on the resist on the wafer and the resist is cured, the wafer with the imprint can be unloaded. During the wafer unloading process, the wafer can be registered using a downward looking fine alignment inspection system (e.g., a sub 5 micron microscope system) at known coordinates and “quiet zones” on the chuck spanning the wafer fiducial locations to find a coordinate transform from the imprint to the downward looking fine alignment inspection system in the coordinate system. An offset between the designed fiducial locations and the actual fiducial locations can be considered as a first side wafer offset or a first side pattern alignment offset. The results of the measurement minus the loading offset can provide a map from the imprinting location (including the template registration) to the wafer registration location. This measurement can be used to compute an initial pattern placement offset to be a difference of the first side wafer offset (or the pattern placement error) and the loading offset (which can be used for a later step when imprinting on the second side of the wafer). After unloading the wafer from an imprinting system or module, the WIS system can measure the imprint to blank wafer image offsets and imprint to resist image offsets (both in XYT stage coordinate system). These offsets can be used to iteratively update the loading offset and the dispense offset (e.g., for first side imprints). In some cases, the above steps can be repeated for multiple wafers. In some cases, the wafers with first-side imprints can be immediately flipped for the next imprinting on the second, opposite side of the wafer.

In some implementations, the techniques can address the alignment problems on imprinting on the second side of the wafer. After the wafer is flipped and loaded to the chuck with the first side imprint down, the flipped wafer can be registered using flipped coordinates based on the first side imprint by the downward looking inspection system, and the result of the registration can be defined as the second side wafer offset (or a second wafer registration error). The template field for the second side imprinting can be registered same as that in the first side imprinting by the upward looking inspection system. The wafer can be moved to the resist dispenser using the XYT stage adjusted based on a second dispensing alignment offset that is determined based on the dispense nominal correction, the dispense offset, the second side wafer offset (or the second wafer registration error) and the initial pattern placement offset obtained on the first side. After the resist is dispensed on the wafer with a specified pattern for the second side, the wafer can be moved to the template field for imprinting using a flipped offset (or a second imprinting alignment offset) that can be based on the imprint nominal correction, the second side wafer offset, the initial overlay offset, and the template offset.

Figure 8A:
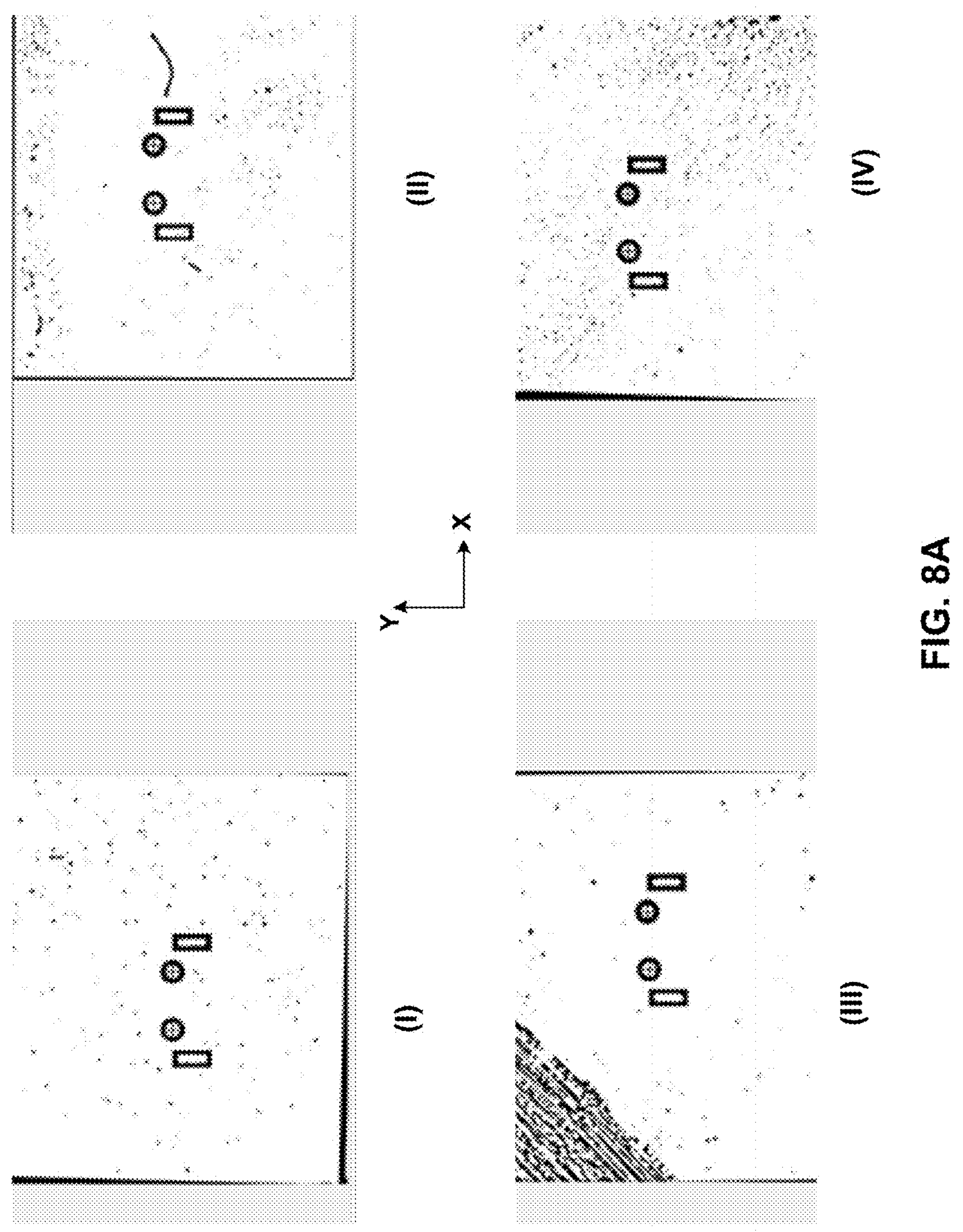
FIG. 8A shows image examples during an overlay measurement for two substrates (two images per substrate), where fiducial marks (rectangle plus circle per mark) are captured on both sides of double-sided imprinted substrates by the example inspection system of FIG. 4B, according to one or more implementations of the present disclosure.
Figure 8B:
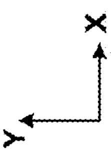
FIG. 8B shows example images of fiducial marks of double-sided imprints on substrates with bad alignment (V) and with good alignment (VI) with respect to an overlay of the double-sided imprints, according to one or more implementations of the present disclosure.
Figure 8B:
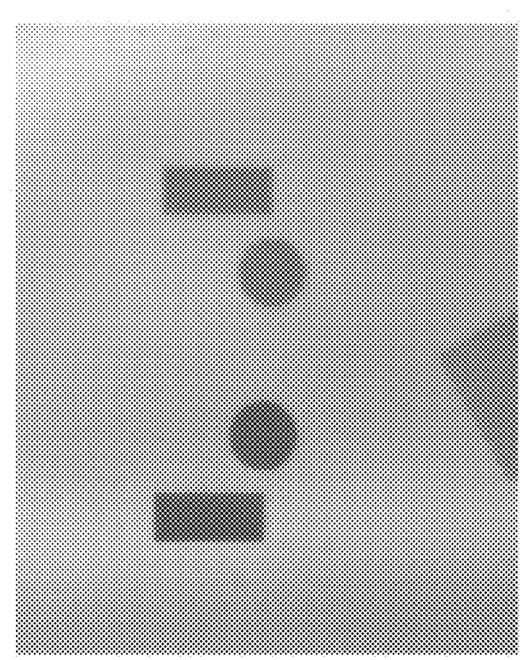
Figure 8B:
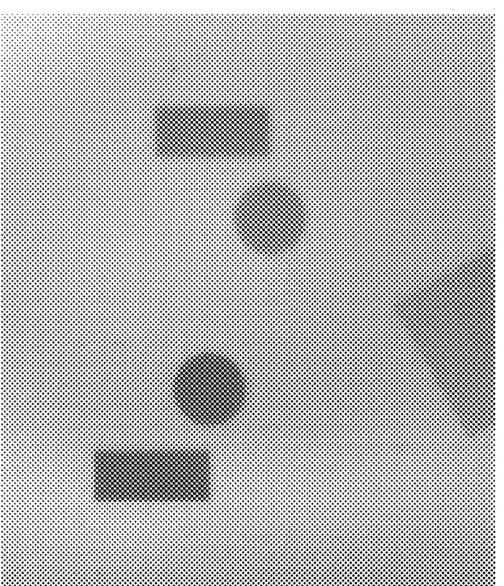

During the wafer unloading process and before unloading from the chucks, the first side to second side pattern offset can be measured using the downward looking fine alignment inspection system (e.g., the wafer registration cameras) by looking at the fiducial marks of the first side versus the second side at the same time and computing a designed offset versus an actual offset (e.g., as illustrated in FIGS. 8A and 8B). This measured double-sided overlay error can be used to iteratively improve the overlay offset. After unloading the wafer, the WIS system can also measure the imprint to resist image offsets to continue improving the dispense offsets. It is unnecessary to update the loading offset for the second side as the imprint to wafer offset is constrained by the first side to second side overlay offset. The techniques can be improved by self-learning. As more wafers can be processed, the imprinting tools can be adjusted to optimize the multi-objective alignments by learning the alignment offsets for the first side and the second side imprinting.

The techniques enable the tool to automatically update alignment parameters by reinforcement learning and combine the updated alignment parameters into sequential imprinting processes to improve an optical performance of a target device, an overlay accuracy for double-sided imprints on the target device, or both. The techniques enable to improve repeatability, stability (e.g., template field position stability), and controllability of web-based templates for imprinting. The techniques can provide additional inspection systems (e.g., upward looking inspection system, downward looking fine alignment inspection systems, and WIS systems) to measure alignment offsets. The techniques can provide an integrated (or combined) solution to address multi-objective alignment challenges for imprinting (e.g., single-sided imprinting or double-sided imprinting), e.g., by iteratively solving multi-objective optimization of aligning multiple critical components for double-sided imprint lithography on substrates such as glass wafers.

The techniques can be implemented by any suitable imprinting tool, e.g., a high volume manufacturing (HVM) production tool or an imprinting lithography system. The techniques can be applied for aligning multiple objects in any suitable systems or tools. The techniques can be applied for fabricating or manufacturing any suitable micro or nanostructures or any double sided patterning structures, e.g., diffraction gratings on single side or both sides of any suitable substrates (e.g., rigid or flexible materials). For example, the techniques can be utilized to fabricate a diffractive optical element (DOE) for an eyepiece in a virtual or augmented reality system. The DOE can include including an orthogonal pupil expansion (OPE) diffractive element and an exit pupil expansion (EPE) diffractive element. The OPE diffractive element and the EPE diffractive element can be fabricated on a same side or opposite sides of a substrate, e.g., a glass substrate. The eyepiece can be an eyepiece having OPE and EPE imprints on both sides of the substrate, e.g., with an alignment accuracy of sub-100 μm/0.5 arc-minute overlay.

Example Imprinting Tool

FIG. 1 is a schematic diagram of an example imprinting tool 100, according to one or more implementations of the present disclosure. The imprinting tool 100 can be configured to perform single-sided imprinting, double-sided imprinting, or both.

The imprinting tool 100 can includes a stage 102 positioned on a base 101. The stage 102 can be controlled to move along X direction, Y direction, or both. The stage can be an XYT air bearing stage and can be a six-axis adjustable stage. A substrate 105 can be positioned on a chuck 104 on the stage 102. The chuck 104 can be a vacuum chuck that is configured to hold the substrate 105 on the chuck 104, e.g., during moving. The substrate 105 held by the chuck 104 is movable together with the stage 102. The substrate 105 can be a transparent substrate, e.g., a glass wafer. The stage 102 can hold two or more substrates 105 via corresponding chucks 104.

Figure 2:
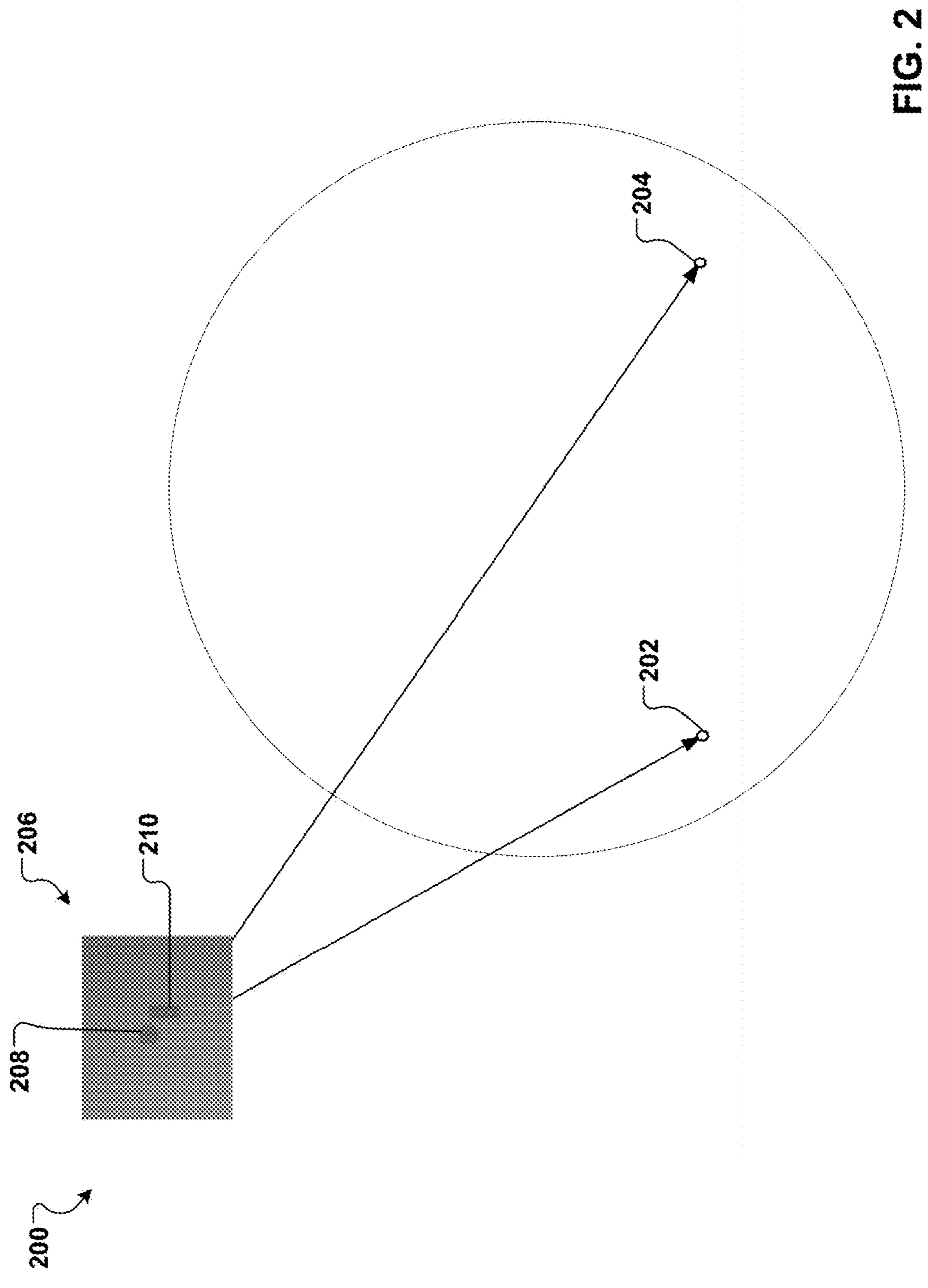
FIG. 2 is a schematic diagram of an example substrate with an imprint having fiducial marks, according to one or more implementations of the present disclosure.

FIG. 2 shows an example substrate 200 that can be used as the substrate 105 of FIG. 1. An imprint is formed on a side of the substrate 200. The imprint can include one or more fiducial marks 202, 204. Image 206 shows an example fiducial alignment mark that can include a circle 208 and a vertical bar 210. The fiducial marks 202, 204 can be used for registering the imprint on the substrate 200, e.g., before imprinting on an opposite side. The fiducial marks 202, 204 can be also used for measuring side-to-side imprint overlay after imprinting on both sides of the substrate 200.

In some implementations, a wafer inspection system (WIS) (not shown in FIG. 1) can be positioned at a station between an imprinting module and a loading system, e.g., an equipment front end module (EFEM), to capture an image of the substrate 105. The WIS system can include a camera for capturing images of an entire substrate. The WIS can be configured to perform pre-imprinting inspection and post-imprinting inspection on the substrate 105. The WIS system can register a blank or patterned substrate by using a notch and a geometry (e.g., a circle) of the substrate. The WIS system can be configured to determine an overall centration of an imprinted pattern on the substrate by also registering the pattern. The WIS system can be configured to measure pattern to dispense offsets and pattern to blank substrate offsets, to detect defects, and to perform any other suitable operations.

A resist dispenser 107, e.g., an inkjet printing device, can be arranged above an auto-dispense area 103. The resist dispenser 107 includes one or more dispense heads configured to inject a resist, e.g., a ultraviolet (UV) light curable resist. A template roll (or a web) 110, e.g., a coated resist template film, can be supplied from a supply roller 108. The template roll 110 can be flexible. The template roll 110 can include one or more templates to be imprinted and a protection film 111 on top of the templates.

Figures 3A, 3B:
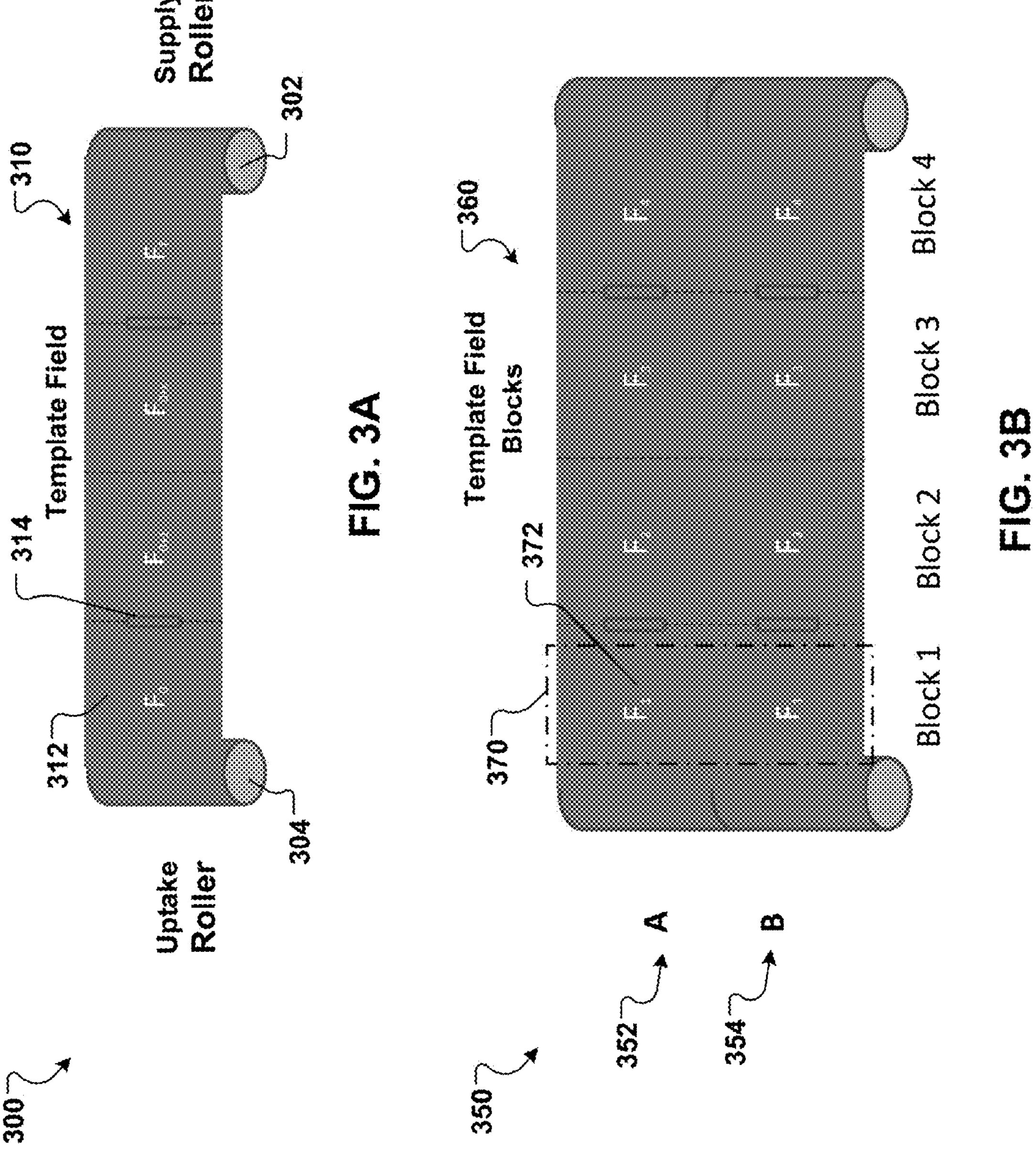
FIG. 3A is a schematic diagram of an example template roll with a single track of templates, according to one or more implementations of the present disclosure.
FIG. 3B is a schematic diagram of an example template roll with double tracks of templates, according to one or more implementations of the present disclosure.

FIG. 3A shows an example template roll 300 that can extend between a supply roller 302 and an uptake roller 304. The template roll 300 can include a template field 310 having a single track of templates 312, e.g., F0, F0+1, F0+x, Ff. During a first imprinting action, the template roll 300 can be advanced from the supply roller 302 to the uptake roller 304, and the templates 312 in the template field 310 can be sequentially processed, e.g., from F0 to Ff. During a second imprinting action after the first imprinting action, the template roll 300 can be advanced from the uptake roller 304 to the supply roller 302, and the templates 312 in the template field 310 can be sequential processed in a reversed order, e.g., from Ff to F0. The template roll 300 can be qualified by witness prints 314 in order from F0 through Ff. In some cases, after the first imprinting action, the template roll 300 can be re-wound fully from the uptake roller 304 to the supply roller 302. A template 312 can include a diffractive structure, e.g., a diffractive grating. Different templates 312 can be configured to diffract out different colors, e.g., red, blue, or red, when being illuminated by light, e.g., a white light.

FIG. 3B shows another example template roll 350 having a template field 360 that can include double tracks 352, 354 of templates 372. Each template has a respective identifier number, e.g., 1, 2, 3, 4, in a single track along a horizontal direction. The tracks 352, 354 of templates are positioned parallel to each other on the template roll 350 along the horizontal direction. Along a vertical direction, templates having a same order number can form a template block 370. The templates having the same order number can have a same location along the horizontal direction and be separated along the vertical direction. For example, template F1 on the track 352 and template F1 on the track 354 from block 1. If any one of the templates in a template block is bad, the template block can be considered unusable and can be skipped during imprinting.

Referring back to FIG. 1, the template roll 110 can be the template roll 300 having a single track of templates of FIG. 3A or the template roll 350 having double tracks of templates of FIG. 3B. The template roll 110 can also have three or more tracks of templates, e.g., to improve a manufacturing volume.

The template roll 110 can be advanced by a roller 109 through a location between a supply nip 113 and a roller 112. The protection film 111 can be peeled off from the template roll 110 and be wound onto the supply nip 113. After the protection film 111 is peeled off, the templates on the template roll 110 are exposed and can be captured by an inspection system 114. The inspection system 114 can be used to register or locate one or more fiducial marks of the templates to be imprinted. The registration of the fiducial marks of the templates can be used to compute a template offset in the XYT stage coordinate system, where X represents X direction, Y represents Y direction, and T represents theta (θ) direction in the XY plane, as illustrated in FIG. 1. The inspection system 114 can include one or more cameras. Each camera can be configured to capture one fiducial alignment mark of a template. For example, if the template has two fiducial marks, two cameras in the inspection system 114 can be used to capture the two fiducial marks, respectively (and simultaneously).

Figure 4A:
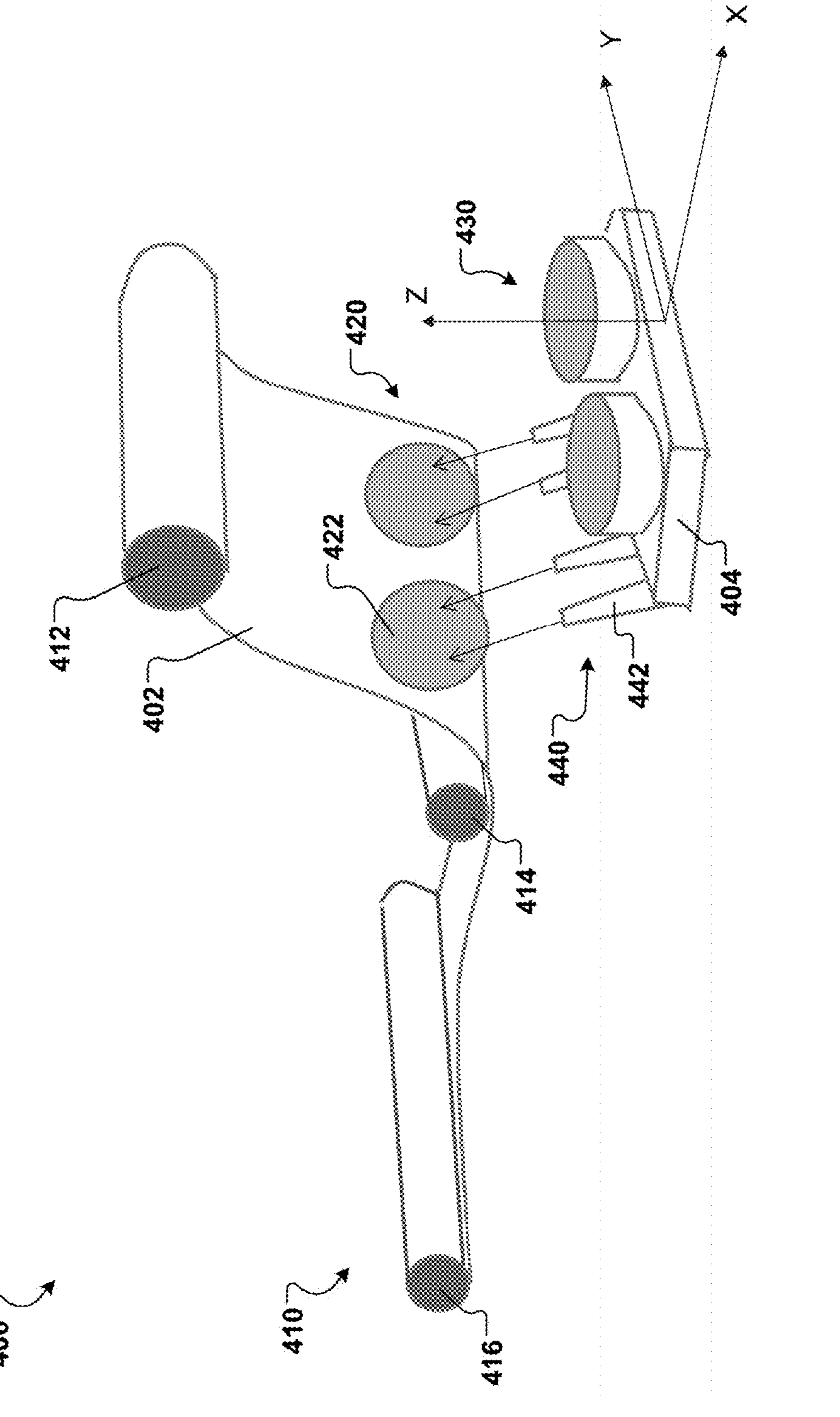
FIG. 4A is a schematic diagram of an example camera based template roll registration system for measuring alignment fiducial marks on templates on a template roll, according to one or more implementations of the present disclosure.

FIG. 4A shows an example system 400 for registering templates on a template roll 402. The template roll 402 can be advanced by a roller system 410 including rollers 412, 414, 416. The template roll 402 has a template field 420, e.g., the template field 360 of FIG. 3B. The template field 420 can include double tracks of templates 422, e.g., the template 372 of FIG. 3B. The two templates 422 to be imprinted, e.g., simultaneously, on two corresponding substrates 430 can be in a template block, e.g., the template block 370 of FIG. 3B. The substrates 430 are arranged on a movable stage 404, e.g., the stage 102 of FIG. 1, via a chuck, e.g., the chuck 104 of FIG. 1. Each template 422 can have a substantially same area size and a same shape as a substrate 430. In some cases, each template 422 can have a same shape as the substrate 430 but a smaller area than the substrate 430.

The system 400 can include an upward looking inspection system 440 that can be configured to register templates on the template roll 402. In some examples, each template has two fiducial marks, and the upward looking inspection system 440 includes four cameras 442 respectively for the four fiducial marks of the two templates 420 on the template roll. The upward looking inspection system 440 can be positioned on the stage 404, as illustrated in FIG. 4A.

Figure 5:
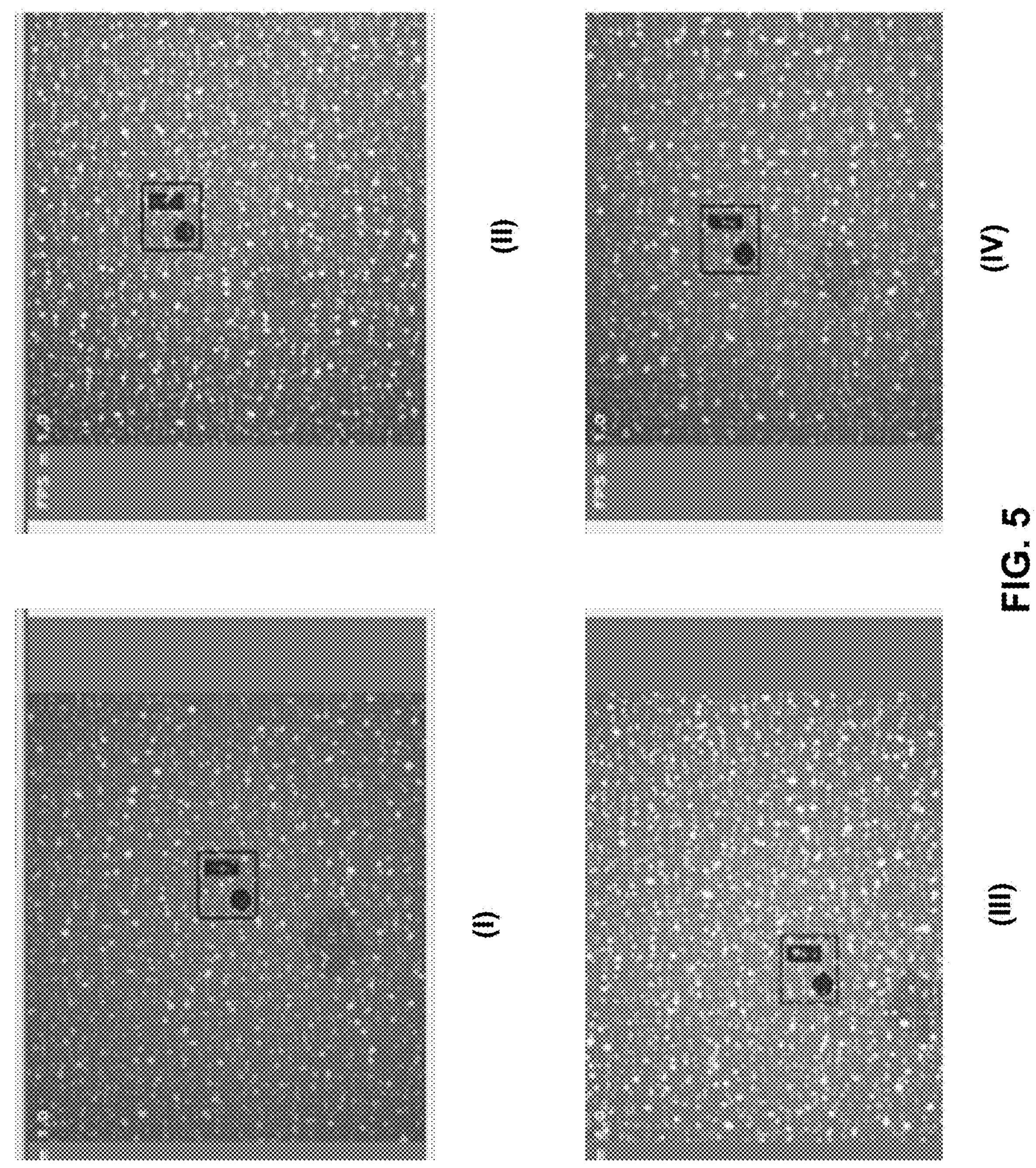
FIG. 5 shows example images of fiducial marks collected from a roll-to-roll template field using an example inspection system, according to one or more implementations of the present disclosure.

FIG. 5 shows example images (I), (II), (III), (IV) of fiducial marks of templates from a roll-to-roll template field captured by the example inspection system 440 of FIG. 4A. Each of the four cameras 442 captures an image of a corresponding fiducial mark on a template. For example, images (I) and (II) show two fiducial marks of a first template 422 in the template field 420, and images (III) and (IV) show another two fiducial marks of a second template 422 in the template field 420.

Referring back to FIG. 1, the inspection system 114 can be the upward looking inspection system 440. After the templates are registered, the template roll 110 is advanced to an imprinting area where the templates are to be imprinted on resist on the substrate 105. The substrate 105 can be moved together with the stage 102 under the templates. The substrate 105 and the templates can be aligned by the registered fiducial marks, e.g., by the inspection system 114. In some implementations, an additional inspection system can be used to align the templates and the substrate 105 when the substrate 105 is moved under the templates. In some implementations, the alignment between the templates and the substrate 105 can be controlled by a moving speed of the stage 102 and an advancing speed of the template roll 110.

An imprint roller 116 can be pressed against the template roll 110 (and the templates) onto the resist on the substrate 105 along Z direction by a pressure. A holder 117 can be connected with the imprint roller 116 and be movable along Z direction to adjust the pressure on the imprint roller 116 to the template roll 110. The imprinting tool 100 can include a separation roller 120 that is configured to be pressed against the template roll 110 along the Z direction by a pressure. Another holder 119 can be connected to the separation roller 120 and be movable along the Z direction to adjust the pressure on the separation roller 120 to the template roll 110. The separation roller 120 can be controlled to have a same level as the imprint roller 116 along the Z direction, such that the template roll is flat between the separation roller 120 and the imprint roller 116. In some implementations, the templates in the template field can be imprinted onto the resist on the substrate 105 by pressing the imprint roller 116 when the substrate is moved beneath the imprint roller 116 at a speed. In some implementations, a pressing device, e.g., a glass dome can be positioned between the imprint roller 116 and the separation roller 120 and be pressed against the templates into the resist on the substrate 105 to make imprints corresponding to the templates.

A light source 118, e.g., an ultraviolet (UV) light source, can be positioned between the imprint roller 116 and the separation roller 120. The light source can be positioned closer to the separation roller 120 than the imprint roller 116. The light source 118 is configured to cure the resist after being imprinted by the templates on the template roll 110.

After the separation roller 120, the template roll 110 is separated from the substrate 105 and the templates become exposed again. Another inspection system 121 can be used to capture images of the templates, which can be used to analyze a condition of the templates, a condition of the fiducial marks, or both on the templates, e.g., whether the templates, the fiducial marks, or both are damaged.

The template roll 110 can be advanced to a roller 122 and a take-up roller 123, where a protection film 124 from a protection film roller 125 can be wound on top of a side of the template roll 110 having the templates. The new template roll 110' including the protection film 124 can be rolled onto a take-up roller 127 through a roller 126.

When the substrate 105 is unloaded, the substrate 105 can be registered by an inspection system 106, e.g., a downward looking inspection system with fine alignment or a downward looking fine alignment inspection system. The inspection system 106 can be configured to capture an image of the substrate 105 with the resist imprints to register the fiducial marks on the resist imprints (corresponding to an actual fiducial location for the resist imprints). The inspection system 106 can determine a wafer offset based on a difference between a designed fiducial location and the actual fiducial location. The designed fiducial location is designed to provide a maximum XYT measurement resolution, which may be constrained by an eyepiece pattern layout and a tool geometry. In some implementations, the chuck 104 can include a quiet zone that can have an area, e.g., 4 mm by 4 mm, large enough to cover fiducial marks of the substrate 105, such that the fiducial marks of the substrate 105 (e.g., a transparent glass) are visible when the downward looking inspection system captures an image of the substrate 105. In some examples, a material, e.g., silicon, can be inserted into the quiet zone of the chuck 104 to improve contrast between the fiducial marks and the substrate 105.

Figure 4B:
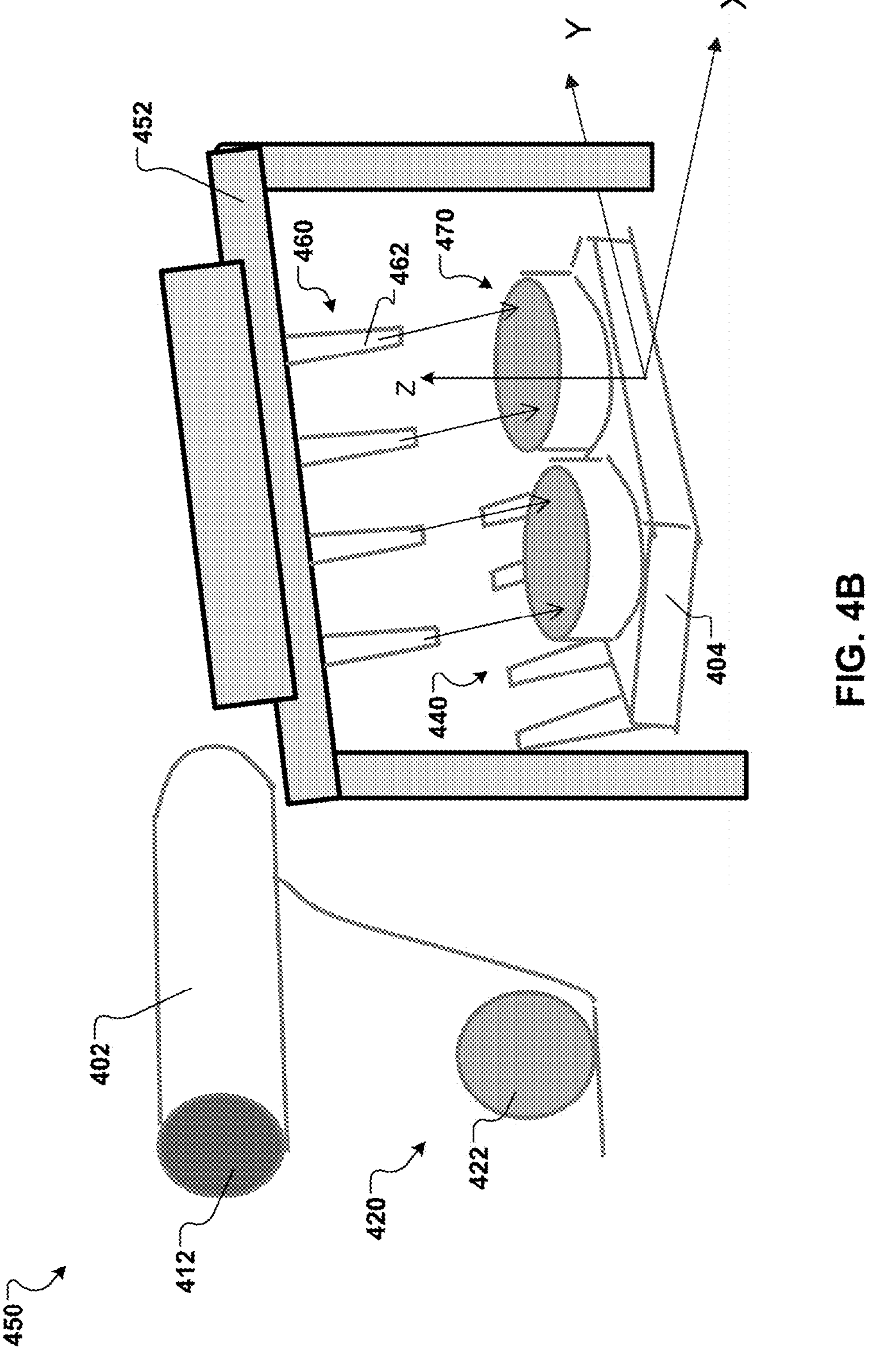
FIG. 4B is a schematic diagram of an example system for measuring alignment fiducial marks of imprints formed on substrates, according to one or more implementations of the present disclosure.

FIG. 4B is a schematic diagram of an example system 450 for measuring alignment fiducial marks on substrates 470. The substrates 470 can be substrates with single-sided imprints or substrates with double-sided imprints. In some implementations, one or more substrates, e.g., 1, 2, 3, can be processed simultaneously during an imprinting process using a corresponding number of templates in a template block on a template roll, e.g., the template roll 350 of FIG. 3B. The system 450 can include a downward looking inspection system 460 that can be positioned on a supporter 452. The downward looking inspection system 460 can be used as the inspection system 106 in the imprinting tool 100 of FIG. 1.

The downward looking inspection system 460 can include one or more cameras (or microscopes) 462 at known locations. Each camera can be configured to capture an image of one or more fiducial marks of an imprint on the substrate. In some examples, an imprint includes two fiducial marks, and two cameras can be used to respectively capture images of the two fiducial marks of the imprint. In some examples, as illustrated in FIG. 4B, two substrates are processed simultaneously in an imprinting process and the download looking inspection system 460 can include four cameras 462 configured to respectively capture images of four fiducial marks of the two substrates or four fiducial marks of single-side imprints (or eight fiducial marks of double-sided imprints) on the two substrates.

In some implementations, the substrate 105 with imprints corresponding to the templates on the template roll 110 can be moved back to the original position. The substrate 105 can be arranged in the WIS system. The WIS system can be used to measure imprint to substrate image offsets and imprint to resist image offsets. These image offsets can be used for stage corrections.

As discussed with further details in FIGS. 6 and 7A-7G, the imprinting tool 100, together with an overlay alignment system that includes the upward looking inspection system 440 and the download looking inspection system 460, can be configured to perform single-sided imprinting, double-sided imprinting, or both and can address multi-objective alignments for imprinting. The alignments can include aligning substrates with templates, aligning the templates with resist on the substrates, and aligning the imprints (or patterns) on opposite sides of the substrates. The alignment of the templates with the substrates can affect down-stream processes. The alignment of the templates with the resist and the alignment of the imprints on the opposite sides of the substrates can affect an optical performance of a target device including the substrate with opposite imprints.

Example Imprinting Processes

Figure 6:
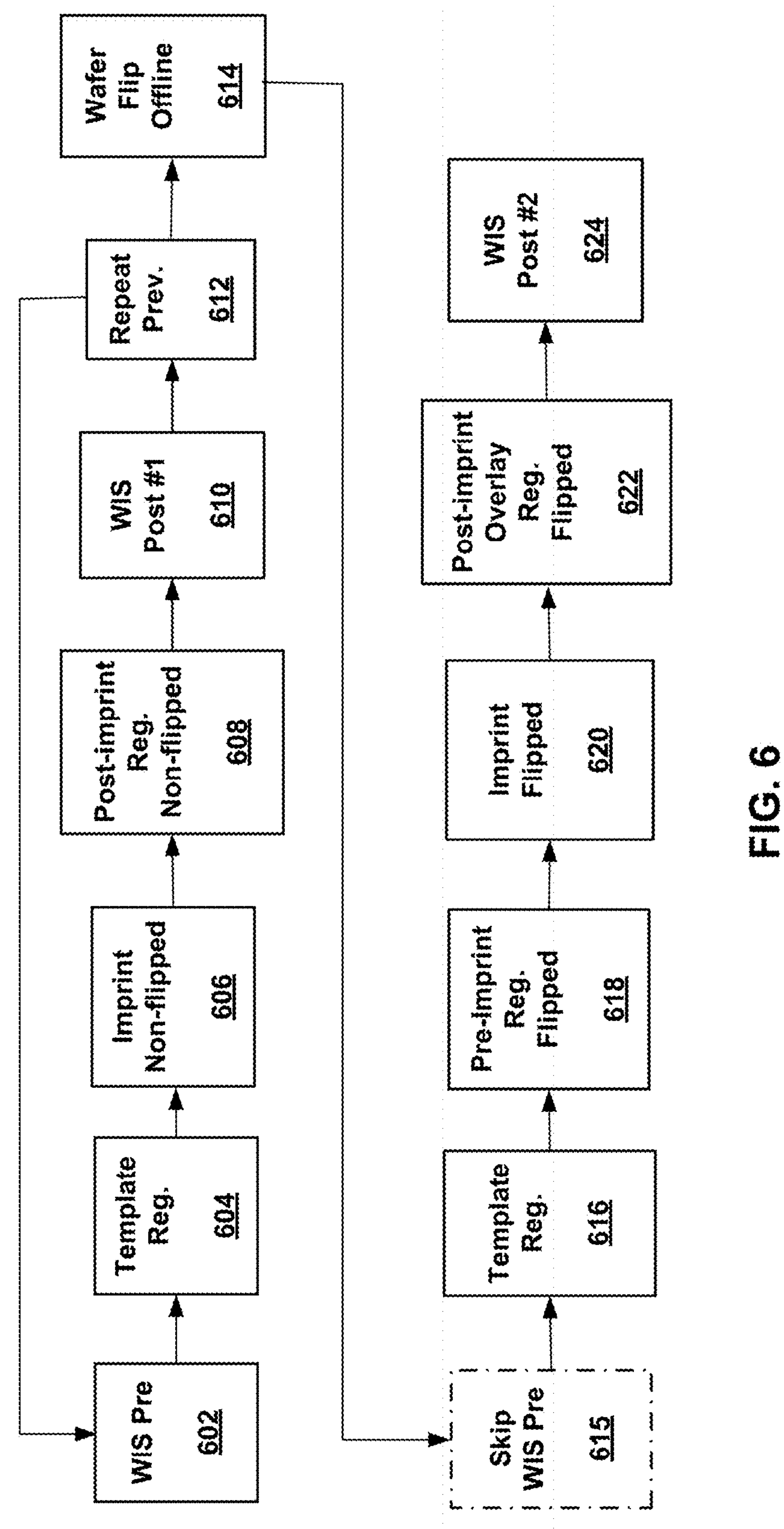
FIG. 6 is a flow diagram illustrating an example double-sided imprinting process of fabricating double-sided imprints on substrates with multi-objective alignments, according to one or more implementations of the present disclosure.

FIG. 6 is a flow diagram illustrating an example process 600 of fabricating double-sided imprints on substrates with multi-objective alignments in a double-sided imprinting process according to one or more implementations of the present disclosure. The process 600 can be performed by an imprinting tool, e.g., the imprinting tool 100 of FIG. 1. The imprinting tool can have an overlay alignment system that includes an upward looking inspection system, e.g., the inspection system 400 of FIG. 4A, and a downward looking inspection system, e.g., the inspection system 106 of FIG. 1 or the inspection system 450 of FIG. 4B. FIGS. 7A to 7G illustrate example procedures of the process 600 using the imprinting tool.

For illustration, two substrates are processed simultaneously in the process 600, as illustrated in FIGS. 4A and 4B. The two substrates can be positioned side by side on a stage, e.g., the stage 102 of FIG. 1 or the stage 404 of FIGS. 4A and 4B. Each substrate can be transparent or semi-transparent. In some examples, the substrate is a glass substrate such as a glass wafer that has a circular shape. A template roll (or a web) 110 has a template field 710 having one or more template blocks, and each template block includes two templates for imprinting. The template roll 110 can be the template roll 350 of FIG. 3B, and the template block can be the template block 370 of FIG. 3B.

The template roll 110 can affect non-repeatability for the imprinting tool. To mitigate template roll errors, the template field 710 in the template roll 110 can be settled by running the imprinting tool one or more times through a simulated imprinting process. In the simulated imprinting process, the substrates remain at an original position, and the template field has no contact with any substrate. When the template roll is indexed to a next template field, the setting action can be done once. The settling action can reduce the template roll's theta ($\theta_{template-roll}$) variation from imprint to imprint, improving the repeatability of placement of the template roll 110 when placing the template field at the imprinting location. The uncertainty due to $\theta_{template-roll}$ can contribute to a double-sided overlay error $\theta_{overlay-error}$ between double-sided imprints.

Figures 2, 7A:
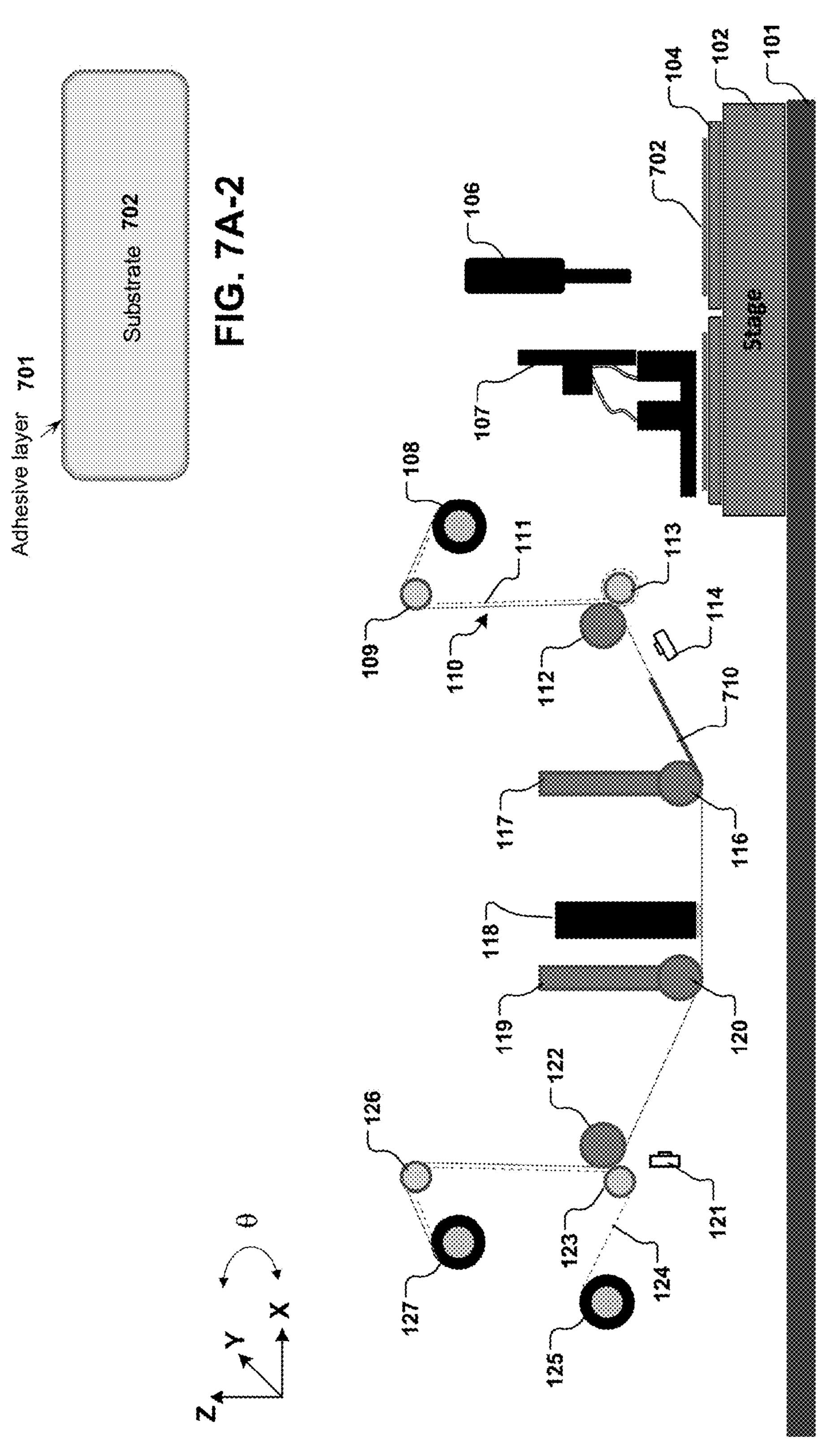
FIGS. 7A to 7G are schematic diagrams illustrating example procedures of using an imprinting tool for a single-sided imprinting process or a double-sided imprinting process, according to one or more implementations of the present disclosure.

As illustrated in FIG. 7A, two substrates (e.g., wafers) 702 can be loaded on a stage 102 by a loading system. Each substrate (or wafer) 702 can be placed on a respective chuck 104 sitting on a stage by the loading system. The loading system can include an equipment front end module (EFEM). Each substrate 702 can be centered on the chuck 104. Prior to imprinting, as illustrated in FIG. 7A-2, the substrate 702 can be coated with an adhesive layer 701. The adhesive layer 701 is configured to prepare a surface of the substrate to accept resist for imprinting.

At 602, a wafer inspection system (WIS) performs a pre-inspection on the substrates 702. The substrates 702 can be positioned on a station of the WIS system that can be different from the stage 102. The substrate 702 can be positioned on a chuck (different from the chucks 104) in the WIS system and aligned for pre-inspection using the WIS system. The WIS system is configured to detect large defects or things that may interfere with patterning or processing. The WIS system can capture images of the whole wafer. The images captured by the WIS system can have a pixel size larger than images captured by the overlay alignment system.

Figures 2, 7B:
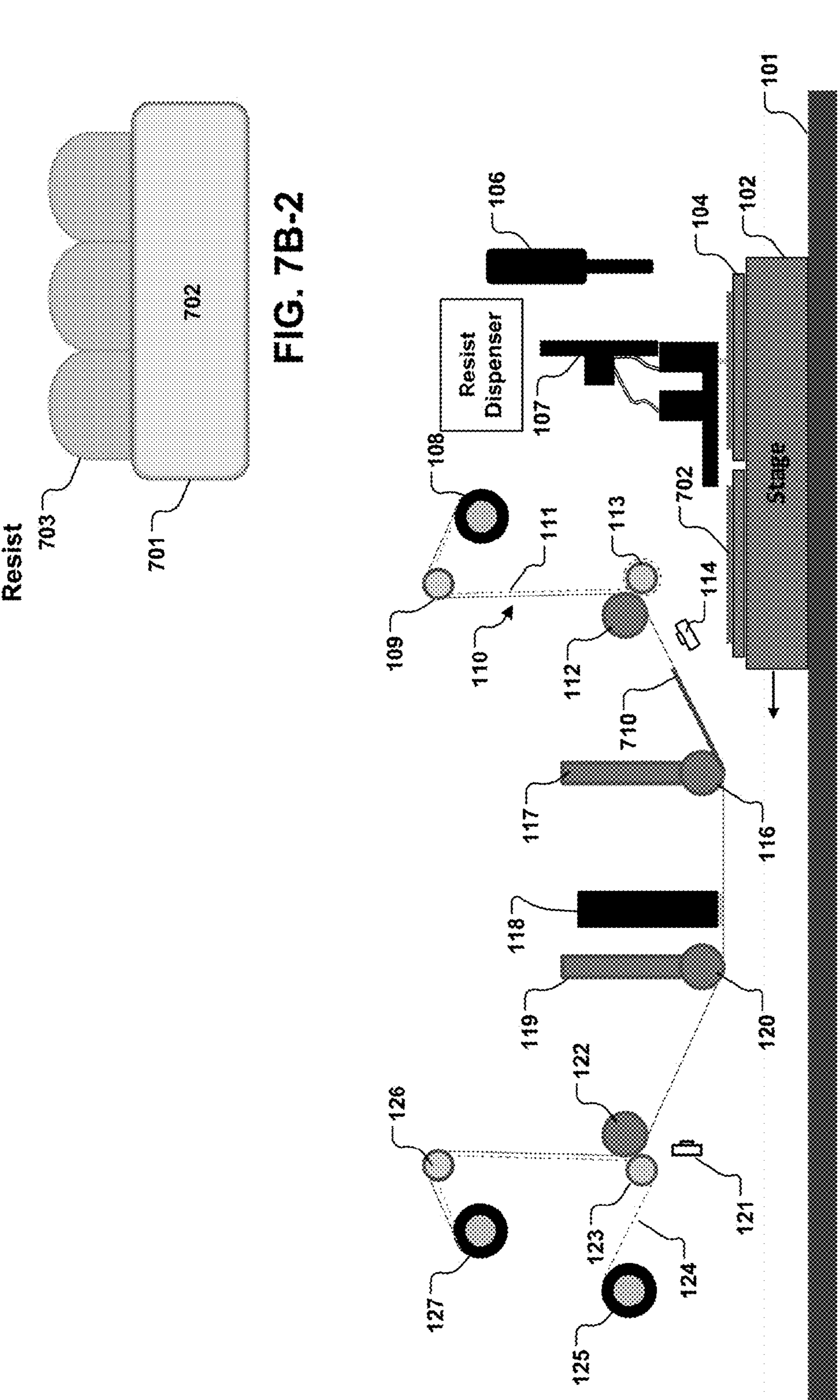

The substrates 702 on the stage 102 is moved beneath a dispense head of a resist dispenser 107, as illustrated in FIG. 7B. The stage 102 can be adjusted in an XYT stage coordinate system based on a dispensing alignment offset. The dispensing alignment offset can be a sum of $XY\theta_{DispenseNominal}$, $XY\theta_{DispenseBias}$, and $XY\theta_{FEMLoadBias}$, Where $XY\theta_{EFEMLoadBias}$ represents the loading offset that provides the correction for the substrates centering on the chucks, $XY\theta_{DispenseBias}$ represents a dispense offset that provides a correction for imprinted pattern to resist centering from a nominal dispense location, and $XY\theta_{DispenseNominal}$ represents a nominal dispense correction (e.g., based on a coarse mechanical computer aid design (CAD) model or an initial tool setup or both) for the specified pattern with which the resist is dispensed on the substrate. Both $XY\theta_{DispenseBias}$ and $XY\theta_{EFEMLoadBias}$ can be measured and updated in a later step 610 (WIS Post #1) using the WIS system. The loading offset $XY\theta_{EFEMLoadBias}$ for a current substrate (N) is determined by machine learning based on previous WIS post-imprinting measurements (e.g., in a later step 610), which can include contributions from previous substrates (N−1, . . . , 1). For example, the loading offset can be expressed as: XYT_LoadOffset(N)=XYT_LoadOffset(N−1)+alpha*(WIS Error(N−1)). The loading offset can be also expressed using a more complicated reinforcement learning algorithm. After the stage 102 is adjusted, the dispense head of the resist dispenser 107 is configured to deposit tiny droplets of resist 703 according to a specific pattern on the substrates 702, as illustrated in FIG. 7B-2.

As the template roll 110 is advanced by rollers 112, 113, a protective film 111 is peeled off, and the template field 710 is exposed. At 604, the template field 710 is registered, for example, by the upward looking inspection system. The upward looking inspection system can be positioned on the stage 102 and moved closer to the exposed template field 710 for the registration. Each template includes two fiducial marks. As illustrated in FIG. 4A, the upward looking inspection system can include four cameras for the two templates in a block of the template field 710, and each camera is configured to capture an image of a corresponding fiducial mark. The location of each camera (and thus the measurement of the fiducial mark) is known in the XYT stage coordinate system. The measurement results can be used to locate the fiducial marks of the templates and compute a template (e.g., template) offset (or a rigid body correction) $XY\theta_{CRToffset}$ in the XYT stage coordinate system. The template offset $XY\theta_{CRToffset}$ combined with the settling of the template field 710 can provide a stable map from the template field 710 to the XYT stage 102, the chucks 104, or both.

The substrates 702 are moved with the stage 102 to the template field 710 using an un-flipped offset (or an imprinting alignment offset). The un-flipped offset can be a sum of $XY\theta_{ImprintNominal}$, $XY\theta_{CRToffset}$, and $XY\theta_{EFEMLoadBias}$, where $XY\theta_{ImprintNominal}$ represents an imprint nominal correction (e.g., based on a coarse tool setup) that a control system of the stage 102 can provide for correcting an imprinting location. The stage 102 is moved at a stable moving speed, e.g., 10 millimeter per second (mm/s), to place the substrates 702 beneath an imprint roller 116. The moving speed of the stage 102 and an advanced speed of the template roll 110 (thus the template field 710) can be configured such that fiducial marks of the substrates 702 and the template field 710 can be aligned using the un-flipped offset.

Figures 2, 7C:
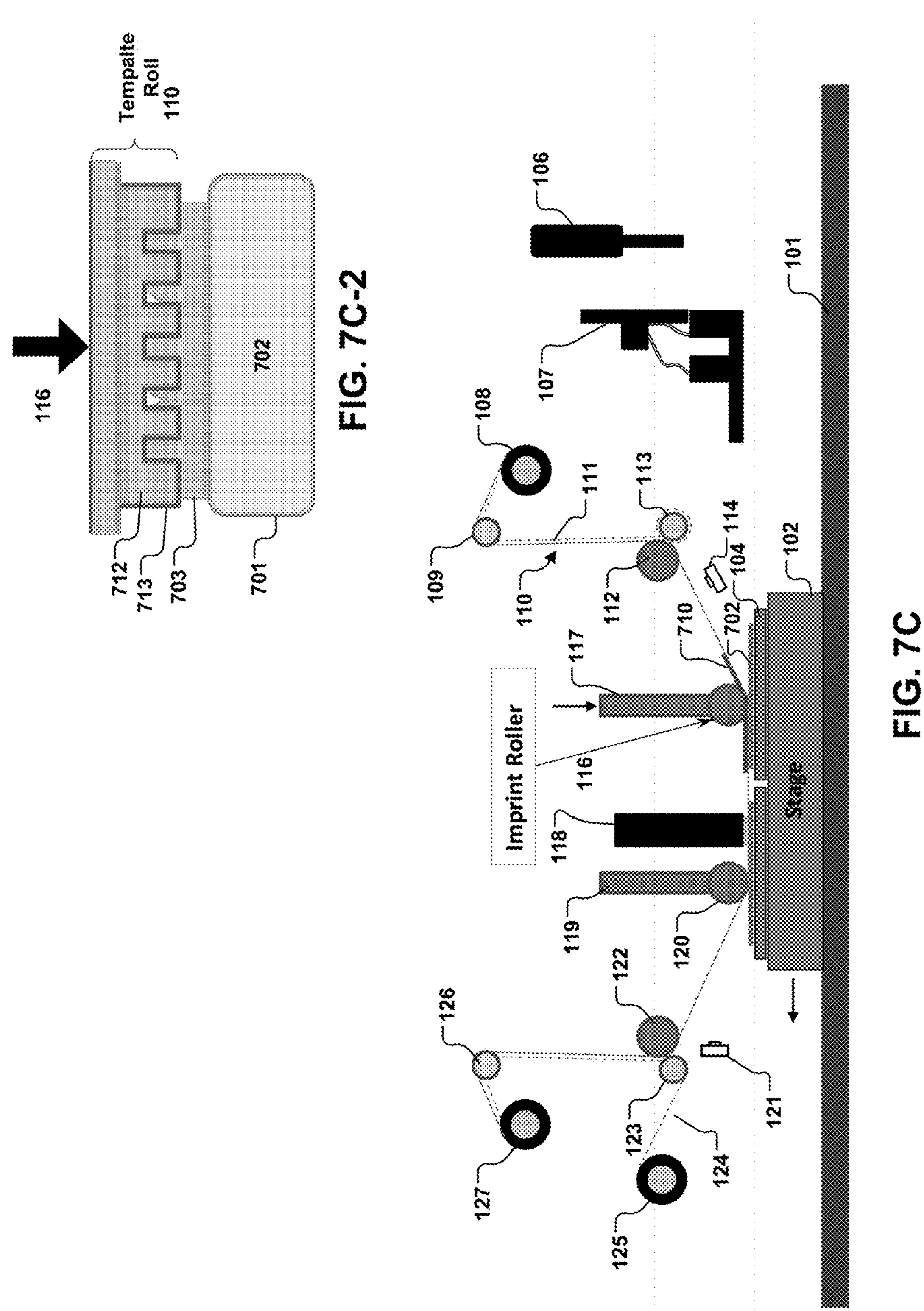

At 606, when the substrate 702 is passing beneath the imprint roller 116, a template 712 is imprinted onto the resist 703 on the substrate 702 by applying a pressure on the imprint roller 116 through a holder 117, as illustrated in FIGS. 7C and 7C-2. The downward pressure can be 3.5 to 4 Newton (N). In some implementations, a surface of the template 712 is covered by a coating 713 that is configured for smooth separation of the template 712 from a cured resist on the substrate 702. In some cases, the two substrates 702 are imprinted with a same template 712. In some cases, each of the two substrates 702 is imprinted with a different corresponding template 712.

Figures 2, 7D:
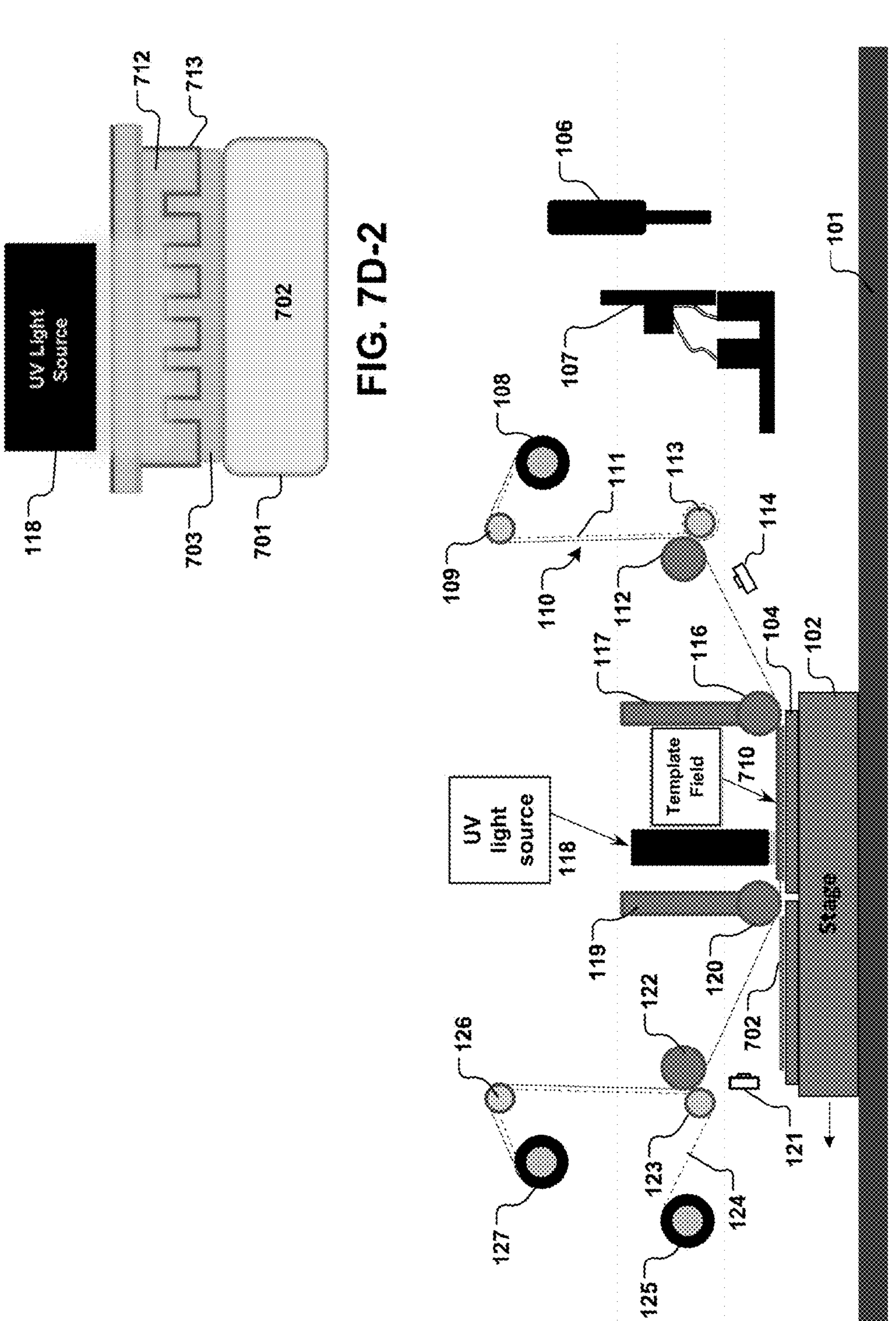

When the stage 102 continues to move at the stable speed, e.g., 10 mm/s, the substrate 702 is passing beneath a UV light source 118, where the resist on the substrate 702 is cured by UV light from the UV light source 118, as illustrated in FIGS. 7D and 7D-2.

Figures 2, 7E:
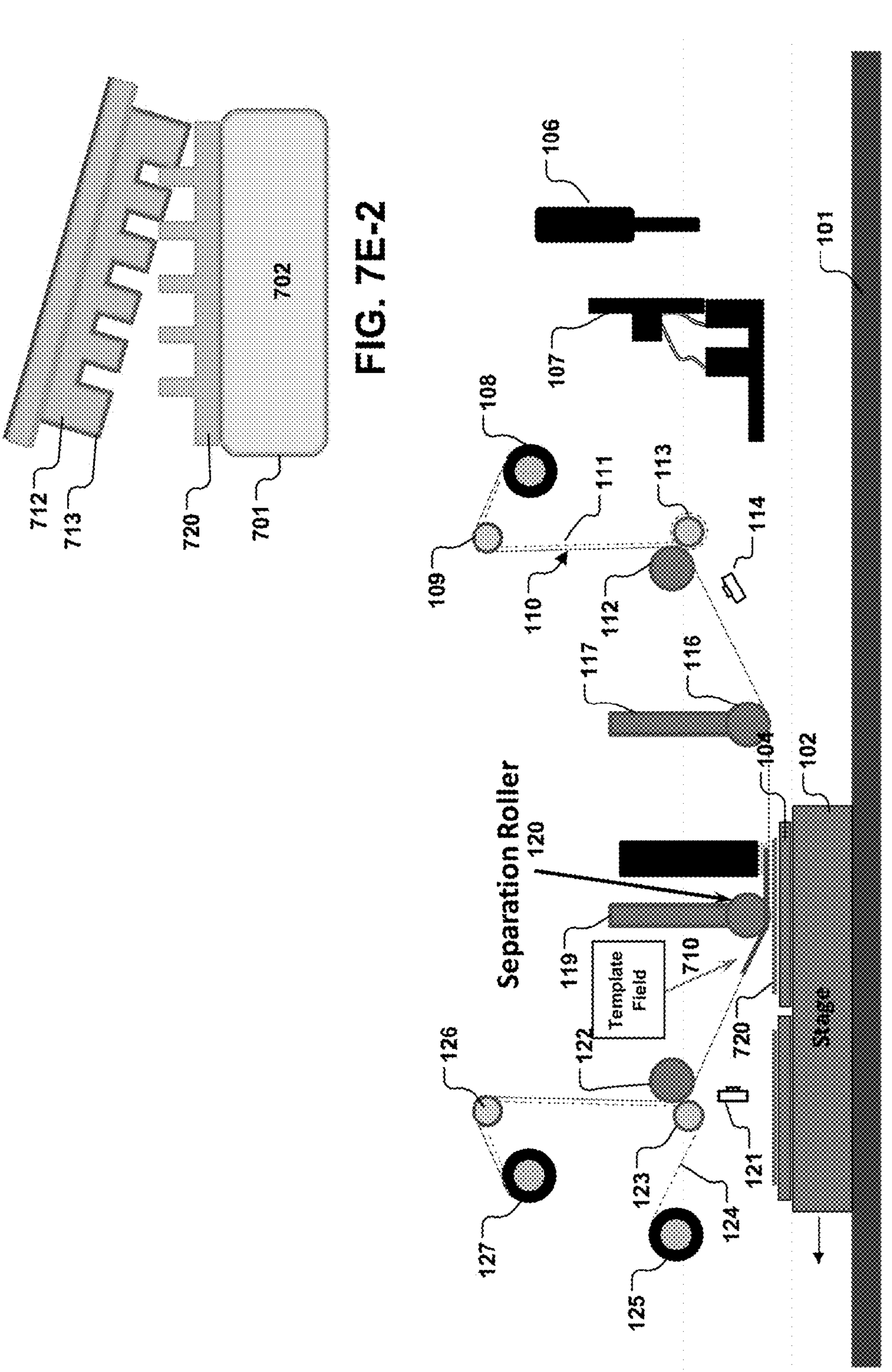

As the stage 102 continues to be moved and the template roll 110 continues to be advanced simultaneously, the template 712 is separated from the wafer surface, as illustrated in FIGS. 7E and 7E-2. The cured resist adheres to the adhesive layer-covered surface of the substrate 702 to form an imprint 720. The coating 713 on the template 712 allows for smooth separation of the template 712 from the imprint 720 on the substrate 702. The imprint 720 has a feature (or pattern) corresponding to a feature (or pattern) of the template 712.

Figures 2, 7F:
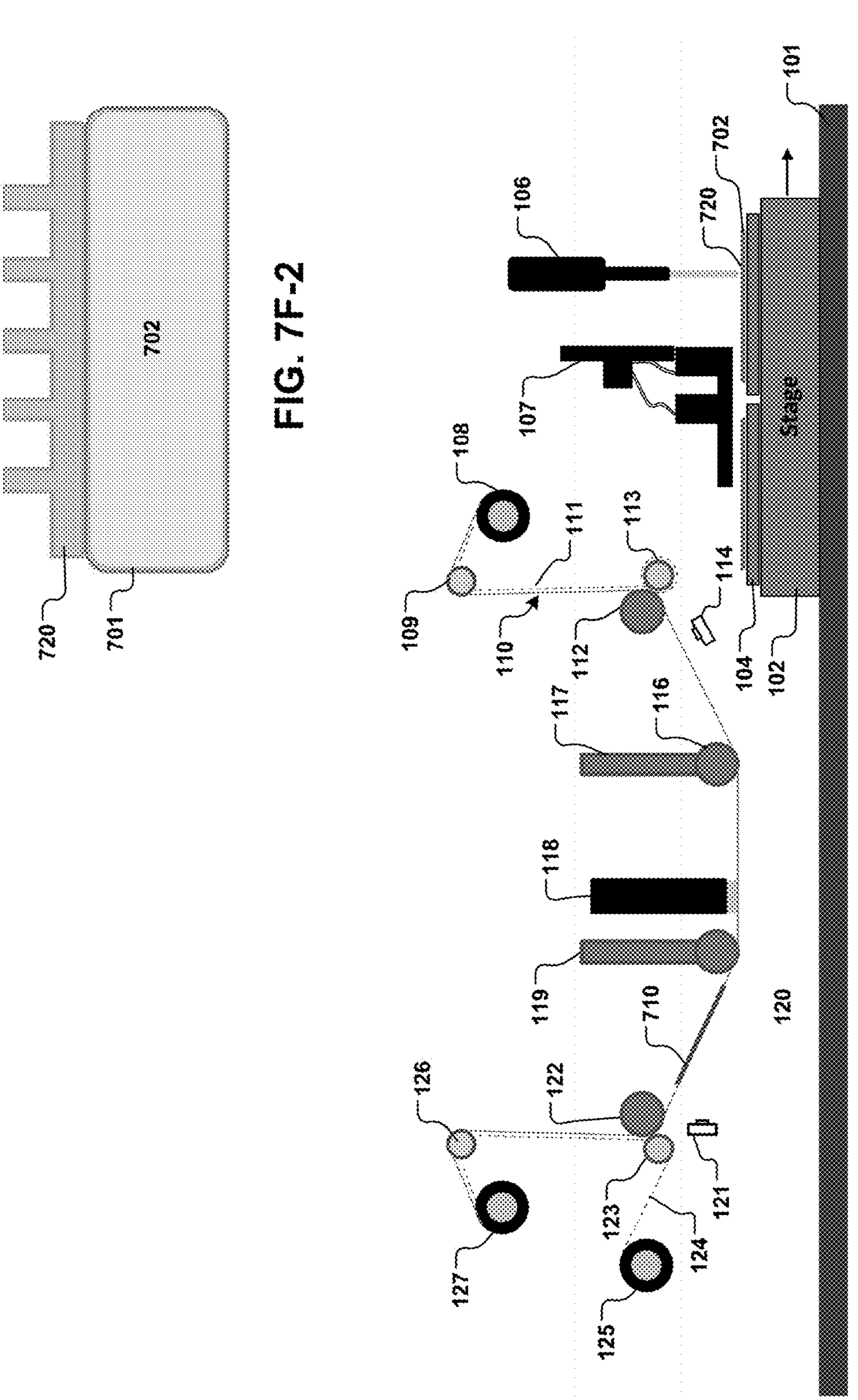

At 608, the stage 102 is moved backward and the substrates 702 is aligned for post-imprint registration using the downward looking inspection system 106, as illustrated in FIG. 7F. FIG. 7F-2 shows a schematic diagram of the substrate 702 with the resist imprint 720. The downward looking inspection system 106 can be positioned at known stage coordinates in the XYT stage coordinate system. There can be quiet zones on the chucks 104 spanning the substrate fiducial locations (e.g., with Si insertion to improve contrast). The downward looking inspection system 106 can be used to find a first side wafer offset $XY\theta_{Side1WaferOffset}$. The fiducial marks on the resist imprints 720 correspond to actual fiducial locations for the resist imprints 720. A difference between a designed fiducial location and the actual fiducial location can be considered to be the first side wafer offset $XY\theta_{Side1WaferOffset}$ (or a wafer registration offset). The first side wafer offset $XY\theta_{Side1WaferOffset}$ minus the loading offsets $XY\theta_{EFEMLoadBias}$ can provide a map from the imprint location (including the template registration) to the substrate registration location. This first side wafer offset can be used to compute the initial overlay/pattern placement offset $XY\theta_{OverlayBias}$ as follows:

$$XY\theta_{OverlayBias} = XY\theta_{Side1WaferOffset} - XY\theta_{EFEMLoadBias}. \quad (1)$$

At 610, the substrate 702 is moved from the chucks 104 and the stage 102 to the station of the WIS system. The substrate 702 can be positioned on the chuck of the WIS system and aligned for a first post inspection using the WIS system. The WIS system can be configured to measure the imprint to wafer image offsets $XY\theta_{PatternToWafer}$ and imprint to resist image offsets $XY\theta_{PatternToDrop}$ in the XYT stage coordinate system. These two offsets can be used to iteratively update the loading offset $XY\theta_{EFEMLoadBias}$ and the dispense offsets $XY\theta_{DispenseBias}$ when the stage 102 is adjusted for dispensing resist droplets on the substrate 702:

$$XY\theta_{DispenseBias} = XY\theta_{DispenseBias} + \alpha * XY\theta_{PatternToDrop}, \text{ and} \quad (2)$$

$$XY\theta_{EFEMLoadBias} = XY\theta_{EFEMLoadBias} + \beta * XY\theta_{PatternToWafer}, \quad (3)$$

where α and β are constants that can be updated based on at least one of applications, machine learning, or empirical data.

In some implementations, at 612, the above steps can be repeated for multiple substrates to get same imprints using the same templates. In some implementations, at 614, the substrates 702 with the first side imprint 720 can be unloaded and flipped for a second side imprint.

Figure 7G:
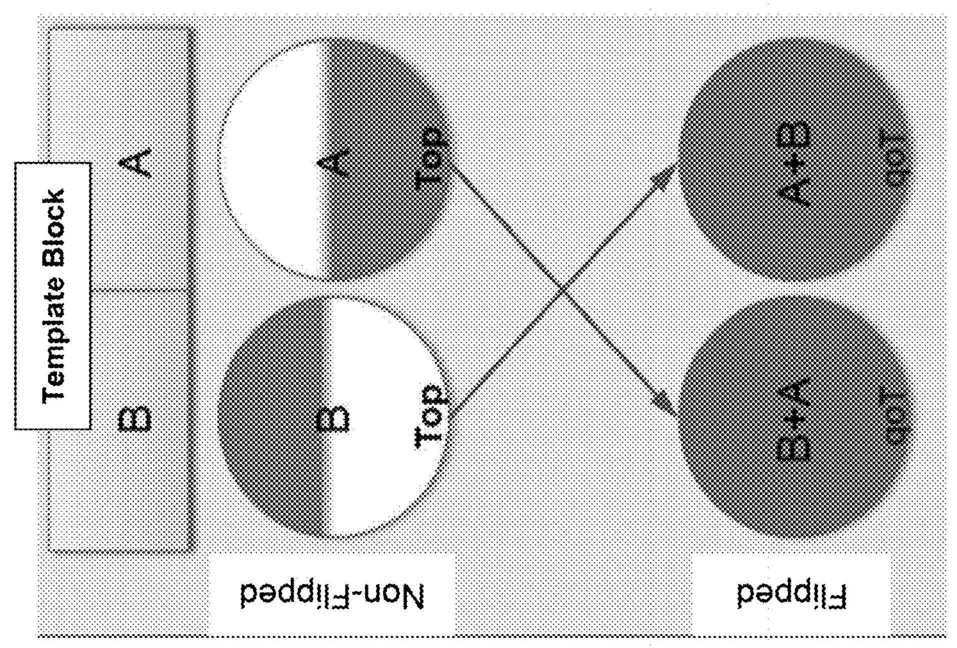

FIG. 7G shows an example of a flipping sequence for double-sided imprints. The template field 710 can include a template block having template A (e.g., an EPE of an eyepiece) and template B (e.g., an OPE of an eyepiece). When first and second substrates 702 are non-flipped and for a first side imprinting, templates A and B are respectively imprinted onto first sides of first and second substrates that are located on first and second chucks. For example, imprint A corresponding to template A is formed on the first side of a top half of the first substrate, and imprint B corresponding to template B is formed on the first side of a bottom half of the second substrate.

Then, the first substrate with imprint A is flipped over and positioned on the second chuck, and the second substrate with imprint B is flipped over and positioned on the first chuck, as illustrated in FIG. 7G. In a second side imprinting, the same templates A and B are respective imprinted onto second sides of the first substrate and the second substrate. That is, imprint A is formed on a top half of the second side of the second substrate that has imprint B formed on a bottom half of the first side, and imprint B is formed on a bottom half of the second side of the first substrate that has imprint A formed on a top half of the first side. As a result, as shown in FIG. 7G, imprints A and B are formed on opposite sides of each of the first substrate and the second substrate. The imprints A and B can be separated, offset, or overlapped when reviewed from one side.

Referring back to FIG. 6, the substrates 702 with the first side imprints 720 are flipped and loaded to the chucks 104 with the first side imprints 720 facing down using the loading system, e.g., the EFEM, and optionally a wafer flipping device.

As imprint to wafer image offsets $XY\theta_{PatternToWafer}$ for the second imprinting is constrained by the wafer registration of the faced down imprinted pattern and the side-to-side overlay offset $XY\theta_{OverlayBias}$, the loading offset $XY\theta_{EFEMLoadBias}$ is not updated for the second side. Thus, this update for the flipped substrate by the WIS system can be skipped in step 615.

At 616, the template field 710 is again registered for the second side imprinting by the upward looking inspection system, which can be the same as the registration in step 604.

At 618, the flipped substrate 702 is registered using flipped coordinates based on the imprint 720 by the download looking fine alignment inspection system 106, which can be the same as the registration in step 608. The registration occurs before the second side imprinting. The fiducial marks of the first side imprint 720 on the substrate 702 can be located at Si "quiet zones" on the chuck to improve contrast. The "quiet zones" are configured for this step such that the cameras in the inspection system 106 can look through the substrate, e.g., a transparent glass, and focus on the fiducial marks created by the (e.g., low contrast) imprinted resist pattern of the first imprinted side. Without the quiet zones, the fiducial marks may nominally be in contact with a polished chuck surface which may be noisy and causes difficulties with image processing. The result of the registration can be defined as second side wafer offset $XY\theta_{Side2WaferOffset}$.

Then, the substrates 702 are moved beneath the dispense head of the resist dispenser 107 by moving the stage 102, similar to what is illustrated in FIG. 7B. The stage 102 can be adjusted in the XYT stage coordinate system based on a sum of $XY\theta_{DispenseNominal}$, $XY\theta_{DispenseBias}$, $XY\theta_{Side2WaferOffset}$ and $XY\theta_{OverlayBias}$, where $XY\theta_{DispenseBias}$ represents a dispense offset that provides a correction for imprinted pattern to resist centering from a nominal dispense location, and $XY\theta_{DispenseNominal}$ represents a nominal dispense correction (e.g., from a coarse tool setup) for the specified pattern with which the resist is dispensed on the substrate. $XY\theta_{DispenseBias}$ can be measured and updated in a later step (624) using the WIS system. The loading offset $XY\theta_{EFEMLoadBias}$ is corrected on the first side, and the imprint is constrained by the overlay offset $XY\theta_{OverlayBias}$. Then, resist is dispensed on the second side of the substrate 702 according to a specified pattern for the second side, similar to what is illustrated in FIG. 7B-2.

The substrates 702 with resist are moved with the stage 102 to beneath the template field 710 using a flipped offset. The flipped offset can be a sum of $XY\theta_{ImprintNominal}$, $XY\theta_{Side2WaferOffset}$, $XY\theta_{CRToffset}$, and $XY\theta_{OverlayBias}$, where $XY\theta_{ImprintNominal}$ represents an imprint nominal correction that a control system of the stage 102 can provide for correcting an imprinting location.

At 620, the templates 712 are imprinted onto the resist on the second side of the substrates 702, similar to what are illustrated in FIGS. 7C and 7C-2. The resist is cured by the UV light, similar to what are illustrated in FIGS. 7D and 7D-2. Then, the templates 712 are separated from the formed imprint on the second side of the substrates 702, similar to what are illustrated in FIGS. 7E and 7E-2.

At 622, before unloading from the chucks 704, a double-sided overlay error corresponding to the first side to the second side imprint offset is measured using the downward looking inspection system 106 (e.g., with fine alignment), similar to what are illustrated in FIGS. 7F and 7F-2. The downward looking inspection system 106 is configured to look at fiducial marks of the first side imprint and the second side imprint at the same time and calculate an actual offset between the fiducial marks of the first side imprint and the second side imprint. If each template, e.g., template A or template B in FIG. 7G, has two fiducial marks, the downward looking inspection system 106 can include four cameras for two substrates with double-sided imprints, and each camera is configured to measure a pair of fiducial marks on the first and second side imprints of a substrate.

FIG. 8A shows example images (I), (II), (III), (IV) captured by the four cameras of overlay measurements (including filtering or thresholding by an image processing algorithm). Image (I) shows a first fiducial alignment mark (represented by circle and rectangle mark on the right) on the first side imprint and a first fiducial alignment mark (represented circle and rectangle mark on the left) on the second side imprint on the first substrate. Image (II) shows a second fiducial alignment mark on the first side imprint and a second fiducial alignment mark on the second side imprint on the first substrate. Image (III) shows a first fiducial alignment mark on the first side imprint and a first fiducial alignment mark on the second side imprint on the second substrate. Image (IV) shows a second fiducial alignment mark on the first side imprint and a second fiducial alignment mark on the second side imprint on the second substrate.

For the first substrate, a first actual offset is an offset between the first fiducial marks in image (I) and a second actual offset is an offset between the second fiducial marks in image (II). The actual offset for the first substrate can be an average of the first actual offset and the second actual offset. The first actual offset can be identical to the second actual offset. The actual offset can be in X direction, Y direction, or both. For the second substrate, a third actual offset is an offset between the first fiducial marks in image (III) and a four actual offset is an offset between the second fiducial marks in image (IV). The actual offset for the second substrate can be an average of the third actual offset and the fourth actual offset. The third actual offset can be identical to the fourth actual offset. The actual offset can be in X direction, Y direction, or both.

FIG. 8B shows example images of substrates with double-sided imprints with bad alignments and with good alignments. Fiducial marks on a first side of the substrate that are in contact with chucks are represented by marks with circle left to rectangle, and fiducial marks on a second side of the substrate that are above the substrate are represented by marks with circle right to rectangle. Image (V) shows a bad alignment (e.g., about 120 μm) for the double-sided imprints, where there is an offset between fiducial marks of the double-sided imprints along Y direction. Image (VI) shows a good alignment for the double-sided imprints, where an offset between fiducial marks of the double-sided imprints is substantially identical to zero along Y direction (e.g., based on the designed double sided mark to mark location).

Referring back to step 622 of FIG. 6, the downward looking inspection system 106 can compute a difference between the actual offset and a designed offset (or a predetermined threshold offset) as the double-sided overlay error $XY\theta_{OverlayError}$. The measured double-sided overlay error $XY\theta_{OverlayError}$ can be used to iteratively improve the overlay offset $XY\theta_{OverlayBias}$ as follows:

$$XY\theta_{OverlayBias} = XY\theta_{OverlayBias} + \mu * XY\theta_{OverlayError}, \tag{4}$$

where μ is a constant that can be determined (or updated) by at least one of applications, empirical data, or machine learning.

At 624, the substrates with double-sided imprints are unloaded from the stage 102 and positioned on the station of the WIS system and aligned for the second post inspection using the WIS system, similar to step 610. The WIS system can be configured to measure the imprint to resist image offsets $XY\theta_{PatternToDrop}$ for the second side in the XYT stage coordinate system. The offsets can be used to iteratively update the dispense offsets $XY\theta_{DispenseBias}$:

$$XY\theta_{DispenseBias} = XY\theta_{DispenseBias} + \alpha * XY\theta_{PatternToDrop}, \tag{5}$$

where α is a constant that can be updated based on applications, machine learning, or empirical data. The constant α in equation (5) for the second side can be the same $\alpha$ in equation (2) for the first side. Different from that in the first side, the loading offset $XY\theta_{EFEMLoadBias}$ is not updated for the second side because the imprint to substrate offset is constrained by the overlay offset.

As more substrates are processed, the repeatability of the imprinting tool can be improved by automatically or machine learning and updating appropriate parameters to thereby minimizing or eliminating alignment offsets for imprints on both sides of the substrates.

Figure 9A:
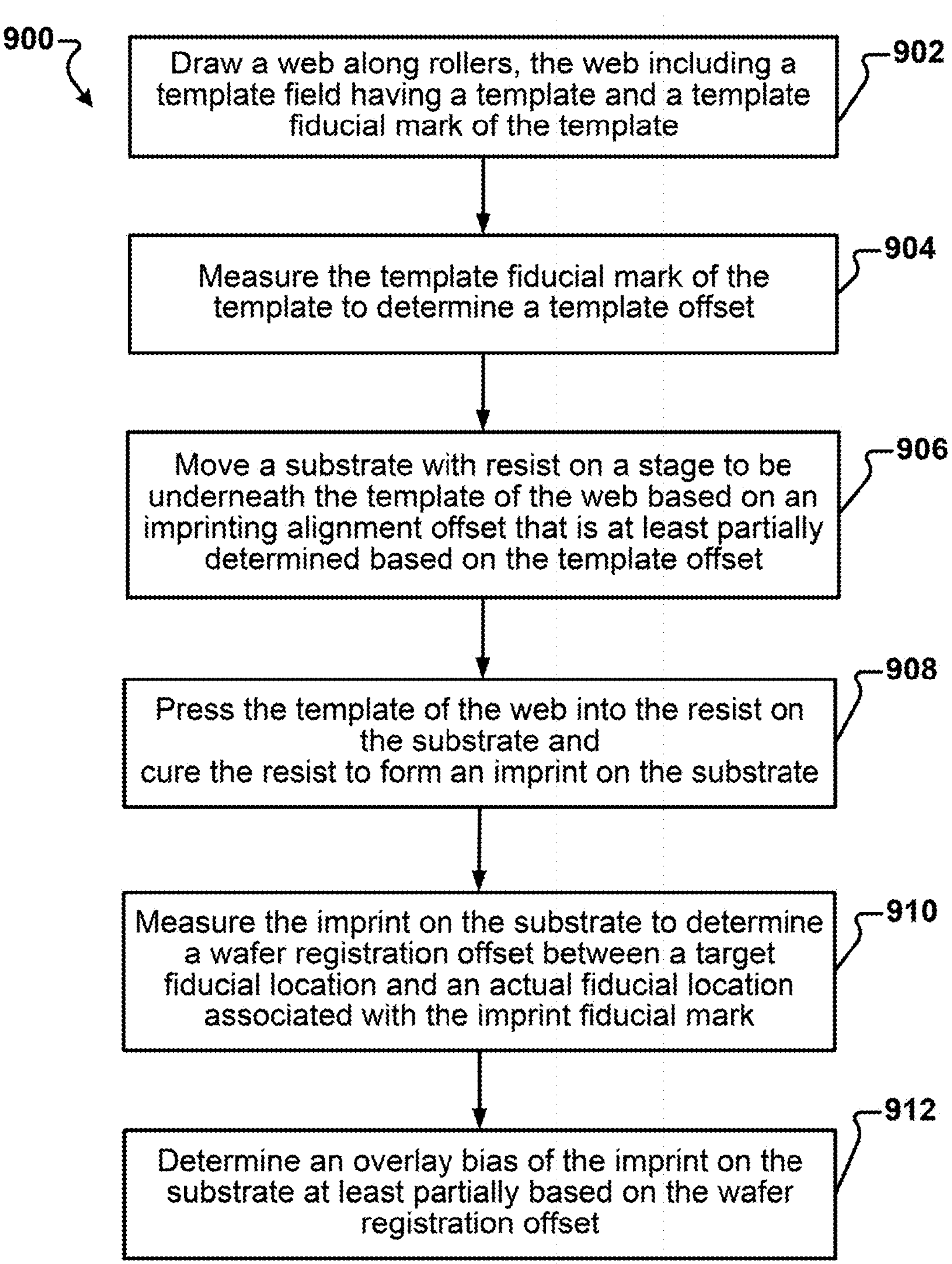
FIG. 9A is a flow diagram of an example process of fabricating imprints on a substrate with alignments, according to one or more implementations of the present disclosure.

FIG. 9A is a flow diagram of an example process 900 of fabricating imprints on a substrate with alignments, according to one or more implementations of the present disclosure. The process 900 can be performed by an imprinting tool describe above, e.g., the imprinting tool 100 of FIG. 1 with an overlay alignment system including an upward looking inspection system 440 of FIG. 4A and a downward looking inspection system 460 of FIG. 4B.

At 902, a template roll is drawn along rollers. The template roll includes a template field having a template with a template fiducial mark. The template can include an imprinting feature, e.g., a grating feature. The template roll can be the template roll 110 of FIG. 1, the template roll 300 of FIG. 3A, the template roll 350 of FIG. 3B, or the template roll 402 of FIGS. 4A-4B. The template field can be the template field 310 of FIG. 3A, the template field 360 of FIG. 3B, the template field 420 of FIGS. 4A-4B, or the template field 710 of FIGS. 7A-7F. The template can be the template 312 of FIG. 3A, the template 372 of FIG. 3B, the template 422 of FIGS. 4A-4B, or the template 712 of FIGS. 7C-7E. The template field can include a template block that includes one or more templates. The block can be the template block 370 of FIG. 3B, or the template block of FIG. 7G.

The rollers can include a supply roller, e.g., the supply roller 108 of FIGS. 1 and 7A-7F, a take-up roller, e.g., the take-up roller 127 of FIGS. 1 and 7A-7F, an imprint roller, e.g., the imprint roller 116 of FIGS. 1 and 7A-7F, a separation roller, e.g., the separation roller 120 of FIGS. 1 and 7A-7F. The template roll can be drawn at a steady speed.

At 904, the template fiducial mark of the template is measured to determine a template offset. The imprinting tool can include an upward looking inspection system, e.g., the upward looking inspection system 440 of FIGS. 4A-4B. The upward looking inspection system can capture an image of the template fiducial mark and determine the template offset based on the captured image.

In some implementations, a wafer inspection system (WIS) performs a pre-inspection on the substrate. The substrate can be positioned on a station of the WIS system and aligned for pre-inspection using the WIS system. The WIS system is configured to detect large defects or things that may interfere with patterning or processing. The WIS system can capture images of the whole wafer. The images captured by the WIS system can have a pixel size larger than images captured by the overlay alignment system.

In some implementations, a substrate is loaded on a stage. The substrate can be the substrate 105 of FIG. 1, the substrate 200 of FIG. 2, the substrate 430 of FIGS. 4A-4B, or the substrate 702 of FIGS. 7A-7F. The stage can be the stage 102 of FIGS. 1 and 7A-7F, or the stage 404 of FIGS. 4A-4B. The stage can be an XYT air-bearing stage, where X represents the X direction, Y direction, and a theta direction. The stage can be moved, e.g., along the X direction, by a moving system. The imprinting tool can include a controller configured to control the moving system to move the stage or adjust a position of the stage. A coordinate system, e.g., an XYT coordinate system, can be set up based on the stage.

The upward looking inspection system can be positioned on the stage and have known positions in the coordinate system. The upward looking inspection system can be configured to register (or locate) the template fiducial mark in the coordinate system to determine the template offset. The template offset can provide a map from the template field to the stage or the chuck. In some examples, the template field includes a plurality of fiducial marks for one or more templates. The upward looking inspection system can include a plurality of cameras, and each of the plurality of cameras can be configured to capture an image including a different corresponding fiducial mark of the plurality of fiducial marks for the one or more templates.

The substrate can be loaded on the stage by a loading system, e.g., an equipment front end module (EFEM). The substrate can be held on the stage via a chuck, e.g., a vacuum chuck. The chuck can include a measurement area that has a better image contrast than other areas of the chuck, and the substrate can be held on the chuck with fiducial marks of an imprint on the substrate within the measurement area. The measurement area can be inserted with silicon material to improve the image contrast. The measurement area can have a size, e.g., 4 mm by 4 mm.

In some implementations, the substrate on the stage is moved to be below (e.g., under or underneath) a resist dispenser according to a dispensing alignment offset. The imprinting tool can include the resist dispenser. The dispensing alignment offset can be determined, e.g., by the controller, at least partially based on a loading offset. The loading offset for a current substrate can be determined by machine learning based on previous WIS post-imprinting measurements (e.g., in a later step 610), which can include contributions from previous substrates.

The dispensing alignment offset can be also at least partially determined based on a dispense offset that can provide a correction for imprint to resist centering from a nominal dispense location. The dispensing alignment offset can be also at least partially determined based on a dispense nominal correction. In some examples, the dispensing alignment offset is determined to be a sum of the loading offset, the dispense offset, and the dispense nominal correction. The resist dispenser can dispense resist, e.g., resist droplets, on a surface on a side of the substrate, e.g., according to a specified pattern.

At 906, the substrate with the resist on the side of the substrate is moved to be below (e.g., under or underneath) the template of the template roll based on an imprinting alignment offset. The imprinting alignment offset can be at least partially determined, e.g., by the controller, based on at least one of the template offset or the loading offset. In some cases, the imprinting alignment offset is at least partially determined based on an imprint nominal correction. The imprinting alignment offset can be determined to be a sum of the template offset, the loading offset, and the imprint nominal correction. The controller can control a moving speed of the stage holding the substrate relative to a drawing speed of the template roll such that the template of the template roll is aligned with the substrate based on the imprinting alignment offset.

At 908, the template is pressed into the resist on the substrate and the resist is cured to form an imprint on the substrate. The template can be pressed into the resist by the imprint roller, e.g., as illustrated in FIGS. 7C and 7C-2. The imprinting tool can include a light source, e.g., a UV light source, that can illuminate UV light to cure the resist on the substrate. The imprint can have an imprinted feature corresponding to that of the template and an imprint fiducial mark corresponding to the template fiducial mark of the template.

At 910, the imprint on the substrate is measured to determine a wafer registration offset between a target fiducial location and an actual fiducial location associated with the imprint fiducial mark. The imprinting tool can include a downward looking inspection system that can register a location of the imprint on the substrate in (or with respect to) the coordinate system. The downward looking inspection system can have known positions in the coordinate system and can register or locate the imprint fiducial mark of the imprint that corresponds to the actual fiducial location. The substrate with the imprint can be held in the measurement area of the chuck for the measurement.

The stage can be configured to hold one or more substrates. The downward looking inspection system can include a plurality of cameras, each of the plurality of cameras being configured to capture an image including a different corresponding fiducial mark of one or more imprints on the substrates.

At 912, an overlay bias of the imprint on the substrate is determined at least partially based on the wafer registration offset, e.g., by the controller. The overlay bias can be determined based on the loading offset. In some examples, the overlay bias is determined to be the wafer registration offset minus the loading offset.

In some implementations, the substrate with the imprint is unloaded from the stage and positioned on a station of the WIS system and aligned for a post-imprinting inspection. An image of the substrate with the imprint is measured, e.g., by the WIS system, to determine at least one of an imprint to substrate image offset or an imprint to resist image offset. The controller can update the dispensing alignment offset based on the at least one of the imprint to substrate image offset or the imprint to resist image offset. The imprinting tool can iteratively imprint a second substrate with the template of the template roll using the updated dispensing alignment offset.

In some examples, the loading offset is updated based on the imprint to substrate image offset, and the dispensing alignment offset is updated based on the updated loading offset. The updated loading offset can be determined to be identical to a sum of a result of multiplying the imprint to substrate image offset by a first constant and the current load offset, and the first constant can be determined by at least one of an application, machine learning, or empirical data.

In some examples, the dispense offset is updated based on the imprint to resist image offset, and the dispensing alignment offset is updated based on the updated dispense offset. The updated dispense offset can be identical to a sum of a result of multiplying the imprint to resist image offset by a second constant and the current dispensing offset. The second constant is determined by at least one of an application, machine learning, or empirical data.

In some implementations, before imprinting the template field on the resist on the substrate, the imprinting tool can perform at least one simulated imprinting sequence with the template field on the template roll being moved without contact with the resist on the substrate. Then at least one simulated imprinting sequence can be performed to reduce the variance of the pattern placement on the wafer due to web instability.

In some implementations, the above process 900 can be repeated for multiple substrates to get same imprints using the same templates. In some implementations, after step 912, the substrates with the imprint on a first side of the substrate can be unloaded and flipped for imprinting a second side of the substrate.

Figure 9B:
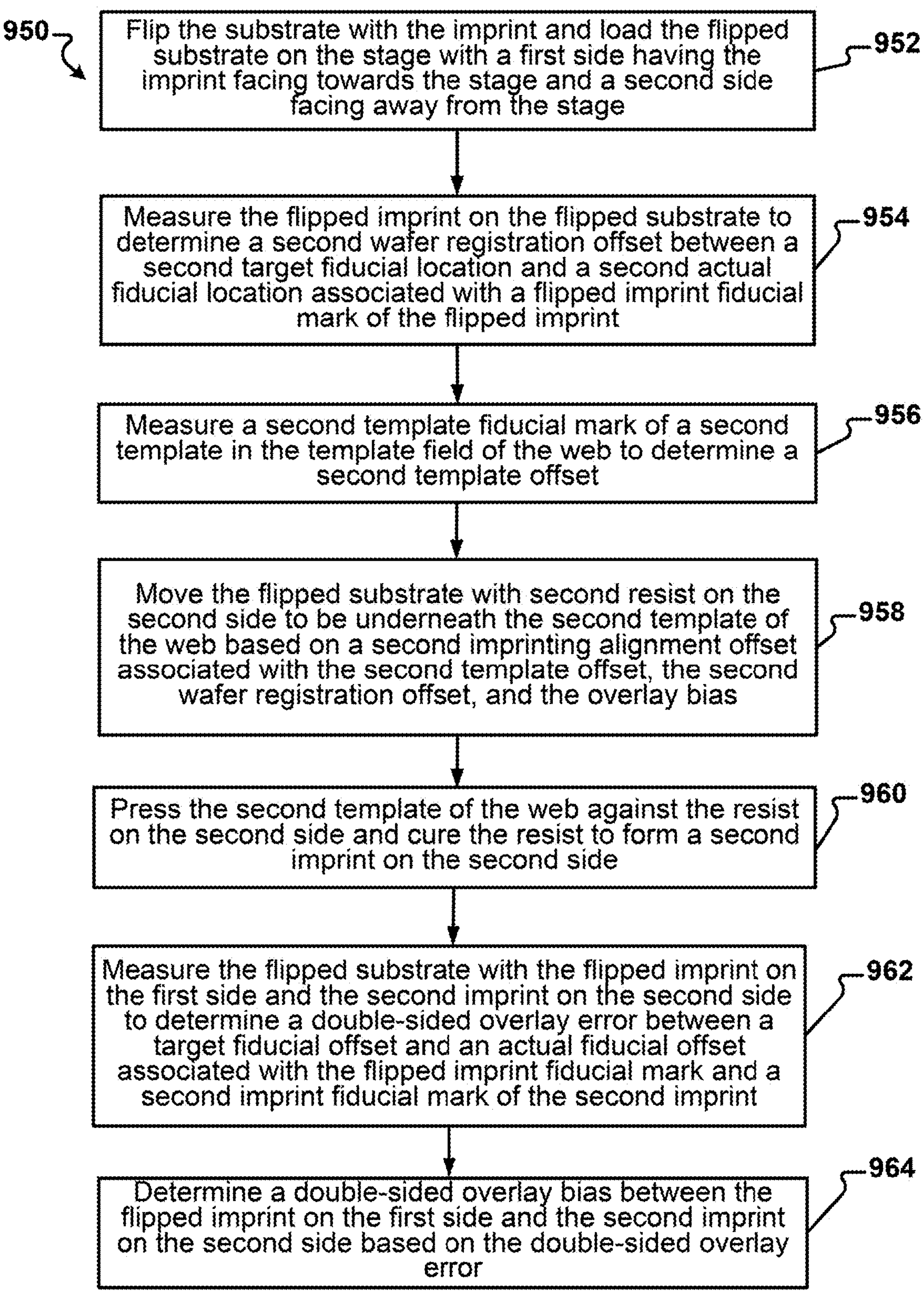
FIG. 9B is a flow diagram of another example process of fabricating imprints on a substrate with alignments, according to one or more implementations of the present disclosure.

FIG. 9B is a flow diagram of another example process 950 of fabricating imprints on a substrate with alignments, according to one or more implementations of the present disclosure. The process 950 can be used to fabricate a second imprint on the second side of the substrate. The process 950 can be also performed, e.g., after the process 900 of FIG. 9A, by the imprinting tool of FIG. 9A.

At 952, the substrate with the imprint is flipped and the flipped substrate is loaded on the stage with the first side having the imprint facing towards the stage and the second side facing away from the stage. The previously imprinted fiducials are located faced down on quiet zones. In some implementations, the imprinting tool includes a flipping device to flip the substrate.

At 954, the flipped substrate with the flipped imprint is measured to determine the wafer registration offsets between a previously imprinted fiducial location (faced down in the quiet zone) and the designed target fiducial location. The downward looking inspection system can register the flipped imprint on the flipped substrate in the coordinate system (through the substrate) to locate a flipped imprint fiducial mark of the flipped imprint that can correspond to the second actual fiducial location. The flipped substrate can be held on the stage via the chuck with the flipped imprint fiducial mark of the flipped imprint within the measurement area of the chuck (e.g., a quiet zone) to improve image contrast.

At 956, a second template fiducial mark of a second template in the template field of the template roll is measured to determine a second template offset. The upward looking inspection system can register the second template of the template roll in the coordinate system to locate the second template fiducial mark, similar to step 910 of FIG. 9A.

In some implementations, the flipped substrate on the stage is moved, e.g., by the moving system, to be below (e.g., under or underneath) the resist dispenser according to a second dispensing alignment offset. The resist dispenser can dispense second resist on the second side of the substrate, e.g., according to a specified pattern. The second dispensing alignment offset can be determined, e.g., by the controller, at least partially based on the overlay bias and the second wafer registration offset. The second dispensing alignment offset can be at least partially determined based on a second dispense offset that provides a correction for imprint to resist centering from a second nominal dispense location. The second dispensing alignment offset can be also at least partially determined based on a second dispense nominal correction. In some cases, the second dispensing alignment offset is a sum of the overlay bias, the second wafer registration offset, the second dispense offset, and the second dispense nominal correction.

At 958, the flipped substrate with the second resist on the second side is moved to be below (e.g., under or underneath) the second template in the template field of the template roll based on a second imprinting alignment offset. The second imprinting alignment offset can be determined, e.g., by the controller, based on the second template offset, the second wafer registration offset, and the overlay bias. The second imprinting alignment offset can be at least partially determined based on a second imprint nominal correction. In some cases, the second imprinting alignment offset is a sum of the second template offset, the second wafer registration offset, the overlay bias, and the second imprint nominal correction.

At 960, the second template of the template roll is pressed, e.g., by the imprint roller, into the second resist on the second side of the substrate, and the second resist is cured, e.g., by the light source, to form a second imprint on the second side. The second imprint can have a second imprinted feature corresponding to the second template and a second imprint fiducial mark corresponding to the second template fiducial mark of the second template.

At 962, the flipped substrate with the flipped imprint on the first side and the second imprint on the second side is measured to determine a double-sided overlay error between a target fiducial offset and an actual fiducial offset. The double-sided overlay error, i.e., the first to second side pattern error in the XYT coordination system can be measured by looking at the fiducial marks of the first and second side imprints at the same time through the substrate. The actual fiducial offset is a relative measurement between the flipped imprint fiducial mark of the imprint and the second imprint fiducial mark of the second imprint. The downward looking inspection system can register the flipped substrate with the flipped imprint and the second imprint on the coordinate system to locate the flipped imprint fiducial mark and the second imprint fiducial mark of the second imprint, as illustrated in FIG. 8A. The flipped imprint fiducial mark and the second imprint fiducial mark can be in the measurement area (e.g., a quiet zone) of the chuck. The target fiducial offset can be set along X direction, Y direction, or both.

At 964, a double-sided overlay bias between the flipped imprint on the first side and the second imprint on the second side is determined, e.g., by the controller, based on the double-sided overlay error. The double-sided overlay bias can be determined to be identical to a sum of a result of multiplying the double-sided overlay error by a constant and a previous double-sided overlay bias. The constant can be determined by at least one of an application, machine learning, or empirical data.

In some implementations, the imprinting tool can update the overlay bias to be the double-sided overlay bias, e.g., in the process 950, and iteratively imprint a second substrate using the second template of the template roll based on the updated overlay bias.

In some implementations, the WIS system can perform post-inspection and measure an image of the flipped substrate with the flipped imprint and the second imprint to determine a second imprint to resist image offset. The second dispensing alignment offset can be updated based on the second imprint to resist image offset. In some cases, the second dispense offset is updated based on the second imprint to resist image offset, and the second dispensing alignment offset is updated based on the updated second dispense offset. The updated second dispense offset can be identical to a sum of a result of multiplying the second imprint to resist image offset by a constant and the current second dispense offset. The constant can be determined by at least one of an application, machine learning, or empirical data. The imprinting tool can iteratively imprint a second substrate using the second template of the template roll based on the updated second dispensing alignment offset.

In some implementations, the stage holds a first substrate via a first chuck and a second substrate via a second chuck, the substrate being the first substrate. The template field of the template roll can include a first template and the second template. The imprinting tool can align the first substrate with the first template and the second substrate with the second template based on the imprinting alignment offset, and form the first imprint on the first side of the first substrate and the second imprint on a first side of the second substrate. The imprinting tool can further be configured to: flip the first substrate and load the flipped first substrate on the second chuck, and flip the second substrate and load the flipped second substrate on the first chuck, as illustrated in FIG. 7G. The imprinting tool can further be configured to: align the flipped second substrate with the first template and the flipped first substrate with the second template based on the second imprinting alignment offset, and form the first imprint on a second side of the second substrate and the second imprint on the second side of the first substrate.

Exemplary Optical Systems

Figure 10A:
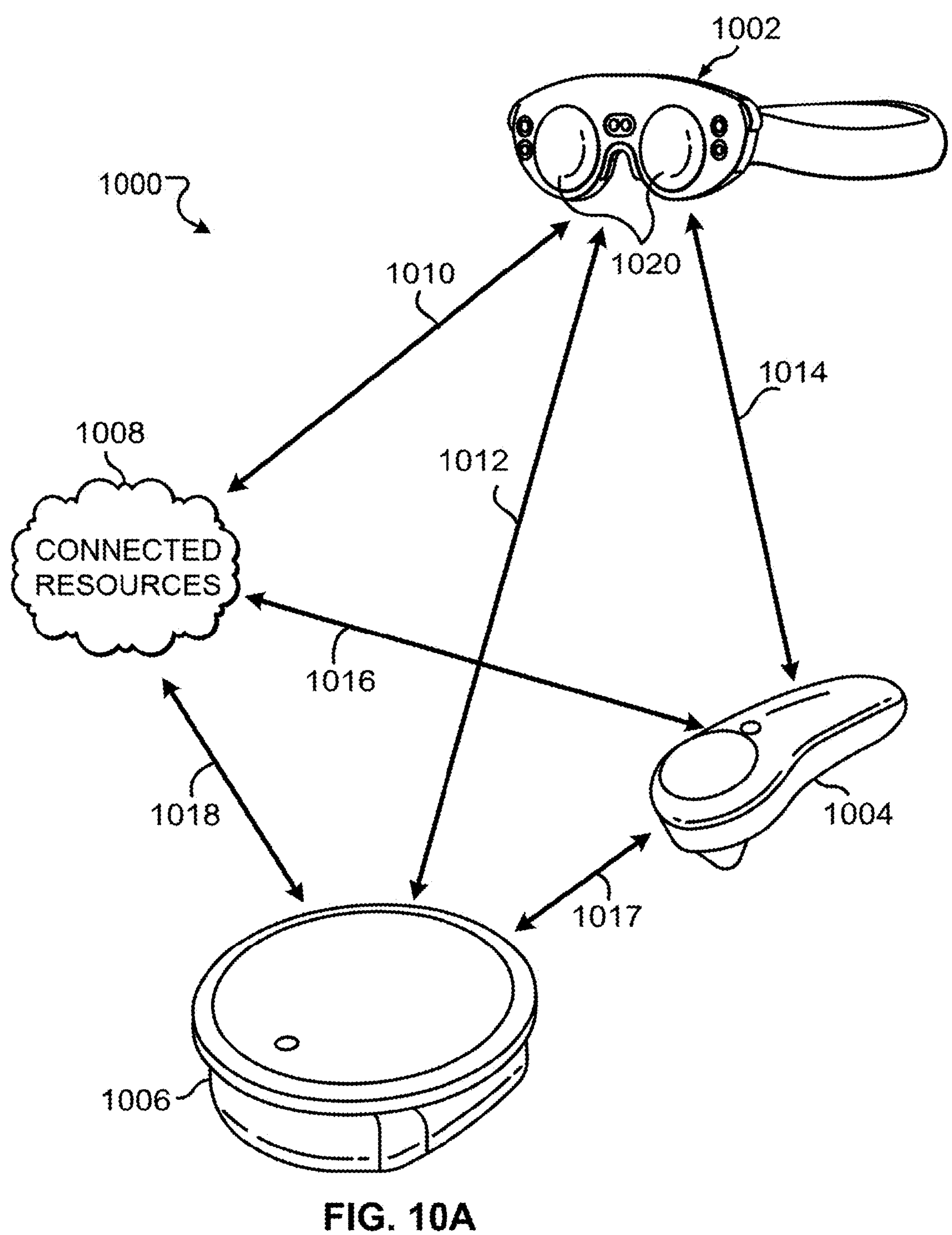
FIG. 10A is a schematic diagram of an example augmented reality system, according to one or more implementations of the present disclosure.

FIG. 10A is a schematic diagram of an example optical system 1000. The optical system 1000 can be an augmented reality system featuring a head-worn viewing component 1002, a hand-held controller component 1004, and an optional interconnected auxiliary computing or controller component 1006 which may be configured to be worn as a belt pack or the like on a user. Each of the components 1002, 1004, 1006 may be operatively coupled via connections 1010, 1012, 1014, 1016, 1017, 1018 to communicate with each other and to other connected resources 1008, such as cloud computing or cloud storage resources, via wired or wireless communication configurations, such as those specified by IEEE 802.11, Bluetooth®, and other connectivity standards and configurations. In various embodiments, the depicted optical elements 1020 may operate to enable the user wearing the viewing component 1002 to view the world around the user along with visual components which may be produced by the associated system components, for an augmented reality experience. Such systems and experiences have been described in U.S. patent application Ser. Nos. 14/555,585, 14/690,401, 14/331,218, 14/726,424, and 15/481,255, each of which is incorporated by reference in its entirety.

Figure 10B:
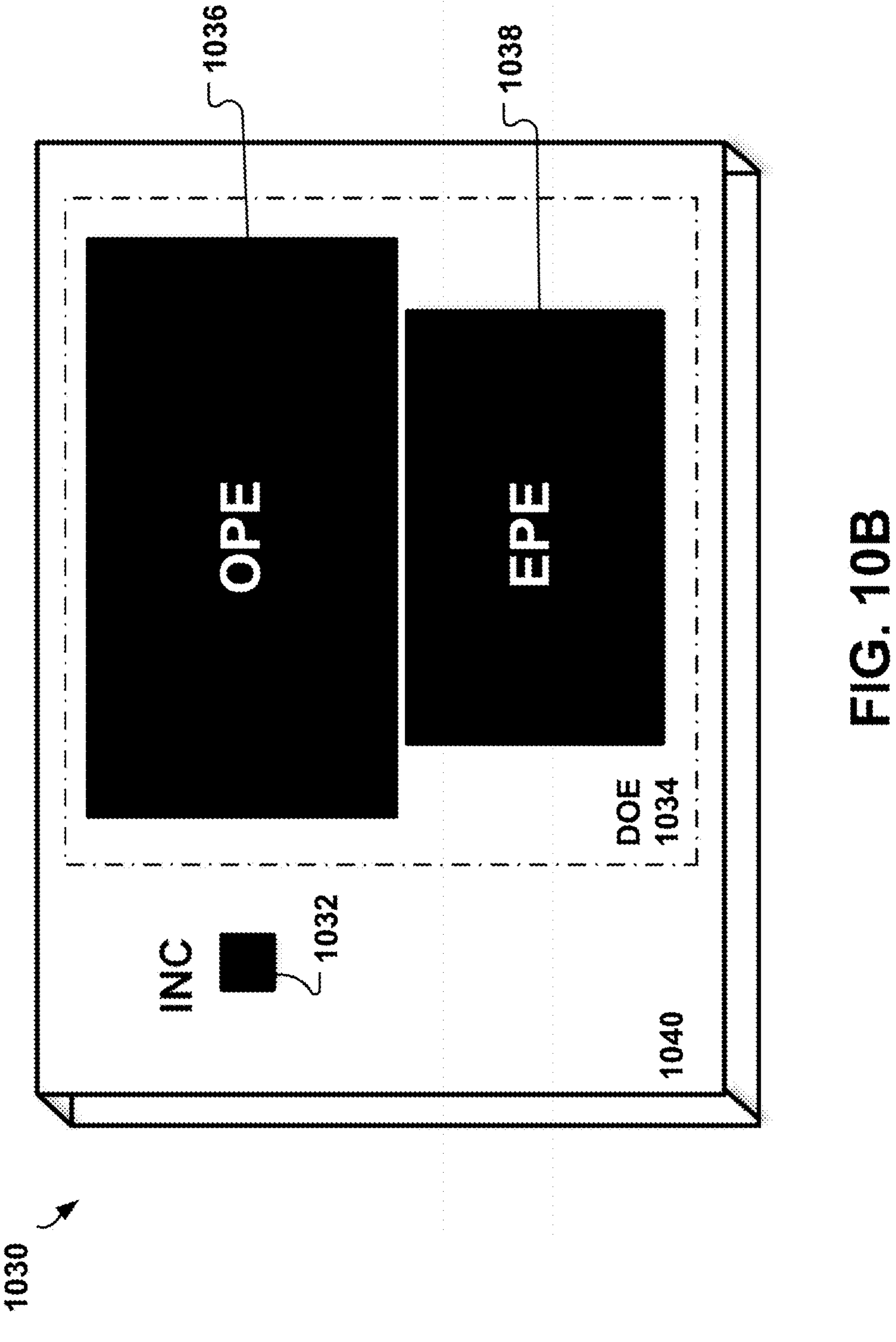
FIG. 10B is a schematic diagram of an example optical component that can be used in the augmented reality system of FIG. 10A, according to one or more implementations of the present disclosure.

FIG. 10B is a schematic diagram of an example of an optical component 1030, according to one or more implementations of the present disclosure. The optical component 1030 can be used for virtual and augmented reality applications. In some implementations, the optical component 1030 can be included in the optical elements 1020 of FIG. 10A.

The optical component 1030 can be an eyepiece that can include an in-coupling optic (ICO) element 1032 and a diffractive optical element (DOE) 1034. The ICO 1032 and DOE 1034 can be implemented in a substrate 1040. The substrate 1040 can be transparent, e.g., glass. The DOE 1034 can have one or more layers, and each layer can include an orthogonal pupil expansion (OPE) diffractive element 1036 and an exit pupil expansion (EPE) diffractive element 1038. The ICO element 1032 is configured to receive input light beams, e.g., from a projector, and transmit the input light beams to the DOE 1034 in the substrate 1040. For example, the substrate 1040 includes a waveguide (not shown here), and the ICO element 1032 transmits the input light beams into the waveguide that is coupled to the DOE 1034. The input light beams travels in the waveguide by total internal reflection (TIR). The OPE diffractive element 1036 on a layer is configured to deflect some of the input light beams to the EPE diffractive element 1038 that is configured to in turn deflect some of the deflected light beams out of the substrate 1040, e.g., toward a user's eye(s).

The OPE diffractive element 1036 and the EPE diffractive element 1038 can be arranged in co-planar or side-by-side on the same layer. In some cases, the OPE diffractive element and the EPE diffractive element can be fabricated on opposite sides of a waveguide substrate. In some cases, the OPE diffractive element and the EPE diffractive element can be fabricated on one side of a waveguide substrate and other components can be fabricated on the other side of the waveguide substrate.

Figure 10C:
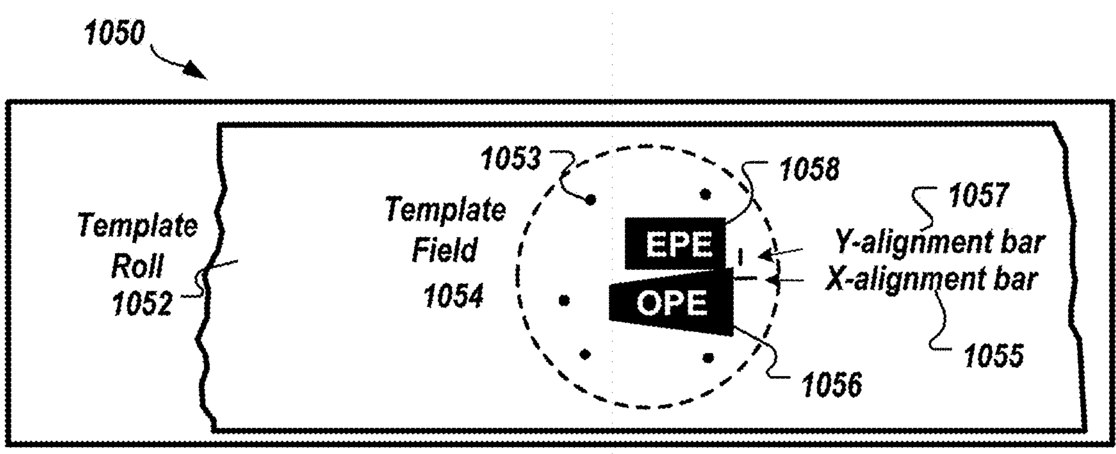
FIG. 10C shows an image of templates for fabricating an optical element that can be used in the optical component of FIG. 10B, according to one or more implementations of the present disclosure.

FIG. 10C shows an image 1050 of templates for fabricating an optical element, according to one or more implementations of the present disclosure. The optical element can be the DOE 1034 of FIG. 10B.

A template roll 1052 can include a coated resist template (template) field 1054. In some implementations, the template field 1054 can include double tracks of templates, e.g., the double tracks 252, 254 of templates of FIG. 2B. An OPE template 1056 for imprinting an orthogonal pupil expansion (OPE) diffractive element, e.g., the OPE 1036 of FIG. 10B, can be on a first track of the template field 1054, e.g., track 252 of FIG. 2B. An EPE template 1058 for imprinting an exit pupil expansion (EPE) diffractive element, e.g., the EPE 1038 of FIG. 10B can be on a second track of the template field 1054, e.g., track 254 of FIG. 2B. The OPE template 1056 and the EPE template 1058 can be in a same block, e.g., the block 260 of FIG. 2B. In some implementations, the CRE field 1054 can include a single track of templates including both the OPE template 1056 and the EPE template 1058. The template field 1054 can include one or more registration marks 1053, and one or more alignment bars, e.g., X-alignment bar 1055 for alignment along X direction, Y-alignment bar 1057 for alignment along Y direction.

Figure 10D:
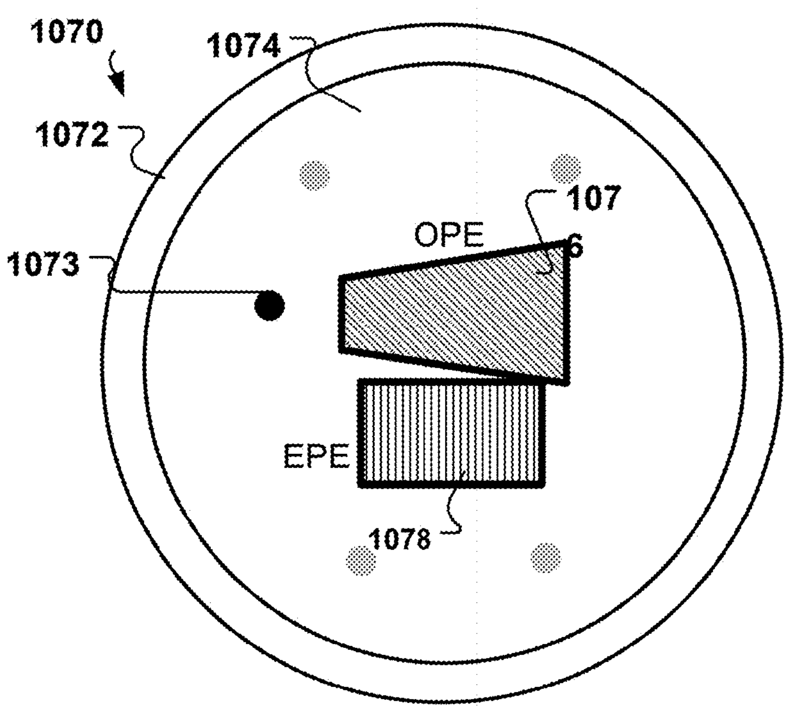
FIG. 10D shows an image of a fabricated optical element that can be fabricated using the templates of FIG. 10C, according to one or more implementations of the present disclosure.

FIG. 10D shows an image of a fabricated optical element 1070 using the templates of FIG. 10C, according to one or more implementations of the present disclosure. The fabricated optical element 1070 can be used as the DOE 1034 of FIG. 10B.

The fabricated optical element 1070 can be fabricated on a substrate 1072, e.g., the substrate 200 of FIG. 2, 430 of FIG. 4A, or 702 of FIG. 7A, using OPE and EPE templates on a template roll and a resist 1074 by an imprinting tool, e.g., the imprinting tool 100 of FIG. 1. The OPE and EPE templates can be the respective templates OPE 1056 and EPE 1058 in the template field 1054 of the template roll 1052 of FIG. 10C. The imprinting tool can include one or more inspection systems, e.g., the upward looking inspection system 440 of FIG. 4A, the downward looking inspection system 460 of FIG. 4B, or both. The optical element 1070 can include an OPE imprint 1076 corresponding to the OPE template and an EPE imprint 1078 corresponding to the EPE template. The optical element 1070 can also include fiducial marks 1073 corresponding to fiducial marks around the templates on the template roll, e.g., the fiducial marks 1053 of FIG. 10C.

In some implementations, the OPE imprint 1076 and the EPE imprint 1078 are on the same side of the substrate 1072. The OPE imprint 1076 and the EPE imprint 1078 can be fabricated using a single track of templates including both the OPE and EPE templates by the imprinting tool according to an imprinting sequence, e.g., the imprinting sequence 602 to 610 of FIG. 6 or the imprinting sequence as illustrated in FIGS. 7A-7F. In some implementations, the OPE imprint 1076 and the EPE imprint 1078 are on opposite sides of the substrate 1072. The OPE imprint 1076 and the EPE imprint 1078 can be fabricated using double tracks of templates including both the OPE and EPE templates by the imprinting tool according to an imprinting sequence or process, e.g., the imprinting process 600 of FIG. 6, the imprinting sequence as illustrated in FIGS. 7A-7G, or the process 900 of FIG. 9A and the process 950 of FIG. 9B.

In some implementations, at least one of the OPE template or the EPE template can be configured such that at least one of the OPE imprint 1076 or the EPE imprint 1078 can diffract out a specified color, e.g., red, blue, or green, when illuminated by light, e.g., a white light. In some examples, the OPE imprint 1076 can diffract out a red color, and the EPE imprint 1078 can diffract out a green color.

OTHER EMBODIMENTS

Other embodiments described in this disclosure include the following.

Embodiment 1 is a imprinting method comprising:

- drawing a template roll along rollers, the template roll comprising a template field having a template and a template fiducial mark of the template;
- measuring the template fiducial mark of the template to determine a template offset;
- moving the substrate on a stage to be below a resist dispenser according to a dispensing alignment offset that is at least partially determined based on a loading offset;
- dispensing resist on a first side of the substrate using the resist dispenser;
- moving the substrate with the resist on the stage to be below the template of the template roll based on an imprinting alignment offset, the imprinting alignment offset being at least partially determined based on the template offset and the loading offset;
- pressing the template of the template roll into the resist on the substrate; and
- curing the resist to form an imprint on the substrate, the imprint having an imprinted feature corresponding to the template and an imprint fiducial mark corresponding to the template fiducial mark of the template.

Embodiment 2 is the imprinting method of embodiment 1, wherein the imprinting alignment offset is at least partially determined based on an imprint nominal correction, and

- wherein the imprinting alignment offset is a sum of the template offset, the loading offset, and the imprint nominal correction.

Embodiment 3 is the imprinting method of embodiment 1 or 2, wherein the dispensing alignment offset is at least partially determined based on a dispense offset that provides a correction for imprint to resist centering from a nominal dispense location.

Embodiment 4 is the imprinting method of embodiment 3, wherein the dispensing alignment offset is at least partially determined based on a dispense nominal correction, and

- wherein the dispensing alignment offset is a sum of the loading offset, the dispense offset, and the dispense nominal correction.

Embodiment 5 is the imprinting method of embodiment 3 or 4, further comprising:

- measuring an image of the substrate with the imprint to determine at least one of an imprint to substrate image offset or an imprint to resist image offset.

Embodiment 6 is the imprinting method of embodiment 5, further comprising:

- updating the dispensing alignment offset based on the at least one of the imprint to substrate image offset or the imprint to resist image offset; and
- iteratively imprinting a second substrate with the template of the template roll using the updated dispensing alignment offset.

Embodiment 7 is the imprinting method of embodiment 6, further comprising at least one of:

updating the loading offset based on the imprint to substrate image offset, wherein the dispensing alignment offset is updated based on the updated loading offset, or updating the dispense offset based on the imprint to resist image offset, wherein the dispensing alignment offset is updated based on the updated dispense offset.

Embodiment 8 is the imprinting method of embodiment 7, wherein the updated loading offset is identical to a sum of a result of multiplying the imprint to substrate image offset by a first constant and the load offset, and wherein the updated dispense offset is identical to a sum of a result of multiplying the imprint to resist image offset by a second constant and the dispense offset.

Embodiment 9 is the imprinting method of any of embodiments 1 to 8, further comprising:

measuring the imprint fiducial mark of the imprint to determine a wafer registration offset between a target fiducial location and an actual fiducial location associated with the imprint fiducial mark; and determining an overlay bias of the imprint on the first side of the substrate at least partially based on the wafer registration offset.

Embodiment 10 is the imprinting method of embodiment 9, wherein determining an overlay bias of the imprint on the substrate comprises:

determining the overlay bias to be the wafer registration offset minus the loading offset.

Embodiment 11 is the imprinting method of embodiment 9 or 10, further comprising:

before imprinting the template field on the resist on the substrate, performing at least one simulated imprinting sequence with the template field on the template roll being moved without contact with the resist on the substrate.

Embodiment 12 is the imprinting method of any of embodiments 9 to 11, further comprising:

flipping the substrate with the imprint and loading the flipped substrate on the stage with the first side facing towards the stage and a second side facing away from the stage, the second side being opposite to the first side;

measuring a flipped imprint fiducial mark of the flipped imprint to determine a second wafer registration offset between a second target fiducial location and a second actual fiducial location associated with the flipped imprint fiducial mark;

measuring a second template fiducial mark of a second template in the template field of the template roll to determine a second template offset;

moving the flipped substrate with second resist on the second side to be below the second template in the template field of the template roll based on a second imprinting alignment offset, the second imprinting alignment offset being determined based on the second template offset, the second wafer registration offset, and the overlay bias;

pressing the second template of the template roll into the second resist on the flipped substrate; and curing the second resist to form a second imprint on the second side, the second imprint having a second imprinted feature corresponding to the second template and a second imprint fiducial mark corresponding to the second template fiducial mark of the second template.

Embodiment 13 is the imprinting method of embodiment 12, further comprising:

measuring the flipped imprint fiducial mark of the flipped imprint on the first side and the second imprint fiducial mark of the second imprint on the second side to determine a double-sided overlay error between a target fiducial offset and an actual fiducial offset associated with the flipped imprint fiducial mark and the second imprint fiducial mark; and determining a double-sided overlay bias between the flipped imprint on the first side and the second imprint on the second side based on the double-sided overlay error.

Embodiment 14 is the imprinting method of embodiment 13, further comprising:

updating the overlay bias to be the double-sided overlay bias; and iteratively imprinting a second substrate using the second template of the template roll based on the updated overlay bias.

Embodiment 15 is the imprinting method of embodiment 13 or 14, wherein the double-sided overlay bias is identical to a sum of a result of multiplying the double-sided overlay error by a constant and a previous double-sided overlay bias.

Embodiment 16 is the imprinting method of any of embodiments 13 to 15, wherein the second imprinting alignment offset is at least partially determined based on a second imprint nominal correction, and wherein the second imprinting alignment offset is a sum of the second template offset, the second wafer registration offset, the overlay bias, and the second imprint nominal correction.

Embodiment 17 is the imprinting method of embodiment 13 to 16, further comprising:

moving the flipped substrate on the stage to be below a resist dispenser according to a second dispensing alignment offset that is determined at least partially based on the overlay bias and the second wafer registration offset.

Embodiment 18 is the imprinting method of embodiment 17, wherein the second dispensing alignment offset is at least partially determined based on a second dispense offset that provides a correction for imprint to resist centering from a second nominal dispense location.

Embodiment 19 is the imprinting method of embodiment 18, wherein the second dispensing alignment offset is at least partially determined based on a second dispense nominal correction, and wherein the second dispensing alignment offset is a sum of the overlay bias, the second wafer registration offset, the second dispense offset, and the second dispense nominal correction.

Embodiment 20 is the imprinting method of embodiment 18 or 19, further comprising:

measuring an image of the flipped substrate with the flipped imprint and the second imprint to determine a second imprint to resist image offset.

Embodiment 21 is the imprinting method of embodiment 20, further comprising:

updating the second dispense offset based on the second imprint to resist image offset;

updating the second dispensing alignment offset based on the updated second dispense offset; and iteratively imprinting a second substrate using the second template of the template roll based on the updated second dispensing alignment offset.

Embodiment 22 is the imprinting method of embodiment 21, wherein the updated second dispense offset is identical to a sum of a result of multiplying the second imprint to resist image offset by a constant and the second dispense offset.

Embodiment 23 is the imprinting method of any of embodiments 1 to 22, wherein the substrate is transparent.

Embodiment 24 is imprinting method comprising:

drawing a template roll along rollers, the template roll comprising a template field having a template and a template fiducial mark of the template;

moving the substrate on a stage to be below a resist dispenser according to a dispensing alignment offset that is at least partially determined based on a loading offset;

dispensing resist on a first side of the substrate using the resist dispenser;

moving the substrate with the resist on the stage to be below the template of the template roll based on an imprinting alignment offset, the imprinting alignment offset being at least partially determined based on the loading offset;

pressing the template of the template roll into the resist on the substrate;

curing the resist to form an imprint on the substrate, the imprint having an imprinted feature corresponding to the template and an imprint fiducial mark corresponding to the template fiducial mark of the template;

measuring the imprint fiducial mark of the imprint to determine a wafer registration offset between a target fiducial location and an actual fiducial location associated with the imprint fiducial mark; and determining an overlay bias of the imprint on the first side of the substrate based on the wafer registration offset and the loading offset.

Embodiment 25 is the method of embodiment 24, further comprising:

measuring the template fiducial mark of the template to determine a template offset, wherein the imprinting alignment offset is at least partially determined based on the template offset.

Embodiment 26 is the method of embodiment 24 or 25, wherein the imprinting alignment offset is at least partially determined based on an imprint nominal correction, and wherein the imprinting alignment offset is a sum of the template offset, the loading offset, and the imprint nominal correction.

Embodiment 27 is the method of any of embodiments 24 to 26, wherein the overlay bias is determined to be the wafer registration offset minus the loading offset.

Embodiment 28 is the method of any of embodiments 24 to 27, wherein the dispensing alignment offset is at least partially determined based on a dispense offset that provides a correction for imprint to resist centering from a nominal dispense location.

Embodiment 29 is the method of embodiments 28, wherein the dispensing alignment offset is at least partially determined based on a dispense nominal correction, and wherein the dispensing alignment offset is a sum of the loading bias, the dispense offset, and the dispense nominal correction.

Embodiment 30 is the method of embodiment 28 or 29, further comprising:

measuring an image of the substrate with the imprint to determine at least one of an imprint to substrate image offset or an imprint to resist image offset.

Embodiment 31 is the method of embodiment 30, further comprising:

updating the dispensing alignment offset based on the at least one of the imprint to substrate image offset or the imprint to resist image offset; and iteratively imprinting a second substrate with the template of the template roll using the updated dispensing alignment offset.

Embodiment 32 is the method of embodiment 31, further comprising at least one of:

updating the loading offset based on the imprint to substrate image offset, wherein the dispensing alignment offset is updated based on the updated loading offset, or updating the dispense offset based on the imprint to resist image offset, wherein the dispensing alignment offset is updated based on the updated dispense offset.

Embodiment 33 is the method of embodiment 32, wherein the updated loading offset is identical to a sum of a result of multiplying the imprint to substrate image offset by a first constant and the loading offset, and wherein the updated dispense offset is identical to a sum of a result of multiplying the imprint to resist image offset by a second constant and the dispense offset.

Embodiment 34 is the method of any of embodiments 24 to 33, further comprising:

before imprinting the template field on the resist on the substrate, performing at least one simulated imprinting sequence with the template field on the template roll being moved without contact with the resist on the substrate.

Embodiment 35 is the method of any of embodiments 24 to 34, further comprising:

flipping the substrate with the imprint and loading the flipped substrate on the stage with the first side facing towards the stage and a second side facing away from the stage, the second side being opposite to the first side;

measuring a flipped imprint fiducial mark of the flipped imprint to determine a second wafer registration offset between a second target fiducial location and a second actual fiducial location associated with the flipped imprint fiducial mark;

moving the flipped substrate with second resist on the second side to be below a second template in the template field of the template roll based on a second imprinting alignment offset, the second imprinting alignment offset being determined based on the second wafer registration offset and the overlay bias;

pressing the second template of the template roll into the second resist on the flipped substrate;

curing the second resist to form a second imprint on the second side, the second imprint having a second imprinted feature corresponding to the second template and a second imprint fiducial mark corresponding to a second template fiducial mark of the second template;

measuring the flipped imprint fiducial mark of the flipped imprint on the first side and the second imprint fiducial mark of the second imprint on the second side to determine a double-sided overlay error between a target fiducial offset and an actual fiducial offset associated with the flipped imprint fiducial mark and the second imprint fiducial mark; and determining a double-sided overlay bias between the flipped imprint on the first side and the second imprint on the second side based on the double-sided overlay error.

Embodiment 36 is the method of embodiment 35, further comprising:

measuring the second template fiducial mark of the second template in the template field of the template roll to determine a second template offset, wherein the second imprinting alignment offset is determined at least partially based on the second template offset.

Embodiment 37 is the method of embodiment 36, wherein the second imprinting alignment offset is at least partially determined based on a second imprint nominal correction, and wherein the second imprinting alignment offset is a sum of the second template offset, the second wafer registration offset, the overlay bias, and the second imprint nominal correction.

Embodiment 38 is the method of any of embodiments 35 to 37, further comprising:

moving the flipped substrate on the stage to be below the resist dispenser according to a second dispensing alignment offset that is determined at least partially based on the overlay bias and the second wafer registration offset.

Embodiment 39 is the method of embodiment 38, wherein the second dispensing alignment offset is at least partially determined based on a second dispense offset that provides a correction for imprint to resist centering from a second nominal dispense location.

Embodiment 40 is the method of embodiment 39, wherein the second dispensing alignment offset is at least partially determined based on a second dispense nominal correction, and wherein the second dispensing alignment offset is a sum of the overlay bias, the second wafer registration offset, the second dispense offset, and the second dispense nominal correction.

Embodiment 41 is the method of embodiment 39 or 40, further comprising:

measuring an image of the flipped substrate with the flipped imprint and the second imprint to determine a second imprint to resist image offset.

Embodiment 42 is the method of embodiment 41, further comprising:

updating the second dispense offset based on the second imprint to resist image offset;

updating the second dispensing alignment offset based on the updated second dispense offset; and iteratively imprinting a second substrate using the second template of the template roll based on the updated second dispensing alignment offset.

Embodiment 43 is the method of embodiment 42, wherein the updated second dispense offset is identical to a sum of a result of multiplying the second imprint to resist image offset by a constant, and the second dispense offset.

Embodiment 44 is the method of any one of embodiments 35 to 43, further comprising:

updating the overlay bias using the double-sided overlay error.

Embodiment 45 is the method of embodiment 44, further comprising:

iteratively imprinting a second substrate using the second template of the template roll based on the updated overlay bias.

Embodiment 46 is the method of embodiment 45, wherein the double-sided overlay bias is identical to a sum of a result of multiplying the double-sided overlay error by a constant and a previous double-sided overlay bias.

Embodiment 47 is the method of any one of embodiments 35 to 46, wherein the substrate is transparent.

Embodiment 48 is a double-sided imprinting method comprising:

drawing a template roll along rollers, the template roll comprising a template field having a first template with at least one first template fiducial mark and a second template with at least one second template fiducial mark;

loading a substrate on a stage, the substrate having a first side and a second side opposite to the first side;

registering the first template fiducial mark of the first template in a coordinate system based on the stage to determine a first template offset in the coordinate system;

moving the substrate with first resist on the first side to be below the first template of the template roll based on a first imprinting alignment offset, the first imprinting alignment offset being determined based on the first template offset and a loading offset;

pressing the first template of the template roll into the first resist on the first side of the substrate;

curing the first resist to form a first imprint on the first side of the substrate, the first imprint having a first imprinted feature corresponding to the first template and a first imprint fiducial mark corresponding to the first template fiducial mark of the first template;

registering the first imprint on the substrate in the coordinate system to determine a first wafer registration offset between a target fiducial location and an actual fiducial location associated with the first imprint fiducial mark;

determining an overlay bias of the first imprint on the first side of the substrate based on the first wafer registration offset and the loading offset;

flipping the substrate with the first imprint and loading the flipped substrate on the stage with the first side facing towards the stage and the second side facing away from the stage;

registering the flipped substrate with the flipped first imprint in the coordinate system to determine a second wafer registration offset between a second target fiducial location and a second actual fiducial location associated with a flipped first imprint fiducial mark;

registering the second template fiducial mark of the second template in the template field of the template roll in the coordinate system to determine a second template offset;

moving the flipped substrate with second resist on the second side to be below the second template in the template field of the template roll based on a second imprinting alignment offset, the second imprinting alignment offset being determined based on the second template offset, the second wafer registration offset, and the overlay bias;

pressing the second template of the template roll into the second resist on the second side;

curing the second resist to form a second imprint on the second side, the second imprint having a second imprinted feature corresponding to the second template and a second imprint fiducial mark corresponding to the second template fiducial mark of the second template;

registering the flipped substrate with the flipped first imprint on the first side and the second imprint on the second side to determine a double-sided overlay error between a target fiducial offset and an actual fiducial offset associated with the flipped first imprint fiducial mark and the second imprint fiducial mark; and determining a double-sided overlay bias between the flipped first imprint on the first side and the second imprint on the second side based on the double-sided overlay error.

Embodiment 49 is the method of embodiment 48, further comprising:

updating the overlay bias to be the double-sided overlay bias; and iteratively imprinting a second substrate using the second template of the template roll based on the updated overlay bias.

Embodiment 50 is the method of embodiment 48 or 49, wherein the overlay bias is determined to be the first wafer registration offset minus the loading offset, and wherein the double-sided overlay bias is updated by adding the result of multiplying the double-sided wafer registration offset by a constant.

Embodiment 52 is the method of any one of embodiments 48 to 50, wherein the first imprinting alignment offset is at least partially determined based on a first imprint nominal correction, and wherein the first imprinting alignment offset is a sum of the first template offset, the loading offset, and the first imprint nominal correction, and wherein the second imprinting alignment offset is at least partially determined based on a second imprint nominal correction, and wherein the second imprinting alignment offset is a sum of the second template offset, the second wafer registration offset, the overlay bias, and the second imprint nominal correction.

Embodiment 52 is the method of any one of embodiments 48 to 51, further comprising:

moving the substrate on the stage to be below a resist dispenser according to a first dispensing alignment offset that is at least partially determined based on the loading offset; and dispensing the first resist on the first side of the substrate using the resist dispenser.

Embodiment 53 is the method of embodiment 52, wherein the first dispensing alignment offset is at least partially determined based on a first dispense offset that provides a correction for imprint to resist centering from a first nominal dispense location.

Embodiment 54 is the method of embodiment 53, wherein the first dispensing alignment offset is at least partially determined based on a first dispense nominal correction, and wherein the first dispensing alignment offset is a sum of the loading offset, the first dispense offset, and the first dispense nominal correction.

Embodiment 55 is the method of embodiment 52 to 54, further comprising:

measuring an image of the substrate with the imprint to determine at least one of an imprint to substrate image offset or an imprint to resist image offset.

Embodiment 56 is the method of embodiment 55, further comprising:

updating the first dispensing alignment offset based on the at least one of the imprint to substrate image offset or the imprint to resist image offset; and iteratively imprinting a second substrate with the first template of the template roll using the updated first dispensing alignment offset.

Embodiment 57 is the method of embodiment 56, further comprising:

updating the loading offset based on the imprint to substrate image offset, wherein the first dispensing alignment offset is updated based on the updated loading offset, and wherein the updated loading offset is identical to a sum of a result of multiplying the imprint to substrate image offset by a first constant and the loading offset; and updating the first dispense offset based on the imprint to resist image offset, wherein the first dispensing alignment offset is updated based on the updated first dispense offset, and wherein the updated first dispense offset is identical to a sum of a result of multiplying the imprint to resist image offset by a second constant and the dispense offset.

Embodiment 58 is the method of any one of embodiments 48 to 57, further comprising:

moving the flipped substrate on the stage to be below a resist dispenser according to a second dispensing alignment offset that is determined at least partially based on the overlay bias and the second wafer registration offset; and dispensing the second resist on the second side of the substrate using the resist dispenser.

Embodiment 59 is the method of embodiment 58, wherein the second dispensing alignment offset is at least partially determined based on a second dispense offset that provides a correction for imprint to resist centering from a second nominal dispense location.

Embodiment 60 is the method of embodiment 59, wherein the second dispensing alignment offset is at least partially determined based on a second dispense nominal correction, and wherein the second dispensing alignment offset is a sum of the overlay bias, the second wafer registration offset, the second dispense offset, and the second dispense nominal correction.

Embodiment 61 is the method of any one of embodiments 58 to 60, further comprising:

measuring an image of the flipped substrate with the flipped first imprint and the second imprint to determine a second imprint to resist image offset.

Embodiment 62 is the method of embodiment 61, further comprising:

updating the second dispense offset based on the second imprint to resist image offset, wherein the updated second dispense offset is identical to a sum of a result of multiplying the second imprint to resist image offset by a constant and the second dispense offset;

updating the second dispensing alignment offset based on the updated second dispense offset; and iteratively imprinting a second substrate using the second template of the template roll based on the updated second dispensing alignment offset.

Embodiment 63 is the method of any one of embodiments 48 to 62, wherein the substrate is held on the stage via a chuck with the first imprint fiducial mark of the first imprint on the substrate within a measurement area of the chuck that has a better image contrast than other areas of the chuck, and wherein the flipped substrate is held on the stage via the chuck with the flipped first imprint fiducial mark and the second imprint fiducial mark within the measurement area.

Embodiment 64 is the method of any one of embodiments 48 to 63, wherein the stage holds a first substrate via a first chuck and a second substrate via a second chuck, wherein the double-sided imprinting method comprises:

aligning the first substrate with the first template and the second substrate with the second template based on the first imprinting alignment offset; and forming the first imprint on the first side of the first substrate and the second imprint on a first side of the second substrate.

Embodiment 65 is the method of embodiment 64, further comprising:

flipping the first substrate and loading the flipped first substrate on the second chuck;

flipping the second substrate and loading the flipped second substrate on the first chuck;

aligning the flipped second substrate with the first template and the flipped first substrate with the second template based on the second imprinting alignment offset; and forming the first imprint on a second side of the second substrate and the second imprint on the second side of the first substrate.

Embodiment 66 is an imprinting system comprising:

rollers for moving a template roll, wherein the template roll comprises a template field having a template with a template fiducial mark;

a movable stage for holding a substrate;

a loading system for loading the substrate on the stage;

a moving system for moving the stage together with the substrate;

a resist dispenser for dispensing resist on a side of the substrate;

a light source for curing the resist, wherein the light source is configured to cure the resist to form an imprint on the side of the substrate when the template of the template roll is pressed into the resist on the side of the substrate, the imprint having an imprinted feature corresponding to the template and an imprint fiducial mark corresponding to the template fiducial mark of the template;

a first inspection system for registering the template fiducial mark of the template in a coordinate system to determine a template offset;

a second inspection system for measuring an image of the substrate with the imprint to update a loading offset; and a controller configured to:

control the moving system to move the substrate with the resist to be below the template of the template roll based on an imprinting alignment offset, the imprinting alignment offset being at least partially determined based on the template offset and the loading offset.

Embodiment 67 is the imprinting system of embodiment 66, further comprising:

a third inspection system for registering the imprint on the substrate in the coordinate system to determine a wafer registration offset between a target fiducial location and an actual fiducial location associated with the imprint fiducial mark, wherein the controller is configured to determine an overlay bias of the imprint on the side of the substrate to be the wafer registration offset minus the loading offset.

Embodiment 68 is the imprinting system of embodiment 67, further comprising:

a flipping system for flipping the substrate with the imprint, wherein the loading system is configured to load the flipped substrate on the stage with a first side facing towards the stage and a second side facing away from the stage, the second side being opposite to the first side, the imprint being on the first side.

Embodiment 69 is the imprinting system of embodiment 68, wherein the first inspection system is configured to register a second template fiducial mark of a second template in the template field of the template roll in the coordinate system to determine a second template offset, wherein the third inspection system is configured to register the flipped substrate with the flipped imprint in the coordinate system to determine a second wafer registration offset between a second target fiducial location and a second actual fiducial location associated with a flipped imprint fiducial mark of the flipped imprint, and wherein the controller is configured to control the moving system to move the flipped substrate with second resist on the second side to be below the second template in the template field of the template roll based on a second imprinting alignment offset, the second imprinting alignment offset being determined based on the second template offset, the second wafer registration offset, and the overlay bias.

Embodiment 70 is the imprinting system of embodiment 69, wherein the light source is configured to cure the second resist, when the second template of the template roll is pressed into the second resist on the second side of the substrate, to form a second imprint on the second side, the second imprint having a second imprinted feature corresponding to the second template and a second imprint fiducial mark corresponding to the second template fiducial mark of the second template, wherein the third inspection system is configured to register the substrate with the flipped imprint on the first side and the second imprint on the second side in the coordinate system to determine a double-sided wafer registration offset between a target fiducial offset and an actual fiducial offset associated with the flipped imprint fiducial mark and the second imprint fiducial mark, and wherein the controller is configured to determine a double-sided overlay bias between the flipped imprint on the first side and the second imprint on the second side based on the double-sided wafer registration offset.

Embodiment 71 is an imprinting system comprising:

rollers for moving a template roll, wherein the template roll comprises a template field having a template with a template fiducial mark;

a movable stage for holding a substrate;

a loading system for loading the substrate on the stage;

a moving system for moving the stage together with the substrate;

a resist dispenser for dispensing resist on a side of the substrate;

a light source for curing the resist, wherein the light source is configured to cure the resist to form an imprint on the side of the substrate when the template of the template roll is pressed into the resist on the side of the substrate, the imprint having an imprinted feature corresponding to the template and an imprint fiducial mark corresponding to the template fiducial mark of the template;

a first inspection system for measuring an image of the substrate with the imprint to update a loading offset; and a second inspection system for registering the imprint on the substrate in the coordinate system to determine an wafer registration offset between a target fiducial location and an actual fiducial location associated with the imprint fiducial mark, wherein an overlay bias of the imprint on the side of the substrate is associated with the wafer registration offset; and a controller configured to:

control the moving system to move the substrate with the resist to be below the template of the template roll based on an imprinting alignment offset, the imprinting alignment offset being at least partially determined based on the loading offset, and determine an overlay bias of the imprint on the side of the substrate to be based on the wafer registration offset and the loading offset.

Embodiment 72 is the imprinting system of embodiment 71, further comprising:

a third inspection system for registering the template fiducial mark of the template in the coordinate system to determine a template offset, wherein the controller is configured to determine the imprinting alignment offset based on the template offset and the loading offset.

Embodiment 73 is the imprinting system of embodiment 72, further comprising:

a flipping system for flipping the substrate with the imprint, wherein the loading system is configured to load the flipped substrate on the stage with a first side facing towards the stage and a second side facing away from the stage, the second side being opposite to the first side, the imprint being on the first side.

Embodiment 74 is the imprinting system of embodiment 73, wherein the third inspection system is configured to register a second template fiducial mark of a second template in the template field of the template roll in the coordinate system to determine a second template offset, wherein the second inspection system is configured to register the flipped substrate with the flipped imprint in the coordinate system to determine a second wafer registration offset between a second target fiducial location and a second actual fiducial location associated with a flipped imprint fiducial mark of the flipped imprint, and wherein the controller is configured to control the moving system to move the flipped substrate with second resist on the second side to be below the second template in the template field of the template roll based on a second imprinting alignment offset, the second imprinting alignment offset being determined based on the second template offset, the second wafer registration offset, and the overlay bias.

Embodiment 75 is the imprinting system of embodiment 74, wherein the light source is configured to cure the second resist, when the second template of the template roll is pressed into the second resist on the second side of the substrate, to form a second imprint on the second side, the second imprint having a second imprinted feature corresponding to the second template and a second imprint fiducial mark corresponding to the second template fiducial mark of the second template, wherein the second inspection system is configured to register the substrate with the flipped imprint on the first side and the second imprint on the second side in the coordinate system to determine a double-sided overlay error between a target fiducial offset and an actual fiducial offset associated with the flipped imprint fiducial mark and the second imprint fiducial mark, and wherein the controller is configured to determine a double-sided overlay bias between the flipped imprint on the first side and the second imprint on the second side based on the double-sided overlay error.

A number of implementations have been described. Nevertheless, it will be understood that various modifications may be made without departing from the spirit and scope of the techniques and devices described herein. Features shown in each of the implementations may be used independently or in combination with one another. Additional features and variations may be included in the implementations as well. Accordingly, other implementations are within the scope of the following claims.

What is claimed is:

1. An imprinting system comprising:

rollers for moving a template roll, wherein the template roll comprises a template field having a template with a template fiducial mark;

a movable stage for holding a substrate;

a moving system for moving the stage together with the substrate;

a resist dispenser for dispensing resist on a side of the substrate;

a light source for curing the resist, wherein the light source is configured to cure the resist to form an imprint on the side of the substrate when the template of the template roll is pressed into the resist on the side of the substrate, the imprint having an imprinted feature corresponding to the template and an imprint fiducial mark corresponding to the template fiducial mark of the template;

a first inspection system for registering the template fiducial mark of the template in a coordinate system to determine a template offset;

a second inspection system for registering the imprint on the substrate in the coordinate system to determine a wafer registration offset between a target fiducial location and an actual fiducial location associated with the imprint fiducial mark; and a controller configured to:

control the moving system to move the substrate with the resist to be below the template of the template roll based on an imprinting alignment offset, the imprinting alignment offset being at least partially determined based on the template offset, and determine an overlay bias of the imprint on the side of the substrate to be at least partially based on the wafer registration offset.

2. The imprinting system of claim 1, further comprising at least one of:

a loading system for loading the substrate on the stage, or a third inspection system for measuring an image of the substrate with the imprint to update a loading offset by machine learning.

3. The imprinting system of claim 2, wherein the imprinting alignment offset for the substrate is at least partially determined according to the loading offset updated based on one or more substrates processed prior to the substrate.

4. The imprinting system of claim 3, wherein the imprinting alignment offset is at least partially determined based on an imprint nominal correction, and wherein the imprinting alignment offset is a sum of the template offset, the loading offset, and the imprint nominal correction.

5. The imprinting system of claim 3, wherein the controller is configured to determine the overlay bias to be the wafer registration offset minus the loading offset.

6. The imprinting system of claim 3, wherein the controller is configured to control the moving system to move the substrate on the stage to be below the resist dispenser according to a dispensing alignment offset that is at least partially determined based on the loading offset.

7. The imprinting system of claim 6, wherein the controller is configured to determine the dispensing alignment offset to be at least partially determined based on a dispense offset that provides a dispense nominal correction for imprint to resist centering from a nominal dispense location.

8. The imprinting system of claim 7, wherein the controller is configured to determine the dispensing alignment offset to be a sum of the loading offset, the dispense offset, and the dispense nominal correction.

9. The imprinting system of claim 7, wherein the third inspection system is configured to measure an image of the substrate with the imprint to determine at least one of an imprint to substrate image offset or an imprint to resist image offset.

10. The imprinting system of claim 9, wherein the controller is configured to update the dispensing alignment offset based on the at least one of the imprint to substrate image offset or the imprint to resist image offset, the updated dispensing alignment offset being for iteratively imprinting a second substrate with the template of the template roll.

11. The imprinting system of claim 10, wherein the controller is configured to:

update the loading offset to be identical to a sum of a result of multiplying the imprint to substrate image offset by a first constant and the loading offset, updated the dispense offset to be identical to a sum of a result of multiplying the imprint to resist image offset by a second constant and the dispense offset, and update the dispensing alignment offset based on the updated loading offset and the updated dispense offset.

12. The imprinting system of claim 1, wherein the substrate is held on the stage via a chuck, wherein the chuck comprises a measurement area that has a better image contrast than other areas of the chuck, and wherein the substrate is loaded on the chuck with a substrate fiducial mark of the substrate within the measurement area.

13. The imprinting system of claim 1, wherein the first inspection system is positioned on the stage, wherein the template field comprises a plurality of fiducial marks for one or more templates, and wherein the first inspection system comprises a plurality of cameras, each of the plurality of cameras being configured to capture an image including a different corresponding fiducial mark of the plurality of fiducial marks for the one or more templates.

14. The imprinting system of claim 1, wherein the second inspection system is registered in the coordinate system with predetermined locations, wherein the stage is configured to hold one or more substrates with one or more imprints each having one or more fiducial marks, and wherein the second inspection system comprises a plurality of cameras, each of the plurality of cameras being configured to capture an image including a different corresponding fiducial mark of the one or more fiducial marks of the one or more imprints on the one or more substrates.

15. The imprinting system of claim 1, further comprising:

an unloading system for unloading the substrate from the stage;

a flipping system for flipping the substrate with the imprint to obtain a flipped substate with a flipped imprint; and a loading system for loading the flipped substrate with the flipped imprint on the stage with a first side facing towards the stage and a second side facing away from the stage, the second side being opposite to the first side, the flipped imprint being on the first side.

16. The imprinting system of claim 15, wherein the first inspection system is configured to register a second template fiducial mark of a second template in the template field of the template roll in the coordinate system to determine a second template offset, wherein the second inspection system is configured to register the flipped substrate with the flipped imprint in the coordinate system to determine a second wafer registration offset between a second target fiducial location and a second actual fiducial location associated with a flipped imprint fiducial mark of the flipped imprint, and wherein the controller is configured to control the moving system to move the flipped substrate with second resist on the second side to be below the second template in the template field of the template roll based on a second imprinting alignment offset, the second imprinting alignment offset being determined based on the second template offset, the second wafer registration offset, and the overlay bias.

17. The imprinting system of claim 16, wherein the light source is configured to cure the second resist, when the second template of the template roll is pressed into the second resist on the second side of the substrate, to form a second imprint on the second side, the second imprint having a second imprinted feature corresponding to the second template and a second imprint fiducial mark corresponding to the second template fiducial mark of the second template, wherein the second inspection system is configured to register the substrate with the flipped imprint on the first side and the second imprint on the second side in the coordinate system to determine a double-sided wafer registration offset between a target fiducial offset and an actual fiducial offset associated with the flipped imprint fiducial mark and the second imprint fiducial mark, and wherein the controller is configured to determine a double-sided overlay bias between the flipped imprint on the first side and the second imprint on the second side based on the double-sided wafer registration offset, and update the overlay bias to be the double-sided overlay bias for iteratively imprinting a second substrate using the second template of the template roll.

18. The imprinting system of claim 17, wherein the controller is configured to control the moving system to move the flipped substrate on the stage to be below the resist dispenser according to a second dispensing alignment offset that is determined at least partially based on the overlay bias and the second wafer registration offset, and wherein the controller is configured to determine the second dispensing alignment offset to be a sum of the overlay bias, the second wafer registration offset, a second dispense offset, and a second dispense nominal correction, wherein the second dispense offset provides a correction for imprint to resist centering from a second nominal dispense location.

19. The imprinting system of claim 18, further comprising a third inspection system configured to measure an image of the flipped substrate with the flipped imprint and the second imprint to determine a second imprint to resist image offset, wherein the controller is configured to:

update the second dispense offset based on the second imprint to resist image offset; and update the second dispensing alignment offset based on the updated second dispense offset for iteratively imprinting a second substrate using the second template of the template roll.

20. The imprinting system of claim 17, wherein the stage holds a first substrate via a first chuck and a second substrate via a second chuck, the substrate being the first substrate, and wherein the template field of the template roll comprises a first template and the second template, the template being the first template, the imprint being a first imprint, and wherein the imprinting system is configured to:

align the first substrate with the first template and the second substrate with the second template based on the imprinting alignment offset;

form the first imprint on the first side of the first substrate and the second imprint on a first side of the second substrate;

flip the first substrate and load the flipped first substrate on the second chuck;

flip the second substrate and load the flipped second substrate on the first chuck;

align the flipped second substrate with the first template and the flipped first substrate with the second template based on the second imprinting alignment offset; and form the first imprint on a second side of the second substrate and the second imprint on the second side of the first substrate.

* * * * *